(12) United States Patent
Lin et al.

(10) Patent No.: US 11,955,506 B2
(45) Date of Patent: Apr. 9, 2024

(54) FABRICATION METHOD OF DISPLAY DEVICE

(71) Applicant: Au Optronics Corporation, Hsinchu (TW)

(72) Inventors: Shih-Hsiung Lin, Hsinchu (TW); Yang-En Wu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 312 days.

(21) Appl. No.: 17/348,681

(22) Filed: Jun. 15, 2021

(65) Prior Publication Data

US 2022/0029051 A1    Jan. 27, 2022

Related U.S. Application Data

(60) Provisional application No. 63/056,817, filed on Jul. 27, 2020.

(30) Foreign Application Priority Data

Jan. 11, 2021   (CN) .......................... 202110032605.9

(51) Int. Cl.
*H01L 33/00*    (2010.01)
*H01L 27/15*    (2006.01)
(Continued)

(52) U.S. Cl.
CPC .......... *H01L 27/156* (2013.01); *H01L 33/005* (2013.01); *H01L 33/0093* (2020.05); *H01L 33/382* (2013.01); *H01L 33/62* (2013.01); H01L 2933/0016 (2013.01); H01L 2933/0066 (2013.01)

(58) Field of Classification Search
None
See application file for complete search history.

(56) References Cited

U.S. PATENT DOCUMENTS 9,716,085 B2    7/2017  Li et al.
10,636,937 B2   4/2020  Liao
(Continued)

FOREIGN PATENT DOCUMENTS

| CN | 108475712 | 8/2018 |
|----|-----------|--------|
| CN | 109314126 | 2/2019 |

(Continued)

OTHER PUBLICATIONS

"Office Action of India Counterpart Application", dated Mar. 30, 2022, p. 1-p. 6.

*Primary Examiner* — Robert K Carpenter
(74) *Attorney, Agent, or Firm* — JCIPRNET

(57) ABSTRACT

A fabrication method of a display device includes the following steps: providing a light-emitting diode (LED) display device including an circuit substrate, first LEDs, and a second LED; detecting the LED display device, wherein the second LED cannot emit light normally; removing the second LED from the circuit substrate; providing a LED substrate; transferring a third LED of the LED substrate to a first transferring substrate; transferring the third LED on the first transferring substrate to a second transferring substrate; and electrically connecting the third LED on the second transposed substrate to the circuit substrate.

16 Claims, 53 Drawing Sheets

(51) Int. Cl.
    *H01L 33/38*     (2010.01)
    *H01L 33/62*     (2010.01)

(56)     References Cited

U.S. PATENT DOCUMENTS

| | | |
|---|---|---|
| 10,825,704 B1 | 11/2020 | Liao |
| 11,114,423 B2 | 9/2021 | Iguchi |
| 2017/0346011 A1* | 11/2017 | Danesh .................. H10K 71/00 |
| 2018/0358339 A1 | 12/2018 | Iguchi |
| 2019/0097081 A1 | 3/2019 | Liao |
| 2019/0165037 A1 | 5/2019 | Chae et al. |
| 2020/0235076 A1* | 7/2020 | Batres ................ H01L 21/6835 |
| 2020/0335374 A1 | 10/2020 | Liao |
| 2021/0358897 A1 | 11/2021 | Iguchi |

FOREIGN PATENT DOCUMENTS

| | | |
|---|---|---|
| CN | 109661122 | 4/2019 |
| JP | 2011066053 | 3/2011 |
| TW | I648871 | 1/2019 |
| TW | I686895 | 3/2020 |

* cited by examiner

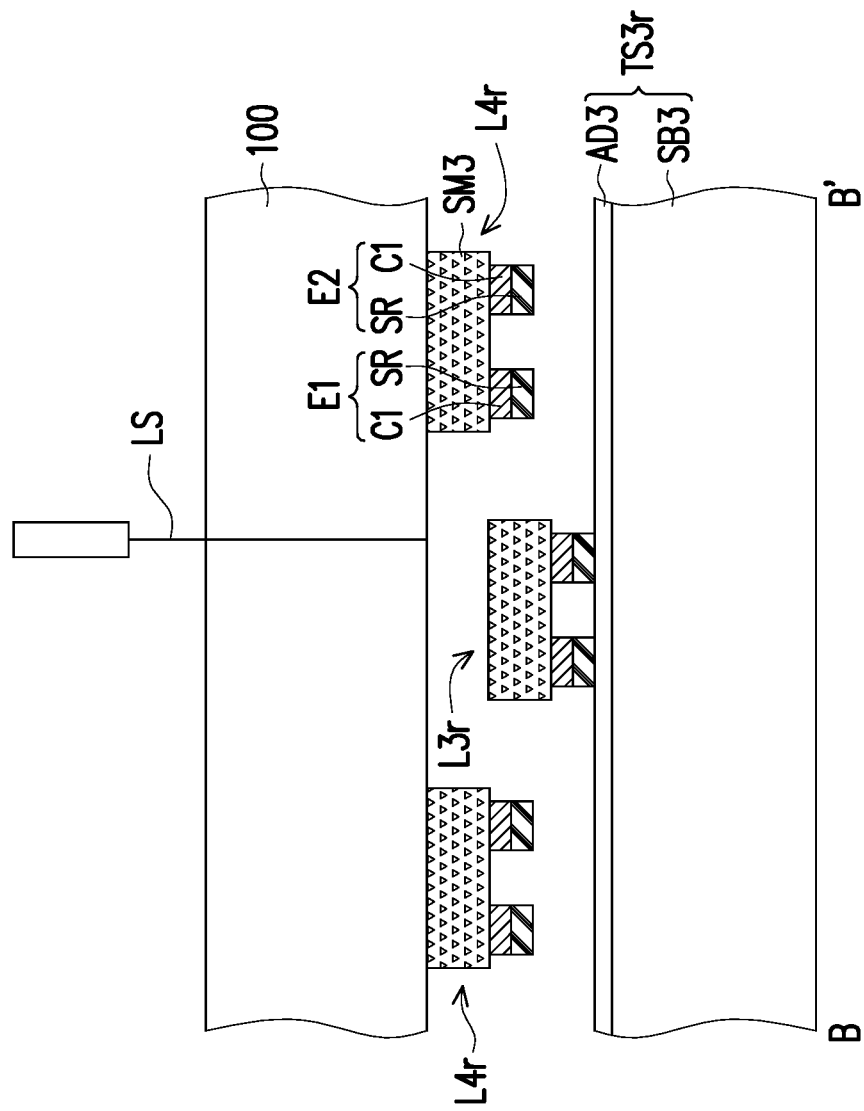

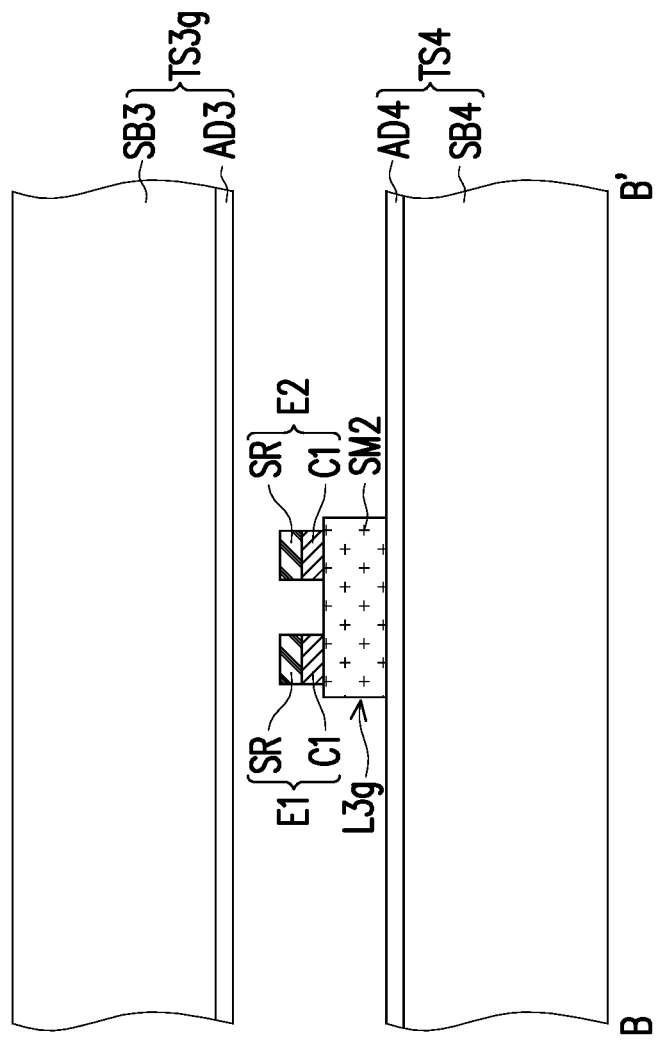

FABRICATION METHOD OF DISPLAY DEVICE

CROSS-REFERENCE TO RELATED APPLICATION

This application claims the priority benefit of U.S. provisional application Ser. No. 63/056,817 filed on Jul. 27, 2020 and China application serial no. 202110032605.9 filed on Jan. 11, 2021. The entirety of the above-mentioned patent applications is hereby incorporated by reference herein and made a part of this specification.

BACKGROUND

Field of the Disclosure

The disclosure is related to a fabrication method of a display device, and particularly relates to a fabrication method of a display device including LEDs.

Description of Related Art

Light Emitting Diode (LED) is a light-emitting element that has the characteristics of low power consumption, high brightness, high resolution and high color saturation. Therefore, it is suitable for constructing pixel structures of a LED display panel.

The technology of transferring the LEDs to a circuit substrate is called mass transfer. In the prior art, when transferring LEDs, problems such as LEDs are transferred incorrectly, unsuccessfully, or defective LEDs are prone to occur, resulting in some of the pixels in the LED display device to fail to work normally, which seriously affects the display quality of the LED display device. In general, LEDs that have been transferred incorrectly, unsuccessfully, or defective LEDs are removed, and other LEDs used for repair are transferred to the circuit substrate to replace the removed LEDs. However, in the repair process of the prior art, only one of the LED used for repair can be transferred at a time, and the positional deviation of the LED used for repair is prone to occur during the transferring process, resulting in repair failure.

SUMMARY

The present invention provides a fabrication method of a display device, which can quickly and accurately repair LEDs that cannot emit light normally.

At least one embodiment of the present invention provides a fabrication method of a display device, including the following steps. An LED display device is provided. The LED display device includes a circuit substrate, a plurality of first LEDs, and a second LED. The first LEDs are respectively disposed corresponding to a plurality of first placement regions of the circuit substrate. The first LEDs are electrically connected to the circuit substrate. The second LED is disposed corresponding to the second placement region of the circuit substrate. The LED display device is detected, wherein the second LED can't emit light normally. The second LED is removed from the circuit substrate. An LED substrate is provided, the LED substrate includes a third LED. A first transferring substrate is provided. Based on a position of the second placement region, the third LED of the LED substrate is transferred to the first transferring substrate. The third LED on the first transferring substrate is transferred to the second transferring substrate. The second transferring substrate is overlapped with the circuit substrate. The third LED is located on a side of the second transferring substrate facing the circuit substrate. A position of the third LED overlaps the second placement region. The third LED on the second transferring substrate is electrically connected to the circuit substrate.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
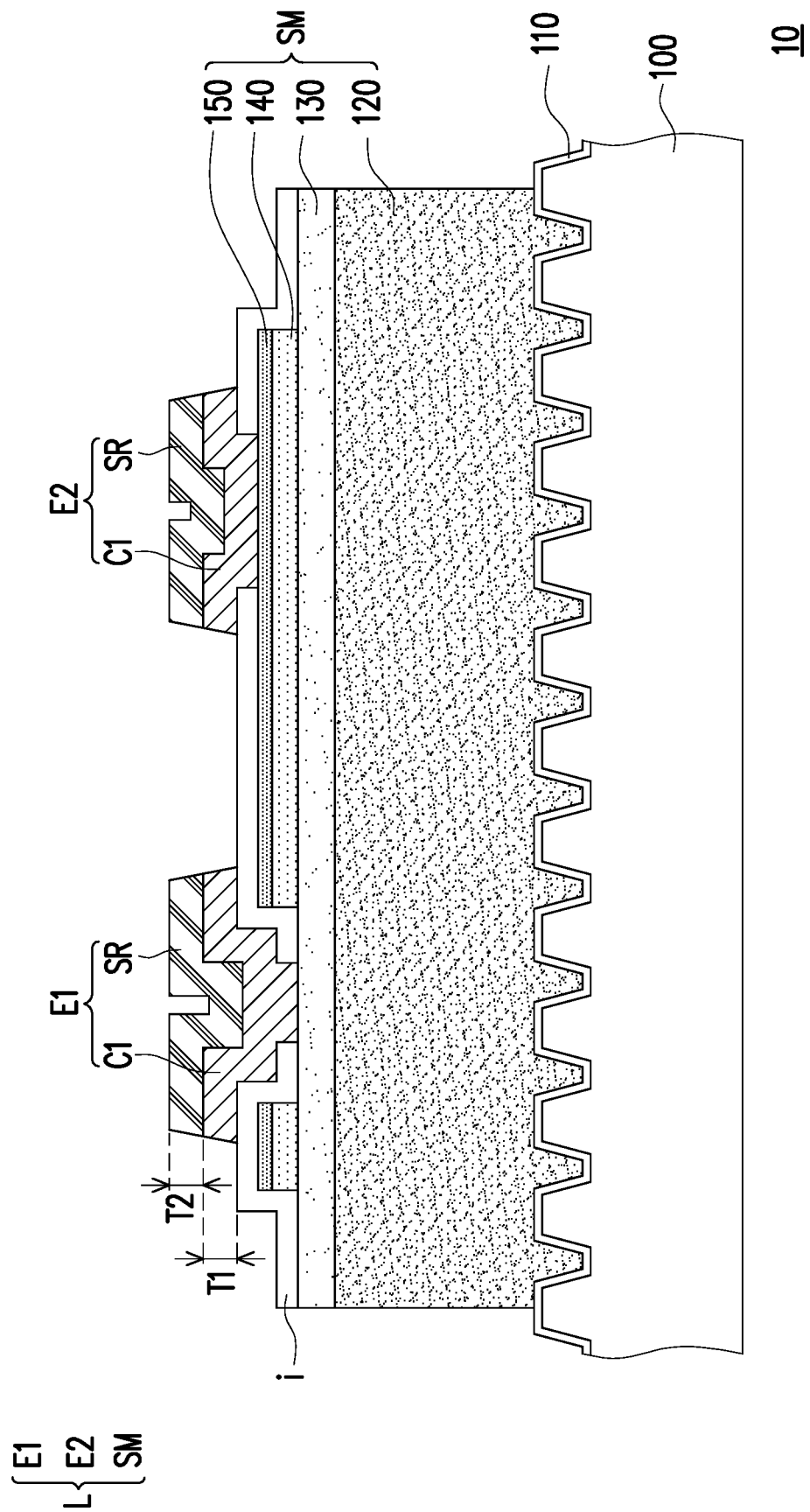
FIG. 1 is a schematic cross-sectional view of an LED substrate according to an embodiment of the present invention.

FIG. 1 is a schematic cross-sectional view of an LED substrate according to an embodiment of the present invention.

Referring to FIG. 1, the LED substrate 10 includes a growth substrate 100 and an LED L. The LED L includes a semiconductor stacked layer SM and two electrodes E1 and E2.

In some embodiments, the growth substrate 100 is a gallium arsenide (GaAs) substrate, gallium phosphide (GaP) substrate, indium phosphide (InP) substrate, sapphire substrate, silicon carbide (SiC) substrate, gallium nitride (GaN) substrate or other growth substrate suitable for epitaxy process. In some embodiments, the surface of the growth substrate 100 is patterned through an etching process (for example, wet etching process), so that the growth substrate 100 has an uneven surface. In some embodiments, a buffer layer 110 is formed on the surface of the growth substrate 100, and the buffer layer 110 can improve the yield of the subsequent epitaxial process. In some embodiments, the material of the buffer layer 110 is aluminum nitride or other suitable materials.

The semiconductor stacked layer SM is formed on the growth substrate 100. In some embodiments, the semiconductor stacked layer SM is formed on the buffer layer 110 through an epitaxial process and a patterning process. The semiconductor stacked layer SM includes a first semiconductor layer 130, a light emitting layer 140, and a second semiconductor layer 150. One of the first semiconductor layer 130 and the second semiconductor layer 150 is an N-type doped semiconductor, and the other is a P-type doped semiconductor. For example, the first semiconductor layer 130 is an N-type semiconductor layer, and the second semiconductor layer 150 is a P-type semiconductor layer.

The materials of the first semiconductor layer 130 and the second semiconductor layer 150 include, for example, gallium nitride, indium gallium nitride (InGaN), gallium arsenide, aluminum gallium indium phosphide (AlGaInP) or other materials composed of IIIA elements and VA elements, or other suitable materials, but the invention is not limited thereto.

The light-emitting layer 140 is located between the first semiconductor layer 130 and the second semiconductor layer 150. The light-emitting layer 140 has, for example, a quantum well (QW), such as a single quantum well (SQW), a multi-quantum well (MQW) or other quantum wells. The holes provided by the P-type doped semiconductor layer and the electrons provided by the N-type doped semiconductor layer are combined in the light-emitting layer 140, and release energy in the form of light.

In this embodiment, the semiconductor stacked layer SM further includes a low-doped (or undoped) semiconductor layer 120. The semiconductor layer 120 is located between the first semiconductor layer 130 and the growth substrate 100. The material of the semiconductor layer 120 includes, for example, gallium nitride, indium gallium nitride (InGaN), gallium arsenide, aluminum gallium indium phosphide (AlGaInP), or other materials composed of IIIA elements and VA elements, or other suitable materials, but the invention is not limited thereto.

In this embodiment, the LED L is a blue LED or a green LED, the materials of the semiconductor layer 120, the first semiconductor layer 130, the light emitting layer 140, and the second semiconductor layer 150 include gallium nitride, and the growth substrate 100 is a sapphire substrate, but the invention is not limited thereto. In other embodiments, the LED L is an LED of other color, and the materials of the semiconductor layer 120, the first semiconductor layer 130, the light emitting layer 140, and the second semiconductor layer 150 include other materials.

An insulating layer i is formed on the semiconductor stacked layer SM. The insulating layer i has at least two openings exposing a part of the top surface of the first semiconductor layer 130 and a part of the top surface of the second semiconductor layer 150, respectively.

Two electrodes E1 and E2 are formed on the semiconductor stacked layer SM. In some embodiments, the electrodes E1 and E2 are electrically connected to the first semiconductor layer 130 and the second semiconductor layer 150 through the openings of the insulating layer i, respectively.

The electrodes E1 and E2 are single-layer structure or multi-layer structure. In this embodiment, each of the electrodes E1 and E2 includes a conductive layer C1 and a metal layer SR.

The conductive layers C1 are formed on the semiconductor stacked layer SM, and contacts the first semiconductor layer 130 and the second semiconductor layer 150, respectively. In some embodiments, the material selected for the conductive layers C1 include metal, alloy, or other conductive materials. In some embodiments, the conductive layers C1 have a single-layer structure or multi-layer structure.

The metal layers SR are formed on the conductive layers C1. The melting point of the metal layers SR is lower than 260 degrees Celsius. In some embodiments, the thickness T2 of the metal layers SR is 0.1 μm to 5 μm. In some embodiments, the material selected for the metal layers SR include tin, indium, bismuth, tin-bismuth alloy, tin-indium alloy, tin-copper alloy, tin-silver alloy, tin-antimony alloy, tin-zinc alloy, tin-silver-copper alloy, tin-silver-copper-bismuth alloy or a combination of the foregoing materials. In some embodiments, a method of forming the metal layers SR includes evaporation, electroplating, or other suitable processes.

In some embodiments, the conductive layers C1 are conformally formed in the openings of the insulating layer i and on the surface of the insulating layer i. The metal layers SR are conformally formed on the conductive layers C1. In some embodiments, the centers of the conductive layers C1 and the metal layers SR corresponding to the openings of the insulating layer i are slightly recessed downward, but the invention is not limited thereto.

In some embodiments, the shapes of the conductive layers C1 and the metal layers SR are defined by the same mask. Therefore, the shape of vertical projection of the conductive layers C1 on the growth substrate 100 and the shape of vertical projection of the metal layers SR on the growth substrate 100 are substantially the same as each other. In other embodiments, the upper layer in the electrodes E1 and E2 selectively covers the side surface of the lower layer. For example, masks of different sizes may be used in the manufacturing process or deviations is occurred during the evaporation process, resulting in the upper layer in contact with the side surface of the lower layer. For example, the metal layer SR selectively covers the side surfaces of the first conductive layer C1, but the invention is not limited thereto.

Although in this embodiment, each of the electrodes E1 and E2 includes a conductive layer C1 and a metal layer SR, the invention is not limited thereto. In other embodiments, each of the electrodes E1 and E2 does not include a low melting point metal (for example, does not include a metal layer SR).

Figure 2:
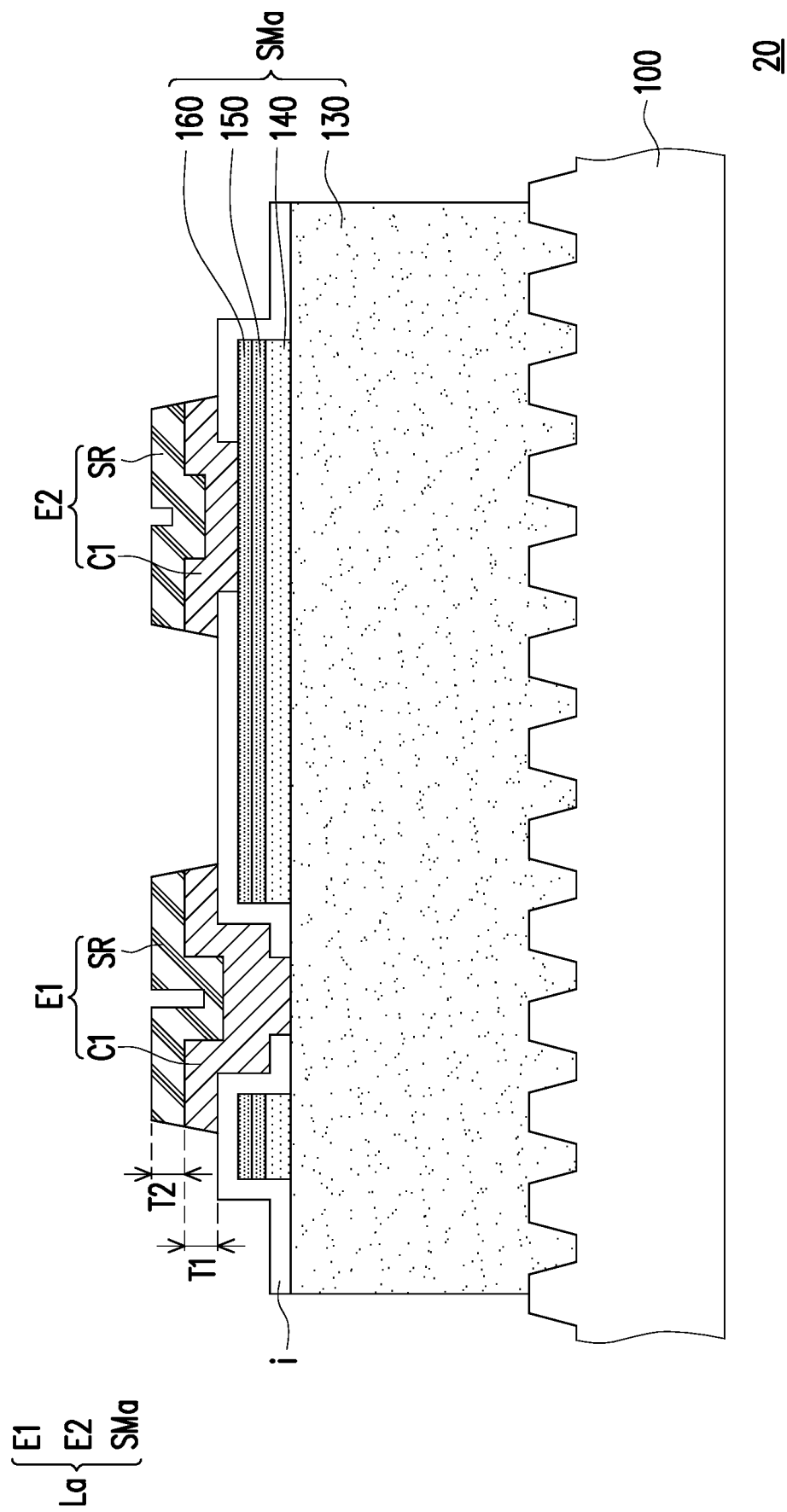
FIG. 2 is a schematic cross-sectional view of an LED substrate according to an embodiment of the present invention.

FIG. 2 is a schematic cross-sectional view of an LED substrate according to an embodiment of the present invention. It should be noted that the embodiment of FIG. 2 uses the element numerals and part of the content of the embodiment of FIG. 1, wherein the same or similar reference numerals are used to represent the same or similar elements, and the description of the same technical content is omitted. For the description of the omitted parts, please refer to the foregoing embodiment, which will not be repeated here.

The main difference between the LED substrate 20 of FIG. 2 and the LED substrate 10 of FIG. 1 is that the semiconductor stacked layer SMa of the LED substrate 20 is different from the semiconductor stacked layer SM of the LED substrate 10.

Referring to FIG. 2, the semiconductor stacked layer SMa is formed on the growth substrate 100. In some embodiments, the semiconductor stacked layer SMa is formed on the buffer layer 110 by an epitaxial process. The semiconductor stacked layer SMa includes a first semiconductor layer 130, a light emitting layer 140, and a second semiconductor layer 150. One of the first semiconductor layer 130 and the second semiconductor layer 150 is an N-type doped semiconductor, and the other is a P-type doped semiconductor. For example, the first semiconductor layer 130 is an N-type semiconductor layer, and the second semiconductor layer 150 is a P-type semiconductor layer. The light-emitting layer 140 is located between the first semiconductor layer 130 and the second semiconductor layer 150.

In this embodiment, the semiconductor stacked layer SMa further includes a third semiconductor layer 160. The third semiconductor layer 160 is formed on the second semiconductor layer 150, and the third semiconductor layer 160 and the second semiconductor layer 150 are the same type of semiconductor layer (for example, both are P-type semiconductor layers).

In this embodiment, the LED La is a red LED, and the material of the semiconductor layer 120, the first semiconductor layer 130, the light-emitting layer 140, and the second semiconductor layer 150 includes aluminum gallium indium phosphide, the material of the third semiconductor layer 160 includes gallium phosphide, and the growth substrate 100 includes a gallium arsenide substrate, but the invention is not limited thereto. In other embodiments, the LED La is an LED of other color, and the materials of the first semiconductor layer 130, the light emitting layer 140, the second semiconductor layer 150, and the third semiconductor layer 160 include other materials.

FIG. 3A to FIG. 3E are schematic cross-sectional views of a fabrication method of an LED display device according to an embodiment of the present invention.

Figure 3A:
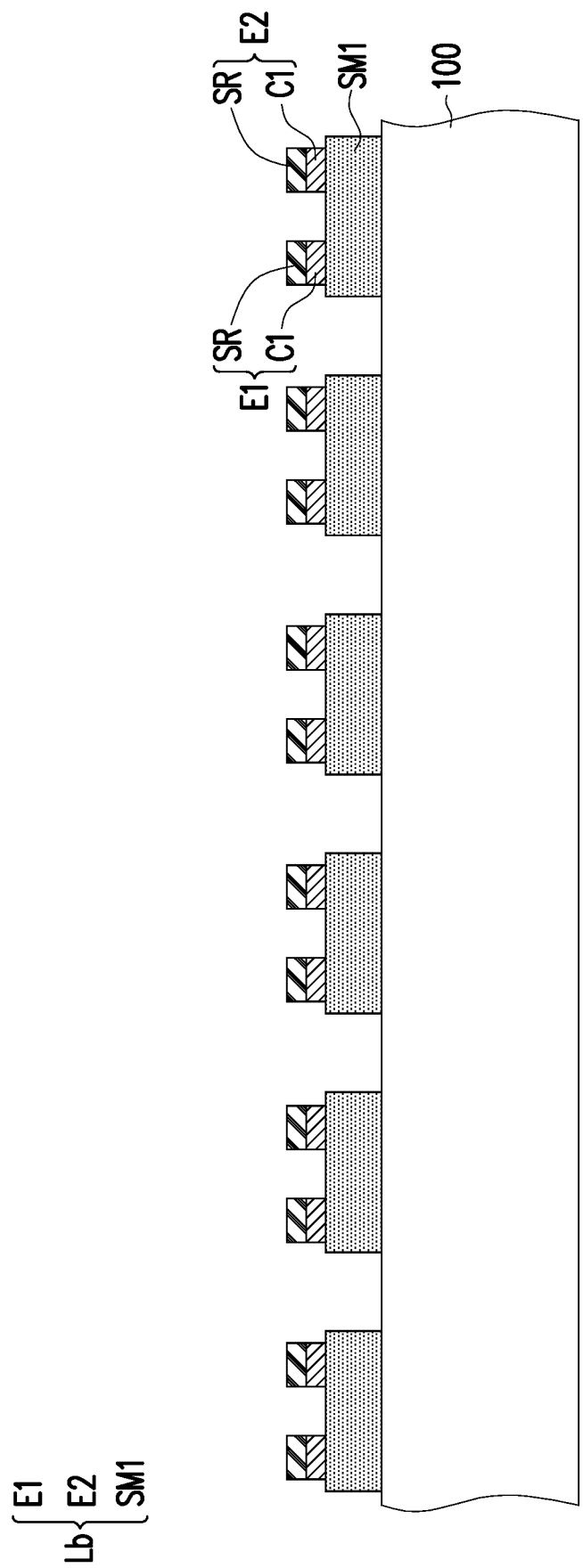
FIG. 3A to FIG. 3E are schematic cross-sectional views of a fabrication method of an LED display device according to an embodiment of the present invention.
Figure 3B:
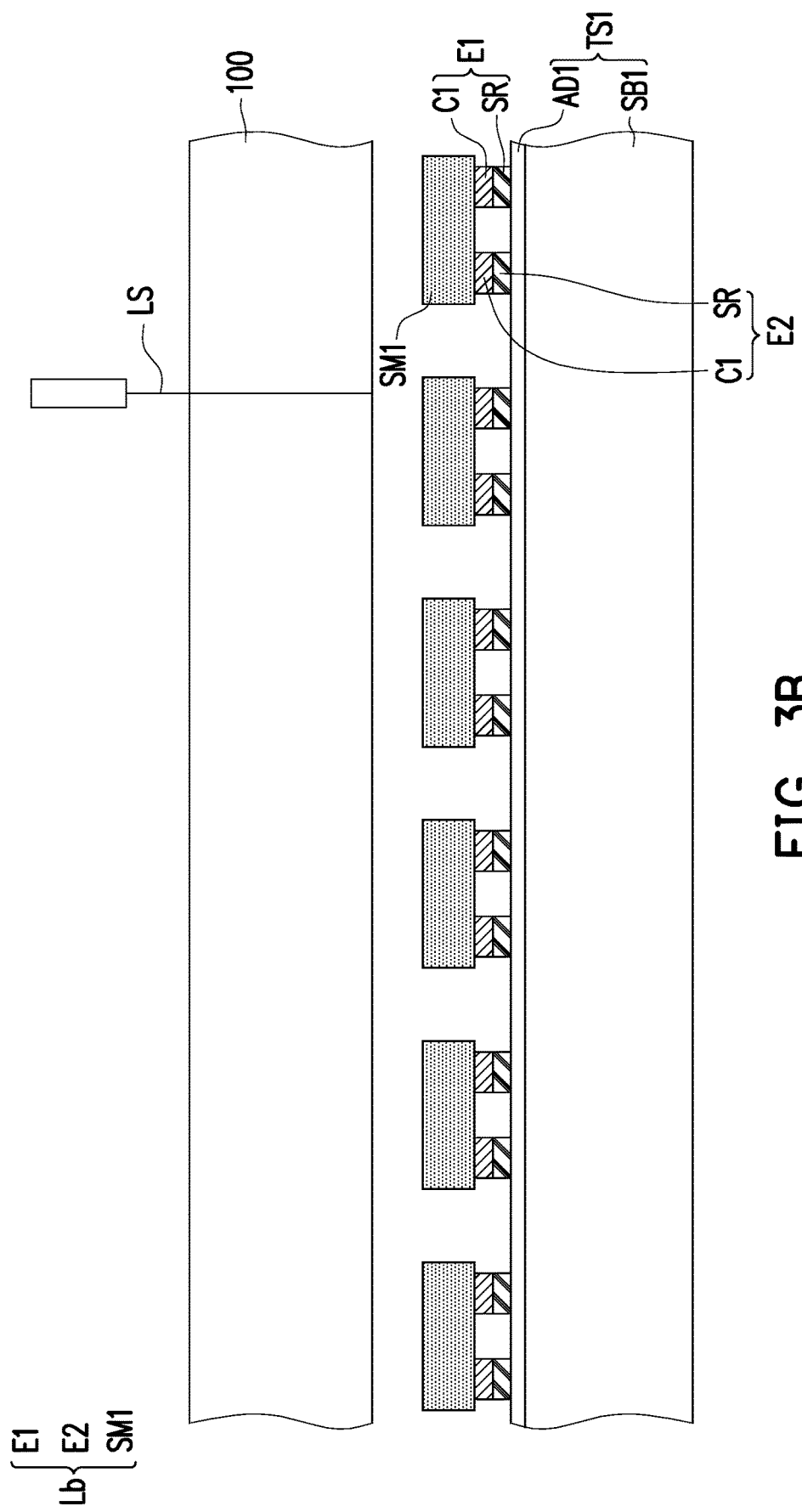

Referring to FIG. 3A and FIG. 3B, a plurality of LEDs Lb are formed on the growth substrate 100. Each of the LED Lb includes a semiconductor stacked layer SM1 and two electrodes E1 and E2. The two electrodes E1 and E2 are formed on the semiconductor stacked layer SM1. The structure of the LED Lb is similar to the LED L of FIG. 1 or the LED La of FIG. 2. The relevant description can refer to FIG. 1 and FIG. 2.

The LEDs Lb are transferred from the growth substrate 100 to the first transferring substrate TS1. In this embodiment, the first transferring substrate TS1 includes a substrate SB1 and an adhesion layer AD1. In some embodiments, the first transferring substrate TS1 is an adhesive tape, and the substrate SB1 includes a flexible material. In some embodiments, the substrate SB1 is a transparent substrate, and the material is, for example, glass, sapphire or other suitable materials.

The growth substrate 100 is moved to the first transferring substrate TS1, and the LEDs Lb on the growth substrate 100 are facing the first transferring substrate TS1, and then a laser lift off method is used to transfer one or more LEDs Lb on the growth substrate 100 to the adhesion layer AD1 of the first transferring substrate TS1.

In this embodiment, the laser LS is used to select the LED Lb to be transferred. In this embodiment, all of the LEDs Lb are transferred to the first transferring substrate TS1, but the invention is not limited thereto. In other embodiments, part of the LEDs Lb are transferred to the first transferring substrate TS1, and another part of the LEDs Lb remain on the growth substrate 100. In this embodiment, the electrodes E1 and E2 of the LED Lb are located on the side of the LED Lb facing the first transferring substrate TS1.

Figure 3C:
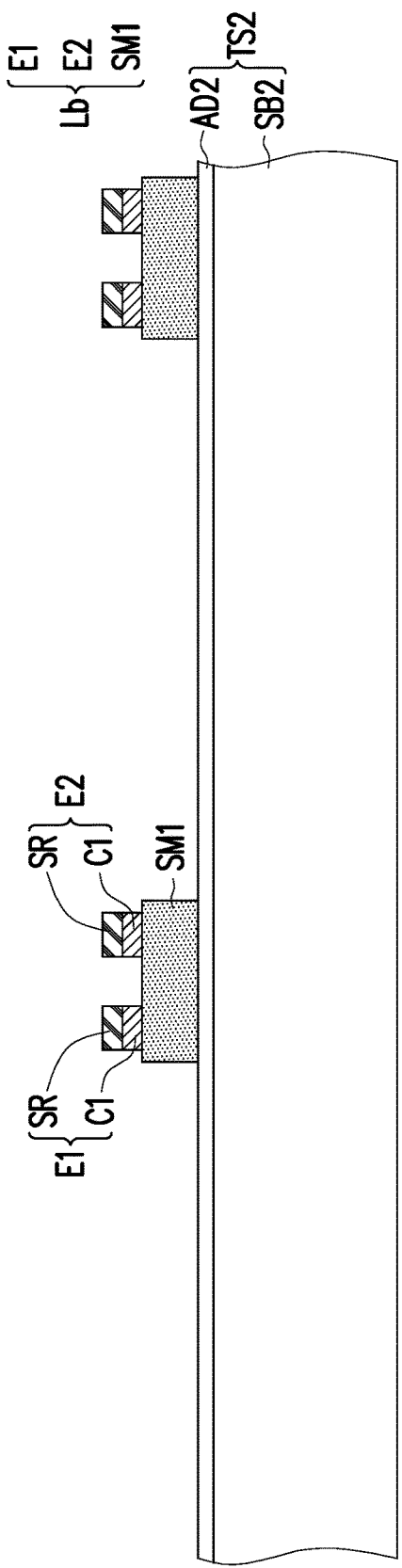

Referring to FIG. 3B and FIG. 3C, the LEDs Lb are transferred from the first transferring substrate TS1 to the second transferring substrate TS2. The second transferring substrate TS2 includes a substrate SB2 and an adhesion layer AD2. In some embodiments, the substrate SB2 includes a thermal conductive material, such as ceramic, metal, or other suitable materials. In some embodiments, the substrate SB2 includes a transparent material, such as glass, sapphire or other suitable materials.

In this embodiment, the substrate SB1 of the first transferring substrate TS1 is a transparent substrate. The first transferring substrate TS1 or the second transferring substrate TS2 is moved to align the first transferring substrate TS1 with the second transferring substrate TS2, and then a laser is irradiating to the LEDs Lb from one side of the substrate SB1, and a laser transfer method is used to transfer selected LEDs Lb from the first transferring substrate TS1 to the adhesion layer AD2 of the second transferring substrate TS2.

In other embodiments, the first transferring substrate TS1 is an adhesive tape, and only part of the LEDs Lb are transferred from the growth substrate 100 to the first transferring substrate TS1. The second transferring substrate TS2 is attached on the LEDs Lb on the first transferring substrate TS1 (for example, the second transferring substrate TS2 is moved so as to contacting the second transferring substrate TS2 with the LEDs Lb and/or the first transferring substrate TS1 is moved so as to contacting the second transferring substrate TS2 with the LEDs Lb), then the first transferring substrate TS1 is removed. When the LED Lb on the first transferring substrate TS1 is transferred to the second transferring substrate TS1, the stickiness of the adhesion layer AD2 is greater than the stickiness of the adhesion layer AD1 (or the aforementioned adhesive tape). In some embodiments, UV light or other processes are used to reduce the stickiness of the adhesion layer AD1, so that the stickiness of the adhesion layer AD2 is greater than the stickiness of the adhesion layer AD1. In some embodiments, the stickiness of the original adhesion layer AD1 is less than the stickiness of the adhesion layer AD2 without the need of an additional process. Since the stickiness of the adhesion layer AD2 is greater than the stickiness of the adhesion layer AD1, after removing the first transferring substrate TS1, the LEDs Lb remain on the second transferring substrate TS2.

In this embodiment, the electrodes E1 and E2 of the LED Lb are located on the side of the LED Lb facing away from the second transferring substrate TS2.

Figure 3D:
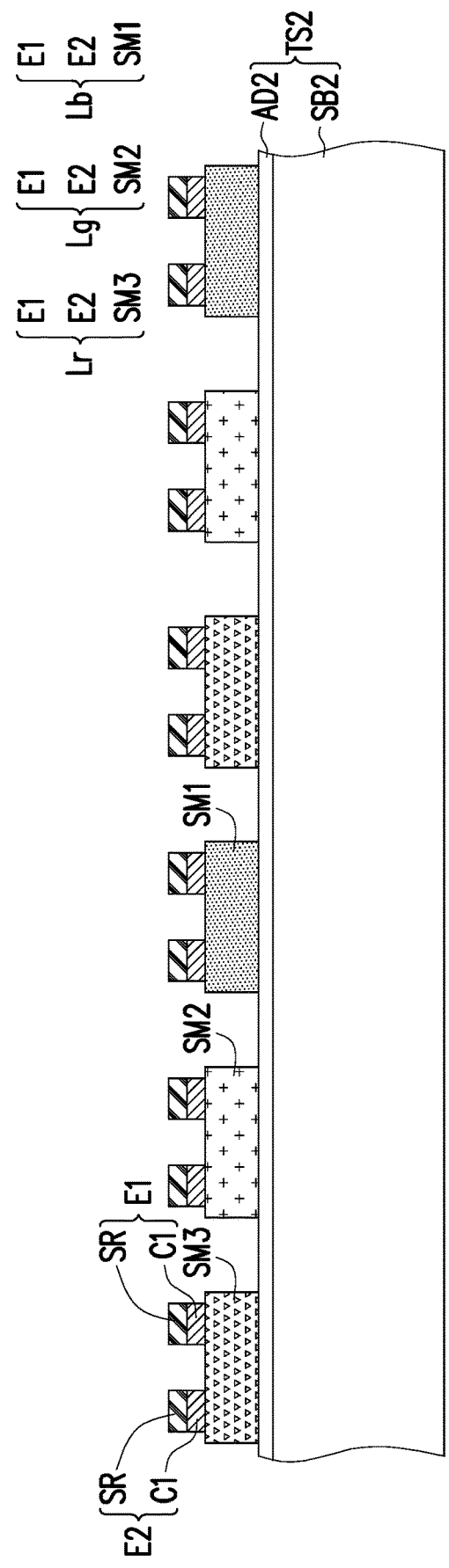

Referring to FIG. 3D, one or more LEDs Lg are transferred to the second transferring substrate TS2 in a manner similar to FIG. 3A to FIG. 3C. The LED Lg includes semiconductor stacked layer SM2 and electrodes E1 and E2. The structure of the LED Lg is similar to the LED L of FIG. 1 or the LED La of FIG. 2. The relevant description can refer to FIG. 1 and FIG. 2.

One or more LEDs Lr are transferred to the second transferring substrate TS2 in a manner similar to FIG. 3A to FIG. 3C. The LED Lr includes semiconductor stacked layer SM3 and electrodes E1 and E2. The structure of the LED Lr is similar to the LED L of FIG. 1 or the LED La of FIG. 2. The relevant description can refer to FIG. 1 and FIG. 2

In this embodiment, The LEDs Lb, the LEDs Lg, and the LEDs Lr are blue LEDs, green LEDs, and red LEDs, respectively. In this embodiment, the LEDs Lb, the LEDs Lg, and LEDs Lr are sequentially transferred to the second transferring substrate TS2. However, the sequence of transferring the LEDs Lb, the LEDs Lg, and the LEDs Lr to the second transferring substrate TS2 is not limited in the invention. The sequence of transferring the LEDs Lb, the LEDs Lg, and the LEDs Lr to the second transferring substrate TS2 can be adjusted according to actual needs.

Figure 3E:
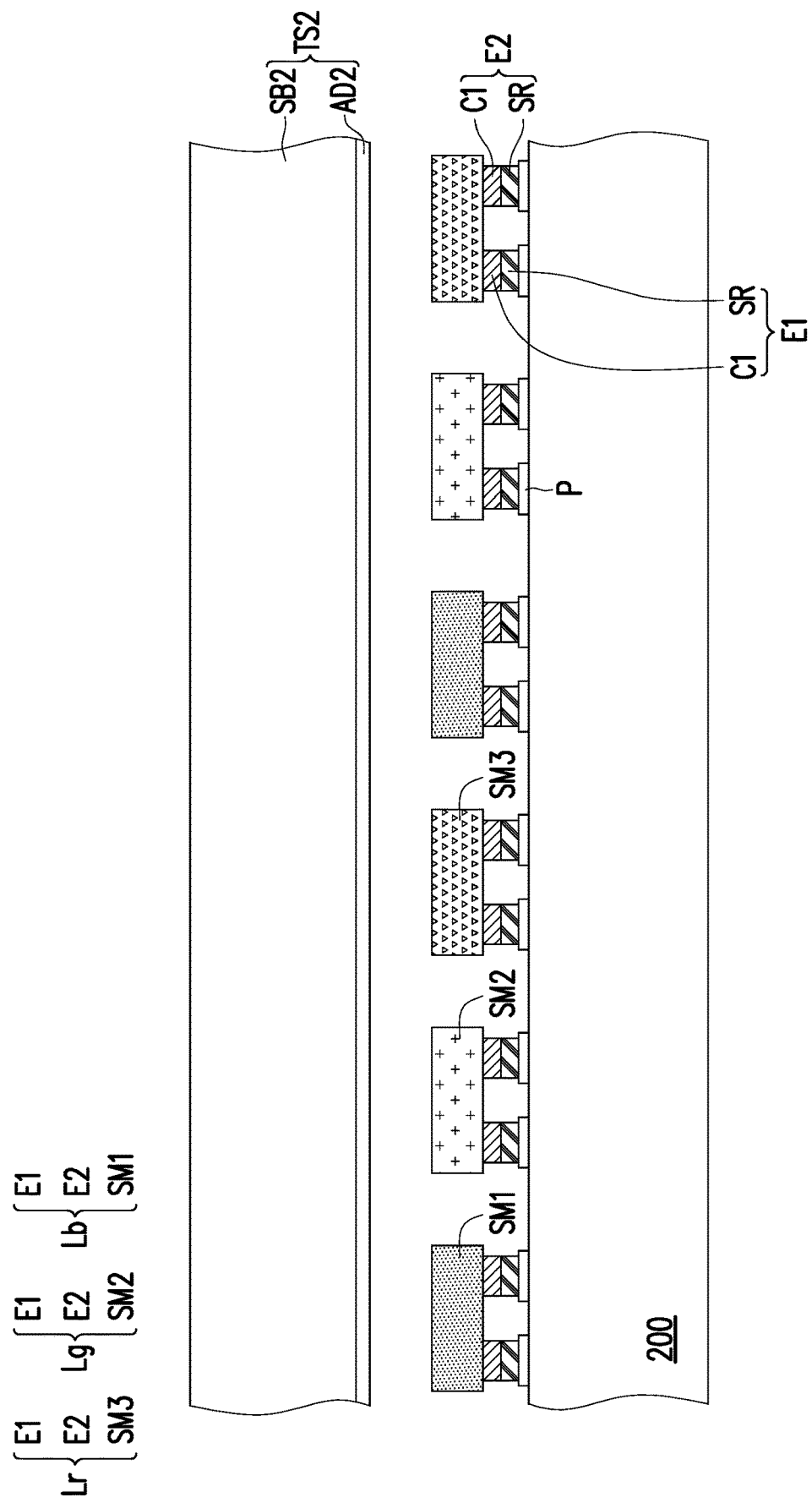

Referring to FIG. 3E, the LEDs Lb, the LEDs Lg, and the LEDs Lr are transferred from the second transferring substrate TS2 to a circuit substrate 200. In this embodiment, the spacings between the LEDs Lb, the LEDs Lg, and the LEDs Lr on the second transferring substrate TS2 are approximately equal to the spacings between the LEDs Lb, the LEDs Lg, and the LEDs Lr on the circuit substrate 200. The circuit substrate 200 is a rigid substrate or a flexible substrate.

In this embodiment, the circuit substrate 200 includes a plurality of pads P. The position of each of the LEDs Lb, the LEDs Lg, and the LEDs Lr on the circuit substrate 200 are corresponding to two of the pads P of the circuit substrate 200. The pads P are electrically connected to active components (not shown) or signal lines (not shown) in the circuit substrate 200. In some embodiments, other additional driver chips (such as micro chips) or driver circuit boards (including driver chips manufactured by flip-chip packaging technology) are bonded to the circuit substrate 200. In some embodiments, the circuit substrate 200 is adopted for a display panel or a backlight module.

In some embodiments, a material selected for the pads P includes gold, nickel, copper, tin, indium, tin-silver alloy, tin-copper alloy, tin-silver copper alloy, or a combination or stack of the foregoing materials.

In some embodiments, the substrate SB2 of the second transferring substrate TS2 includes a thermal conductive material. The second transferring substrate TS2 is pressed on the circuit substrate 200, and then heat is transferred to the LEDs Lb, Lg, and Lr through the second transferring substrate TS2 so as to heat the LEDs Lb, Lg, and Lr. The metal layers SR in the electrodes E1 and E2 of the LEDs Lb, Lg, and Lr are respectively connected to the corresponding pads P of the circuit substrate 200.

In some embodiments, the substrate SB2 includes a transparent material, such as glass, sapphire or other suitable materials. The second transferring substrate TS2 is pressed on the circuit substrate 200, and then a laser is irradiating to the LEDs Lb, Lg, and Lr through the substrate SB2 to heat the LEDs Lb, Lg, and Lr. The metal layers SR in the electrodes E1 and E2 of the LEDs Lb, Lg, and Lr are respectively connected to the corresponding pads P of the circuit substrate 200.

Still referring to FIG. 3E, after electrically connecting the LEDs Lb, Lg, and Lr to the circuit substrate 200, the second transferring substrate TS2 is removed. In this embodiment, the LEDs Lb, Lg, and Lr include LEDs of different colors (for example, blue, green, and red), but the invention is not limited thereto. In other embodiments, only LEDs of a single color are transferred to the circuit substrate 200, and other color conversion elements (such as quantum dot materials or phosphor materials, etc.) are used to convert the color of light emitted by the LEDs of single color into other colors. In other words, in other embodiments, the steps of forming the LEDs of the other two colors and transferring the LEDs of the other two colors may be omitted.

Figure 4A:
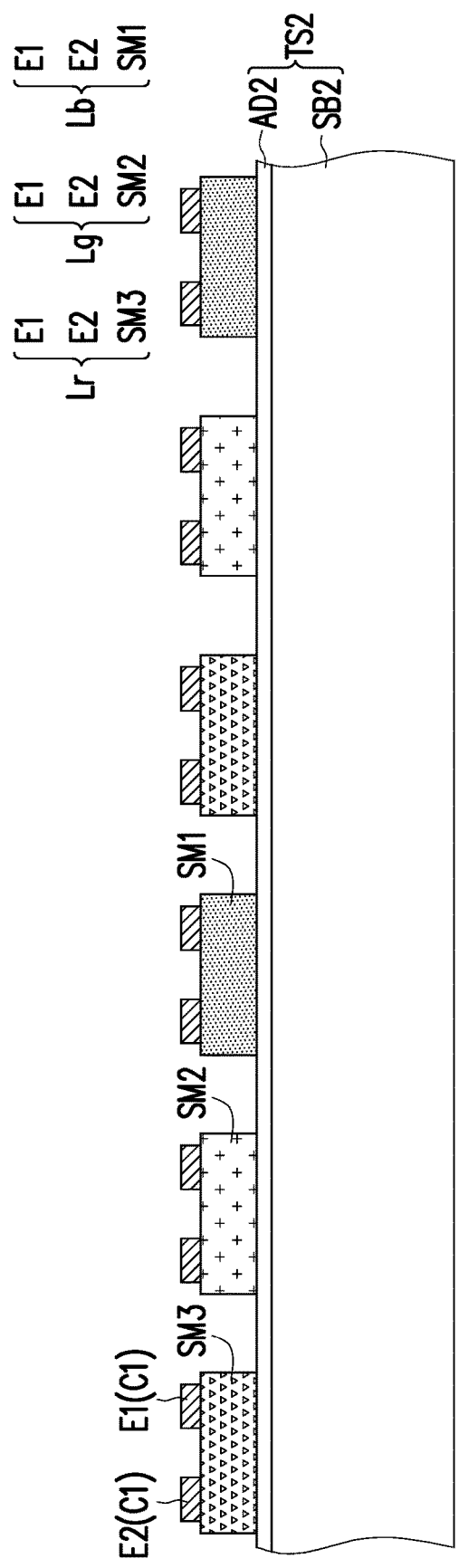
FIG. 4A to FIG. 4C are schematic cross-sectional views of a fabrication method of an LED display device according to an embodiment of the present invention.
Figure 4B:
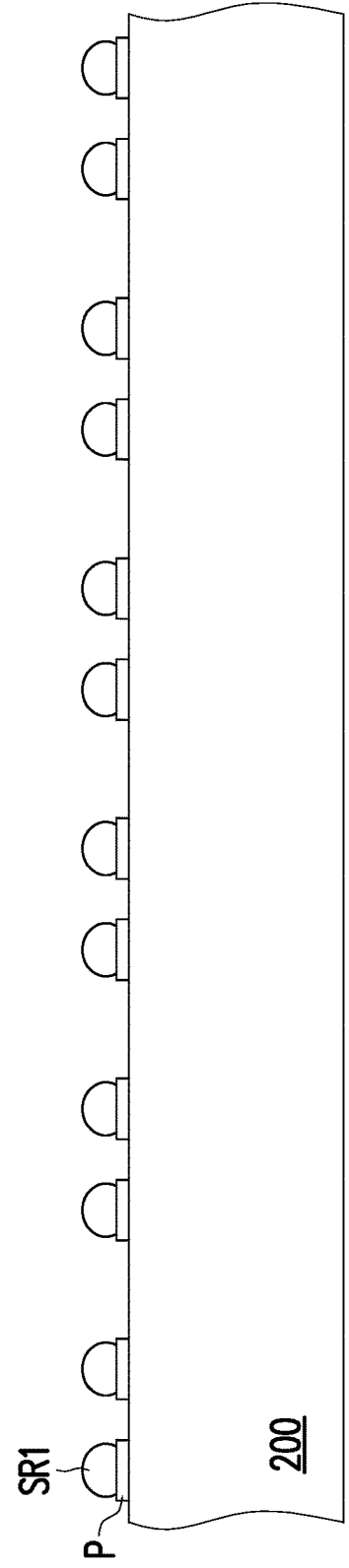
Figure 4C:
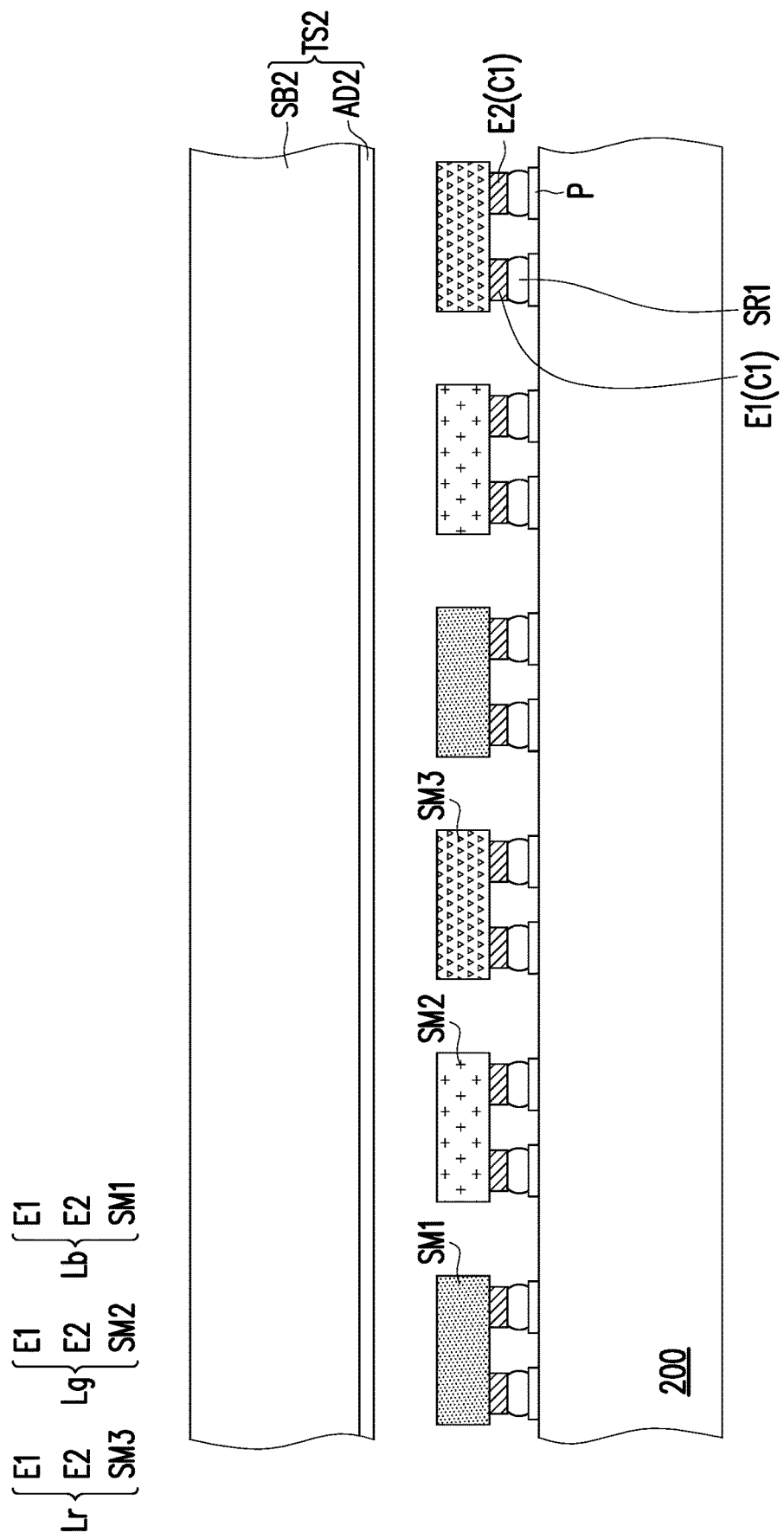

FIG. 4A to FIG. 4C are schematic cross-sectional views of a fabrication method of an LED display device according to an embodiment of the present invention.

Referring to FIG. 4A, the LEDs Lb, Lg, and Lr are transferred to the second transferring substrate TS2 in a manner similar to that of FIG. 3A to FIG. 3D. A difference between this embodiment and the embodiment of FIG. 3A to FIG. 3D is that: in the embodiment of FIG. 4A, the electrodes E1 and E2 of the LEDs Lb, Lg, and Lr do not include low melting point metals (for example, the LEDs Lb, Lg, and Lr do not include metal layer SR).

Referring to FIG. 4B, solders SR1 or conductive paste (not shown) are formed on the pads P of the circuit substrate 200. In some embodiments, the method of forming the solders SR1 includes printing, evaporation, electroplating, or other suitable methods. In some embodiments, the conductive paste is, for example, an anisotropic conductive film (ACF) formed on the entire surface of the circuit substrate 200.

Referring to FIG. 4C, the LEDs Lb, Lg, and Lr are transferred from the second transferring substrate TS2 to the circuit substrate 200. In this embodiment, the spacings between the LEDs Lb, Lg, and Lr on the second transferring substrate TS2 are approximately equal to the spacings between the LEDs Lb, Lg, and Lr on the circuit substrate 200. The circuit substrate 200 is a rigid substrate or a flexible substrate.

In some embodiments, the substrate SB2 of the second transferring substrate TS2 includes a thermal conductive material. The second transferring substrate TS2 is pressed on the circuit substrate 200, and then heat is transferred to the solder SR1 through the second transferring substrate TS2 so as to heat the solders SR1. The electrodes E1 and E2 of the LEDs Lb, Lg, and Lr are respectively electrically connected to the corresponding pads P of the circuit substrate 200 through the solders SR1.

In some embodiments, the substrate SB2 includes a transparent material, such as glass, sapphire or other suitable materials. The second transferring substrate TS2 is pressed on the circuit substrate 200, and then a laser is irradiating to the solders SR1 through the substrate SB2 so as to heat the solders SR1. The electrodes E1 and E2 of the LEDs Lb, Lg, and Lr are respectively electrically connected to the corresponding pads P of the circuit substrate 200 through the solders SR1.

Still referring to FIG. 4C, after electrically connecting the LEDs Lb, Lg, and Lr to the circuit substrate 200, the second transferring substrate TS2 is removed. In this embodiment, the LEDs Lb, Lg, and Lr include LEDs of different colors (for example, blue, green, and red), but the invention is not limited thereto. In other embodiments, only LEDs of single color are transferred to the circuit substrate 200, and other color conversion elements are used to convert the light emitted by the LEDs of single color into lights of other colors. In other words, in other embodiments, the steps of forming other two types of LEDs and transferring other two types of LEDs may be omitted.

In this embodiment, the solders SR1 are formed on the pads P of the circuit substrate 200, but the invention is not limited thereto. In other embodiments, the solders SR1 are formed on the electrodes E1 and E2 of the LEDs Lb, Lg, and Lr.

FIG. 5A to 5D are schematic cross-sectional views of a fabrication method of an LED display device according to an embodiment of the present invention.

Figure 5A:
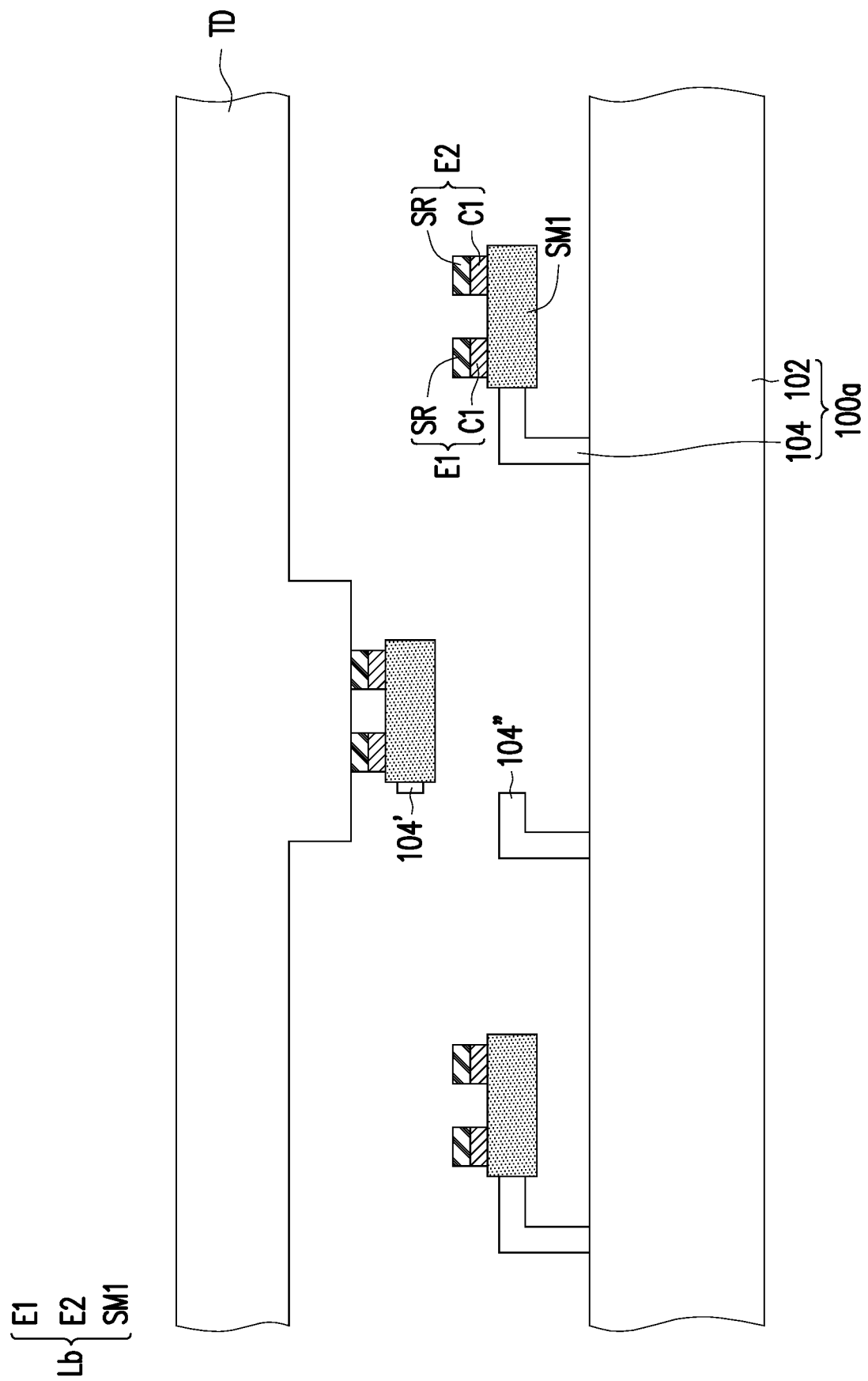
FIG. 5A to FIG. 5D are schematic cross-sectional views of a fabrication method of an LED display device according to an embodiment of the present invention.

Referring to FIG. 5A, a plurality of LEDs Lb are formed on the growth substrate 100a. In this embodiment, the growth substrate 100a includes a substrate 102 and tether structures 104. In some embodiments, a sacrificial layer (not shown) and the tether structures 104 are formed on the substrate 102, and then the LEDs Lb connected to the tether structures 104 are formed, and then the sacrificial layer is removed so that there is a gap between the LEDs Lb and the substrate 102. After removing the sacrificial layer, the LEDs Lb are fixed on the tether structures 104 of the growth substrate 100a.

In this embodiment, each of the LEDs Lb includes a semiconductor stacked layer SM1 and two electrodes E1 and E2. The two electrodes E1 and E2 are formed on the semiconductor stacked layer SM1. The structure of the LED Lb is similar to the LED L of FIG. 1 or the LED La of FIG. 2. The relevant description can refer to FIG. 1 and FIG. 2.

In this embodiment, the electrodes E1 and E2 of the LED Lb are located on the side of the LED Lb facing away from the substrate 102.

A transferring device TD is used to pick up one or more LEDs Lbs. When the LEDs Lb are picked up from the growth substrate 100a, the tether structures 104 will be broken due to force. In some embodiments, a part of the broken tether structure 104' remains on the picked LED Lb, and the other part of the broken tether structure 104" remains on the substrate 102, but the present invention is not limited thereto.

In this embodiment, the stickiness material of the transferring device TD includes, for example, polydimethylsiloxane (PDMS) and etc., and the transferring device TD picks up the LEDs Lb by the Van der Waals force between the transferring device TD and the LEDs Lb. In other embodiments, the transferring device TD picks up the LEDs Lb by other methods such as vacuum attraction or electrostatic attraction.

Figure 5B:
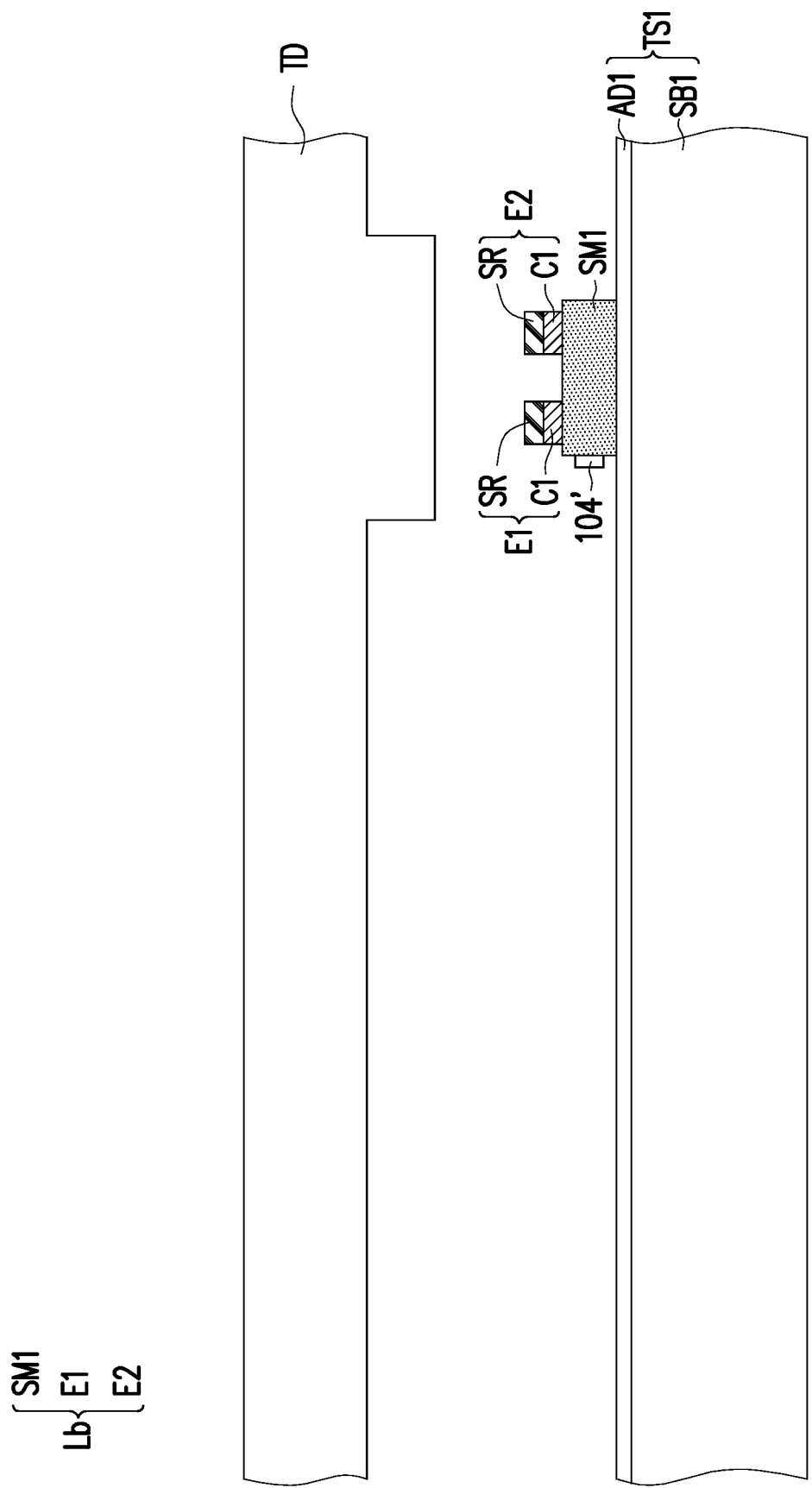

Referring to FIG. 5B, one or more LEDs Lb are transferred to the first transferring substrate TS1 by the transferring device TD. The first transferring substrate TS1 includes a substrate SB1 and an adhesion layer AD1. In some embodiments, the substrate SB1 includes a thermal conductive material, such as ceramic, metal, or other suitable materials. In some embodiments, the substrate SB1 includes a transparent material, such as glass, sapphire or other suitable materials.

The LEDs Lb are fixed on the adhesion layer AD1 of the first transferring substrate TS1, and then the transferring device TD is removed.

In this embodiment, the electrodes E1 and E2 of the LED Lb are located on the side of the LED Lb facing away from the first transferring substrate TS1.

Figure 5C:
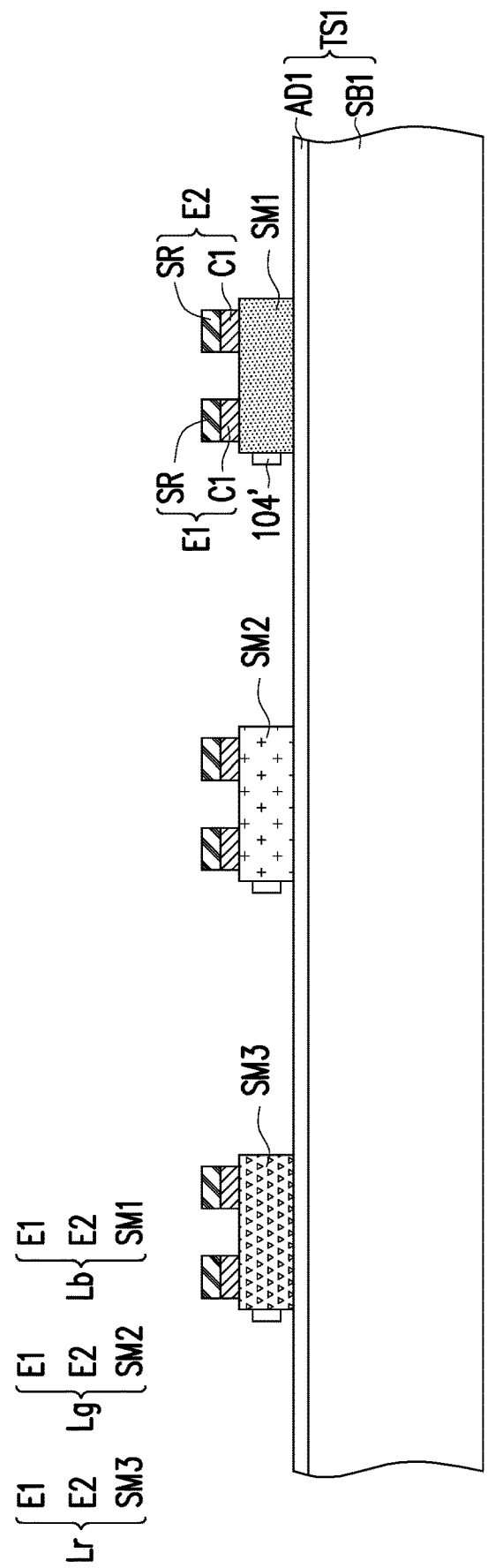

Referring to FIG. 5C, the LEDs Lg and Lr are formed by a method similar to FIG. 5A to FIG. 5B, and the LEDs Lg and Lr are placed on the first transferring substrate TS1.

Figure 5D:
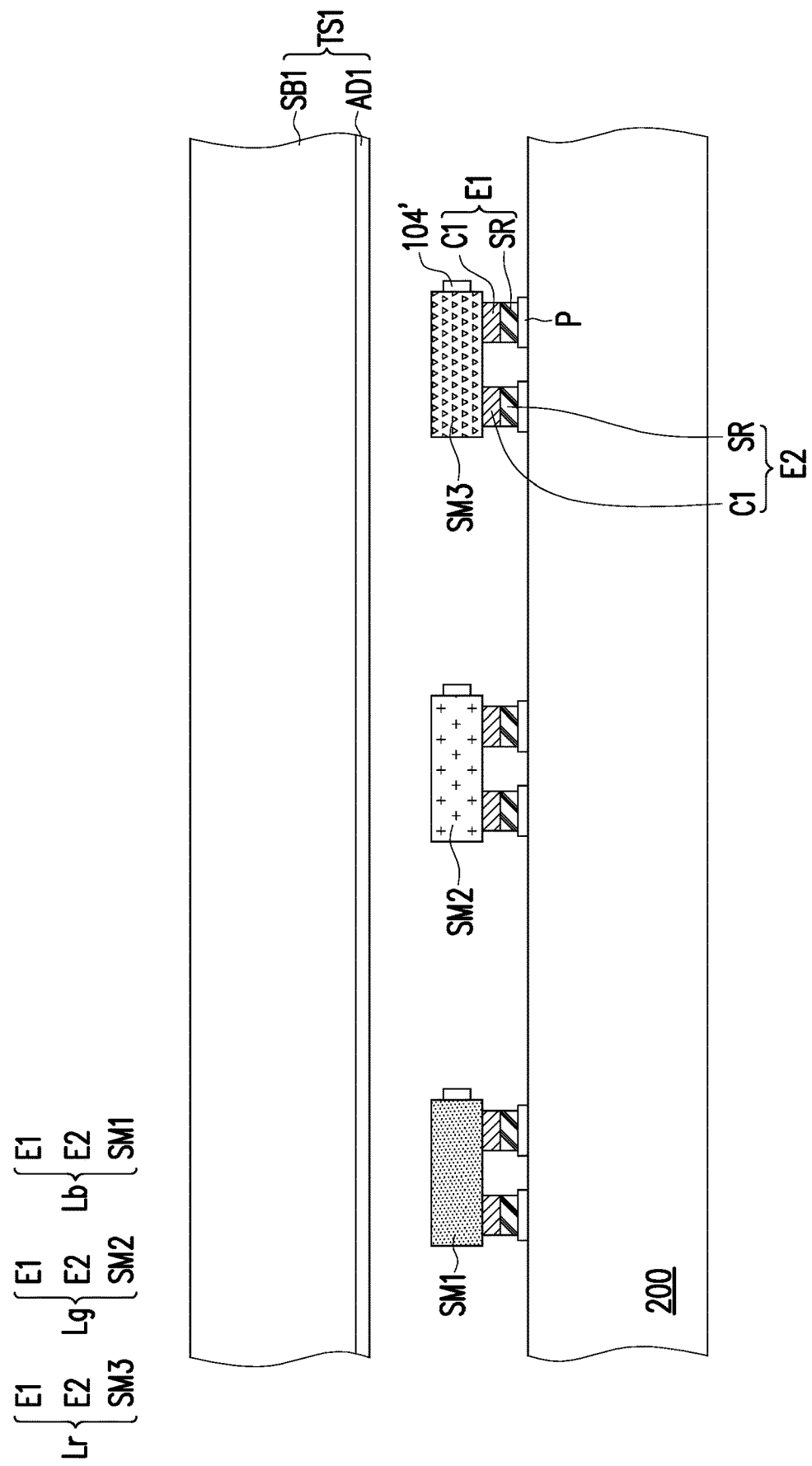

Referring to FIG. 5D, the first transferring substrate TS1 is reversed, and the LEDs Lb, Lg, and Lr are transferred from the first transferring substrate TS1 to the circuit substrate 200. In this embodiment, the spacings between the LEDs Lb, Lg, and Lr on the first transferring substrate TS1 are approximately equal to the spacings between the LEDs Lb, Lg, and Lr on the circuit substrate 200.

In this embodiment, the circuit substrate 200 includes a plurality of pads P. The pads P are electrically connected to active components (not shown) or signal lines (not shown) in the circuit substrate 200. The position of each of the LEDs Lb, Lg, Lr are corresponding to two of the pads P of the circuit substrate 200.

In some embodiments, the substrate SB1 of the first transferring substrate TS1 includes a thermal conductive material. The first transferring substrate TS1 is pressed on the circuit substrate 200, and then heat is transferred to the LEDs Lb, Lg, and Lr through the first transferring substrate TS1 so as to heat the LEDs Lb, Lg, and Lr. The metal layers SR in the electrodes E1 and E2 of the LEDs Lb, Lg, and Lr are respectively connected to the corresponding pads P of the circuit substrate 200.

In some embodiments, the substrate SB1 includes a transparent material, such as glass, sapphire or other suitable materials. The first transferring substrate TS1 is pressed on the circuit substrate 200, and then a laser is irradiating to the LEDs Lb, Lg, and Lr through the substrate SB1 so as to heat the LEDs Lb, Lg, and Lr. The metal layers SR in the electrodes E1 and E2 of the LEDs Lb, Lg, and Lr are respectively connected to the corresponding pads P of the circuit substrate 200.

Still referring to FIG. 5D, after electrically connecting the LEDs Lb, Lg, and Lr to the circuit substrate 200, the first transferring substrate TS1 is removed.

FIG. 6A to FIG. 6E are schematic cross-sectional views of a fabrication method of an LED display device according to an embodiment of the present invention.

Figure 6A:
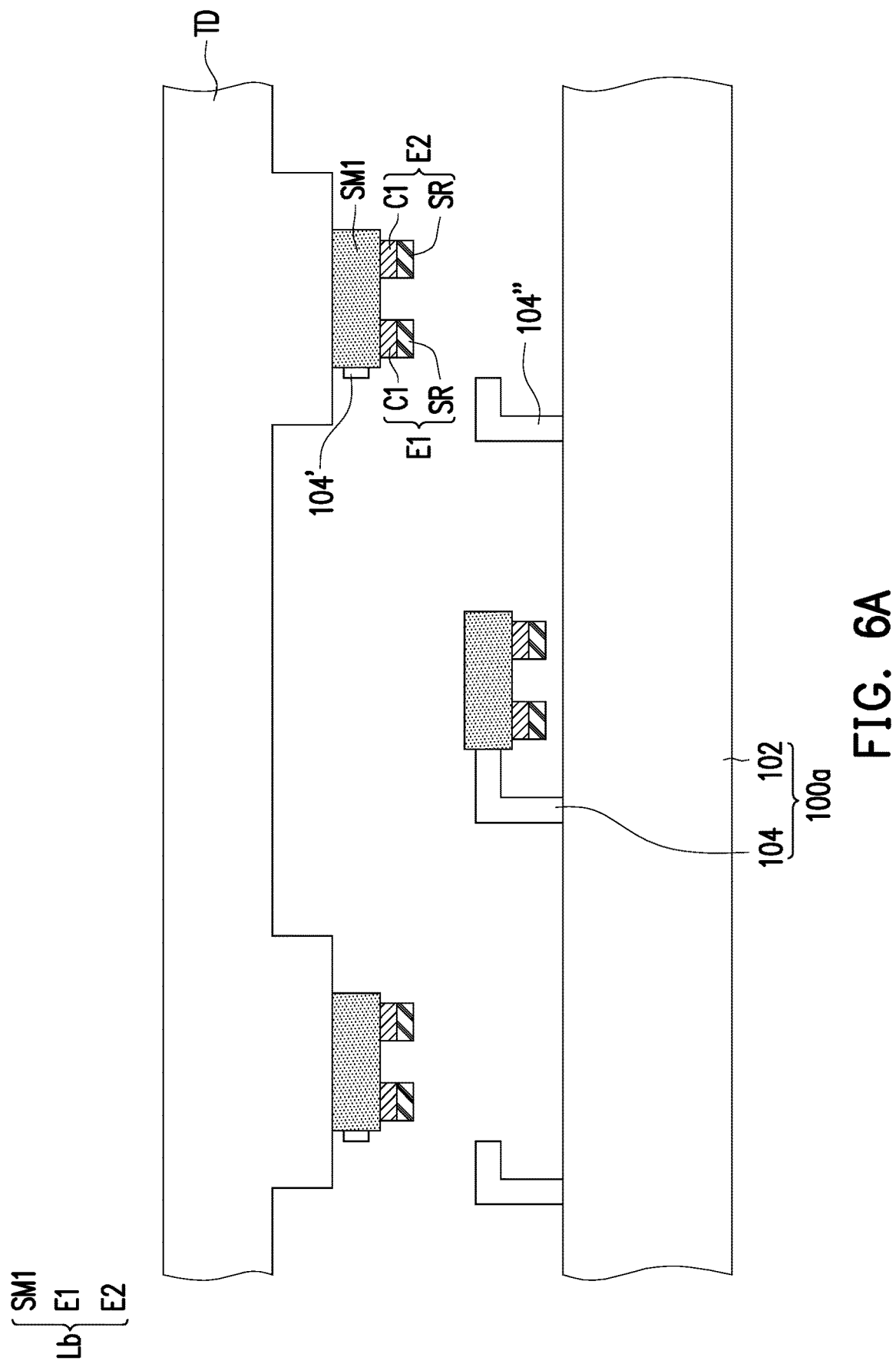
FIG. 6A to FIG. 6E are schematic cross-sectional views of a fabrication method of an LED display device according to an embodiment of the present invention.

Referring to FIG. 6A, a plurality of LEDs Lb are formed on the growth substrate 100a. In this embodiment, the growth substrate 100a includes a substrate 102 and tether structures 104. In some embodiments, a sacrificial layer (not shown) and the tether structures 104 are formed on the substrate 102, and then the LEDs Lb connected to the tether structures 104 are formed, and then the sacrificial layer is removed so that there is a gap between the LEDs Lb and the substrate 102. After removing the sacrificial layer, the LEDs Lb are fixed on the tether structures 104 on the growth substrate 100a.

In this embodiment, each of the LEDs Lb includes a semiconductor stacked layer SM1 and two electrodes E1 and E2. The two electrodes E1 and E2 are formed on the semiconductor stacked layer SM1. The structure of the LED Lb is similar to the LED L of FIG. 1 or the LED La of FIG. 2. The relevant description can refer to FIG. 1 and FIG. 2.

In this embodiment, the electrodes E1 and E2 of the LED Lb are located on the side of the LED Lb facing the substrate 102.

The transferring device TD is used to pick up one or more LEDs Lb. When the LEDs Lb are picked up from the growth substrate 100a, the tether structures 104 will be broken due to force. In some embodiments, part of the broken tether structure 104' remains on the picked LED Lb, and the other part of the broken tether structure 104" remains on the substrate 102, but the present invention is not limited thereto.

In this embodiment, the stickiness material of the transferring device TD includes, for example, polydimethylsiloxane and etc., and the transferring device TD picks up the LEDs Lb by Van der Waals force between the transferring device TD and the LEDs Lb. In other embodiments, the transferring device TD picks up the LEDs Lb by other methods such as vacuum attraction or electrostatic attraction.

Figure 6B:
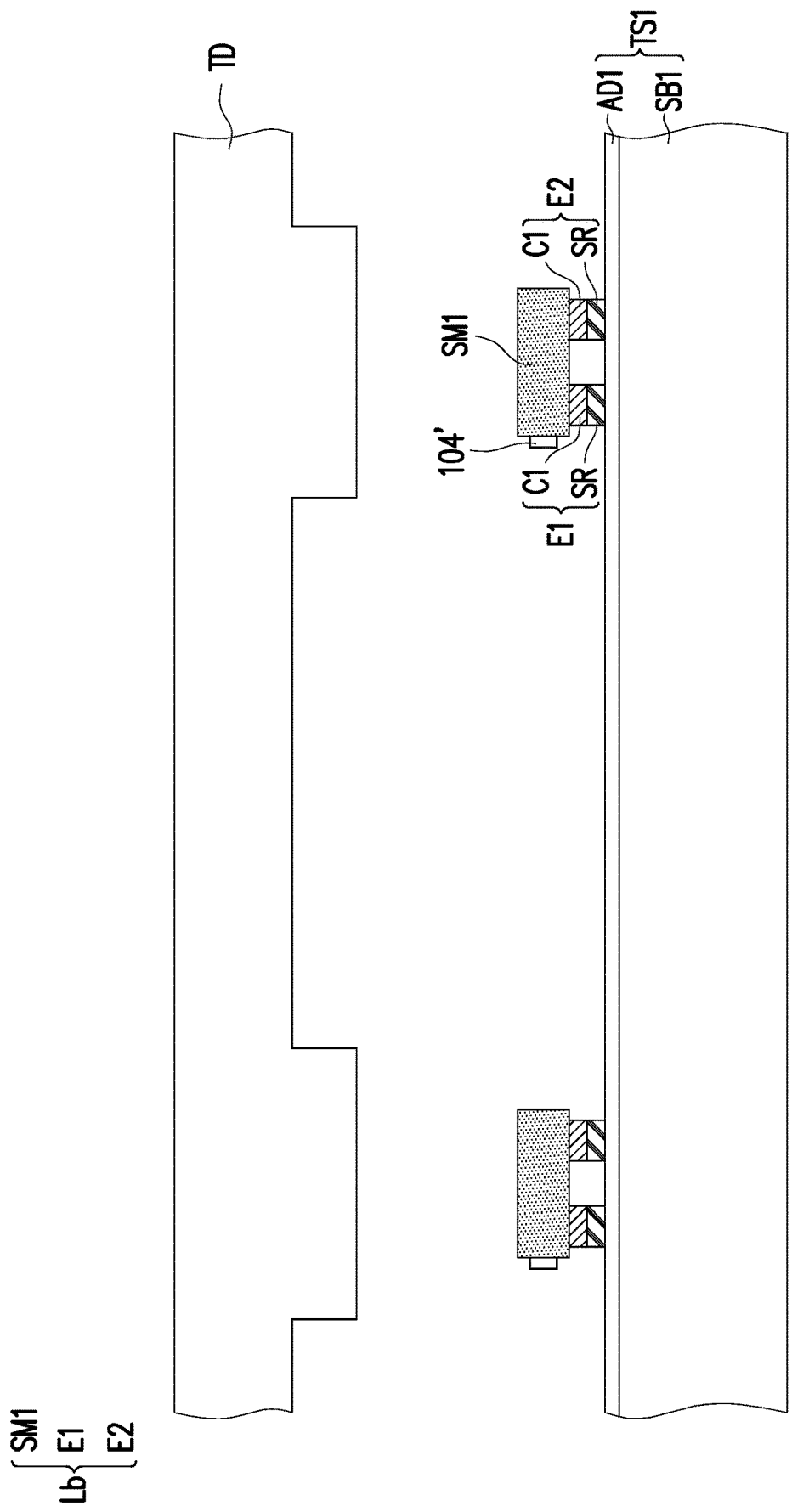

Referring to FIG. 6A and FIG. 6B, the LEDs Lb tare transferred to the first transferring substrate TS1 through the transferring device TD.

In this embodiment, the first transferring substrate TS1 includes a substrate SB1 and an adhesion layer AD1. In some embodiments, the first transferring substrate TS1 is an adhesive tape, and the substrate SB1 includes a flexible material. In some embodiments, the substrate SB1 is a transparent substrate, and the material is, for example, glass, sapphire or other suitable materials.

In this embodiment, part of the LEDs Lb are transferred to the first transferring substrate TS1, and the other part of the LEDs Lb remain on the growth substrate 100. In other embodiments, all of the LEDs Lb are transferred to the first transferring substrate TS1. In this embodiment, the electrodes E1 and E2 of the LED Lb are located on the side of the LED Lb facing the first transferring substrate TS1.

Figure 6C:
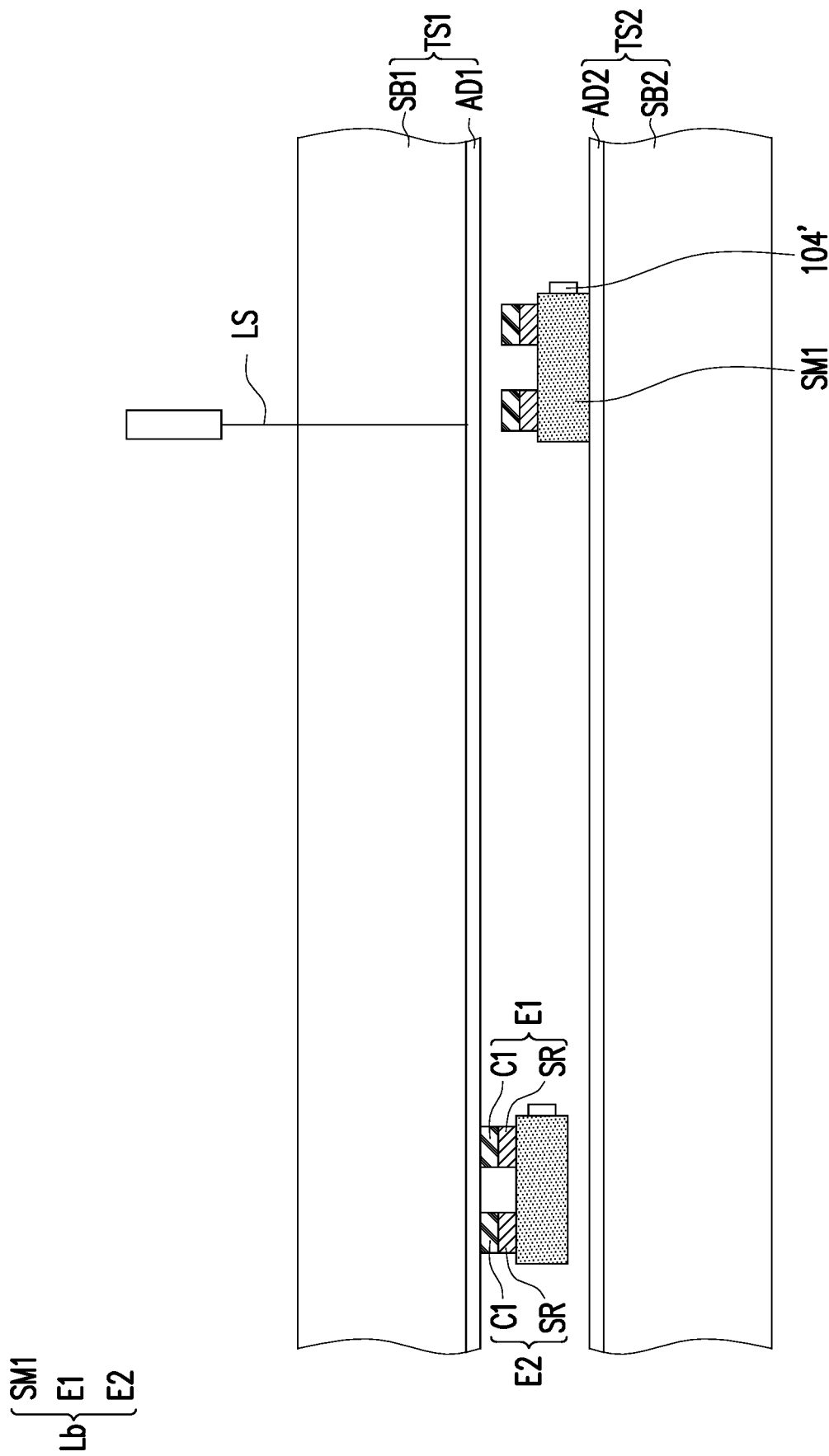

Referring to FIG. 6C, one or more of the LEDs Lb are transferred from the first transferring substrate TS1 to the second transferring substrate TS2. The second transferring substrate TS2 includes a substrate SB2 and an adhesion layer AD2. In some embodiments, the substrate SB2 includes a thermal conductive material, such as ceramic, metal, or other suitable materials. In some embodiments, the substrate SB2 includes a transparent material, such as glass, sapphire or other suitable materials.

In this embodiment, the substrate SB1 of the first transferring substrate TS1 is a transparent substrate. After transferring the first transferring substrate TS1 to the second transferring substrate TS2, a laser LS is irradiating to the LEDs Lb from a side of the substrate SB1, and a laser transfer method is used to transfer at least part of the LEDs Lb from the first transferring substrate TS1 to the adhesion layer AD2 of the second transferring substrate TS2.

In other embodiments, the first transferring substrate TS1 includes an adhesive tape, and the stickiness of the adhesion layer AD2 is greater than the stickiness of the adhesion layer AD1. After attaching the second transferring substrate TS2 to the LEDs Lb on the first transferring substrate TS1, the first transferring substrate TS1 is removed. Since the stickiness of the adhesion layer AD2 is greater than the stickiness of the adhesion layer AD1, after removing the first transferring substrate TS1, the LEDs Lb remain on the second transferring substrate TS2.

In this embodiment, part of the LEDs Lb are transferred to the second transferring substrate TS2, and the other part of the LEDs Lb remain on the first transferring substrate TS1, but the invention is not limited thereto. In other embodiments, all of the LEDs Lb on the first transferring substrate TS1 are transferred to the second transferring substrate TS2.

In this embodiment, the electrodes E1 and E2 of the LED Lb are located on the side of the LED Lb facing away from the second transferring substrate TS2.

Figure 6D:
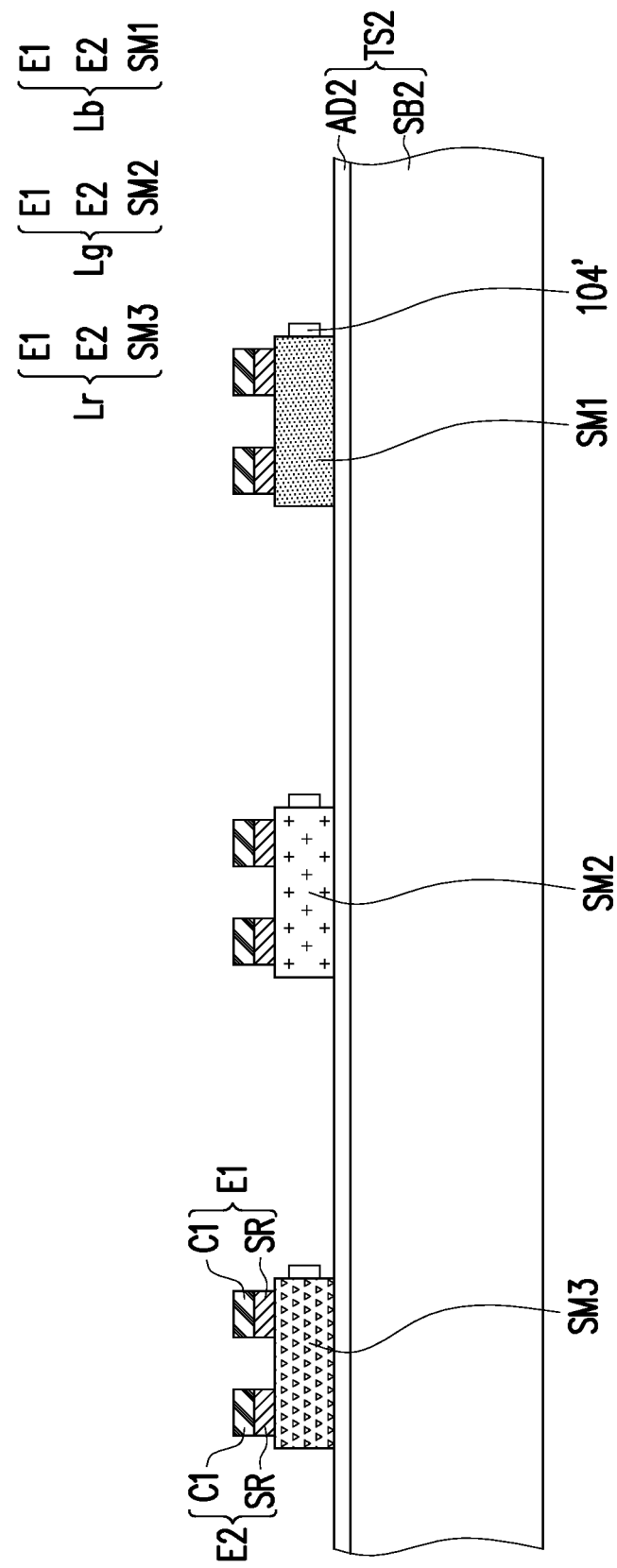

Referring to FIG. 6D, one or more LEDs Lg and Lr are transferred to the second transferring substrate TS2 in a manner similar to FIG. 6A to FIG. 6C. The LED Lg includes a semiconductor stacked layer SM2 and electrodes E1 and E2, and the LED Lr includes a semiconductor stacked layer SM3 and electrodes E1 and E2. The structure of the LED Lg and Lr are similar to the LED L in FIG. 1 or the LED La in FIG. 2. The relevant description can refer to FIG. 1 and FIG. 2.

Figure 6E:
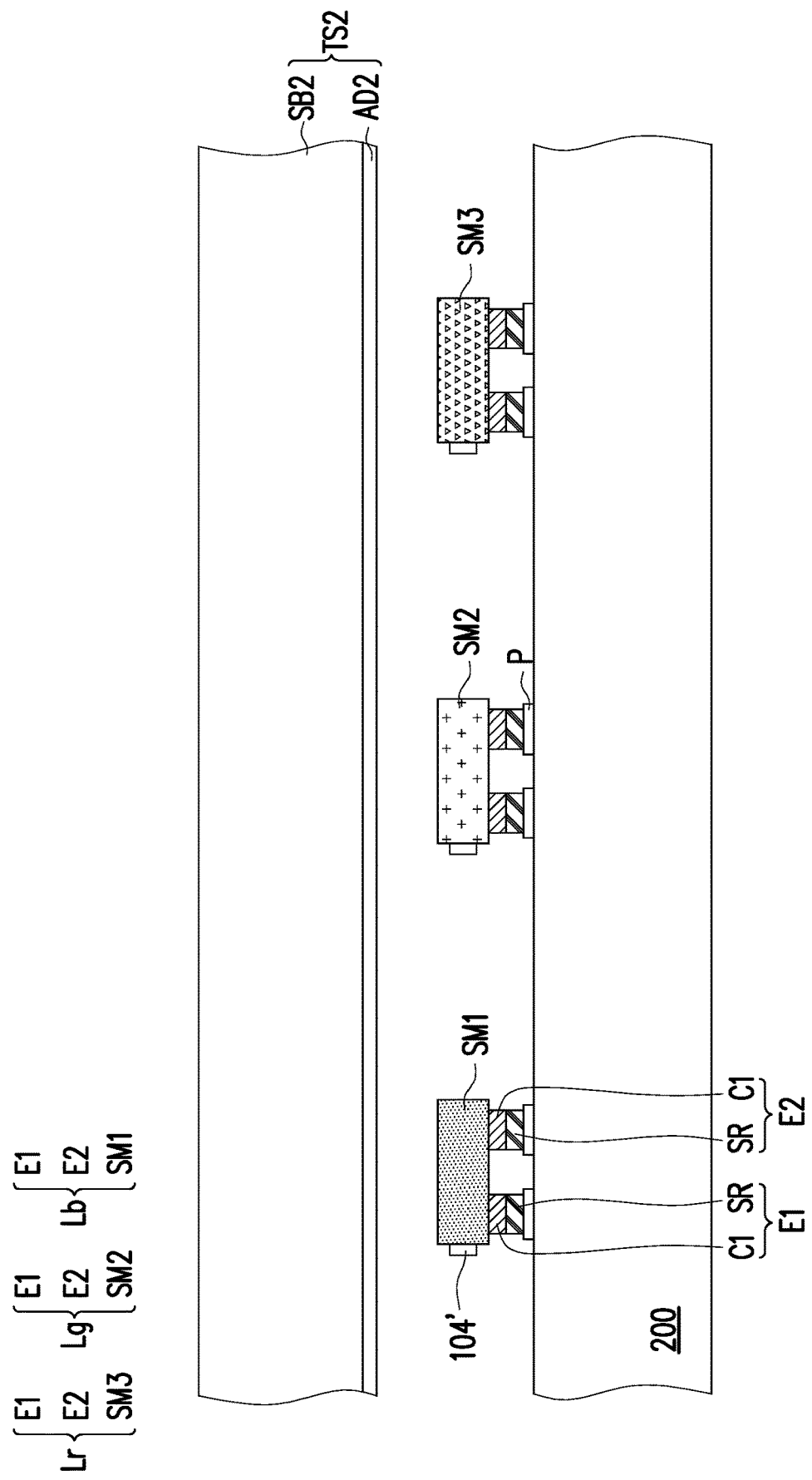

Referring to FIG. 6E, the LEDs Lb, Lg, and Lr are transferred from the second transferring substrate TS2 to the circuit substrate 200. In this embodiment, the spacings between the LEDs Lb, Lg, and Lr on the second transferring substrate TS2 are approximately equal to the spacings between the LEDs Lb, Lg, and Lr on the circuit substrate 200.

In this embodiment, the circuit substrate 200 includes a plurality of pads P. The pads P are electrically connected to active components (not shown) or signal lines (not shown) in the circuit substrate 200. The position of each of the LEDs Lb, Lg, Lr are corresponding to two of the pads P of the circuit substrate 200.

In some embodiments, the substrate SB2 of the second transferring substrate TS2 includes a thermal conductive material. The second transferring substrate TS2 is pressed on the circuit substrate 200, and then heat is transferred to the LEDs Lb, Lg, and Lr through the second transferring substrate TS2 so as to heat the LEDs Lb, Lg, and Lr. The metal layers SR in the electrodes E1 and E2 of the LEDs Lb, Lg, and Lr are respectively connected to the corresponding pads P of the circuit substrate 200.

In some embodiments, the substrate SB2 includes a transparent material, such as glass, sapphire or other suitable materials. The second transferring substrate TS2 is pressed on the circuit substrate 200, and then a laser is irradiating to the LEDs Lb, Lg, and Lr through the substrate SB2 so as to heat the LEDs Lb, Lg, and Lr. The metal layers SR in the electrodes E1 and E2 of the LEDs Lb, Lg, and Lr are respectively connected to the corresponding pads P of the circuit substrate 200.

Still referring to FIG. 6E, after electrically connecting the LEDs Lb, Lg, and Lr to the circuit substrate 200, the second transferring substrate TS2 is removed.

FIG. 7A to FIG. 7J are schematic diagrams of a method for repairing an LED display device according to an embodiment of the present invention.

Figure 7A:
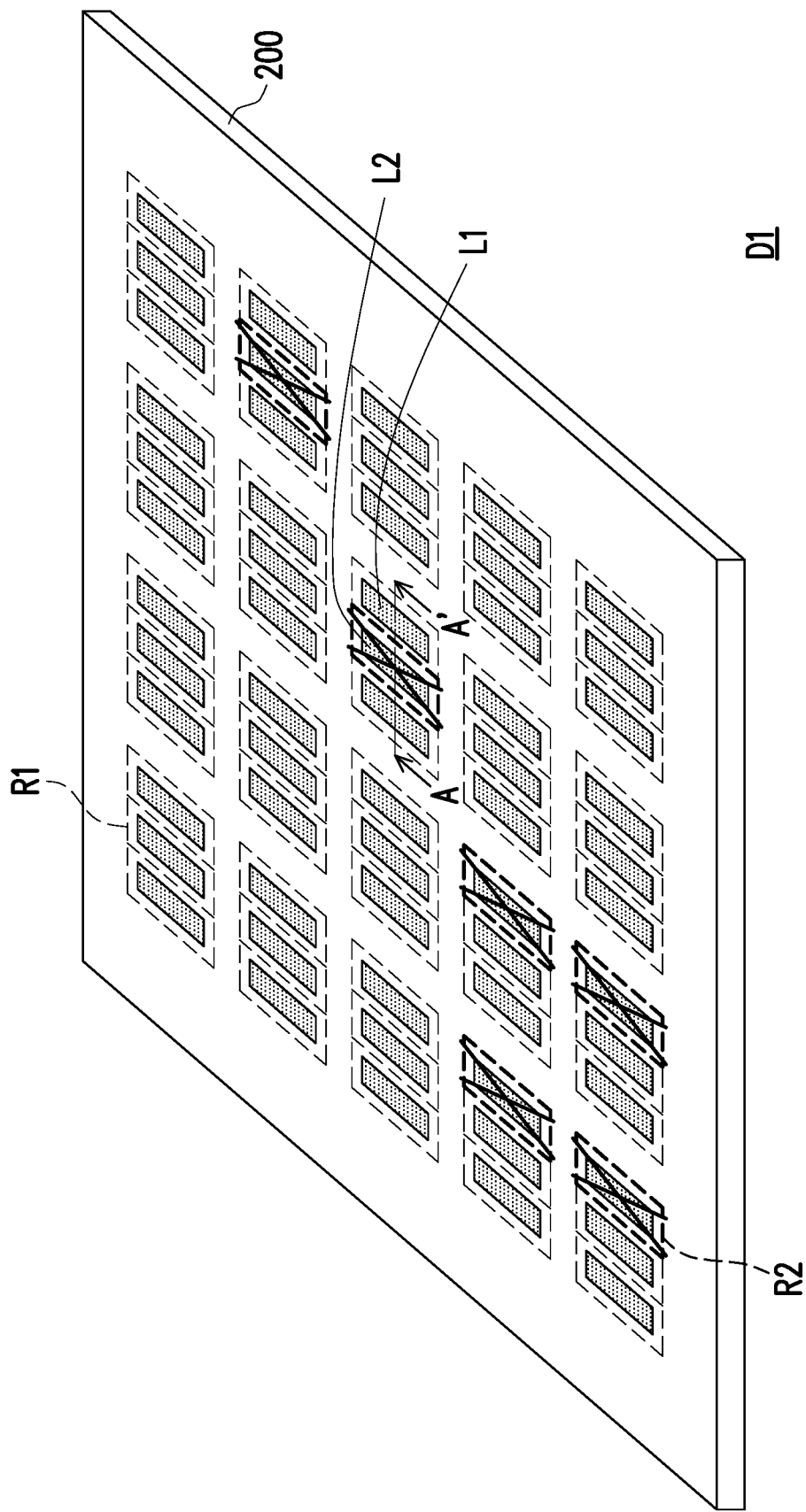
FIG. 7A to FIG. 7J are schematic diagrams of a method for repairing an LED display device according to an embodiment of the present invention.
Figure 7B:
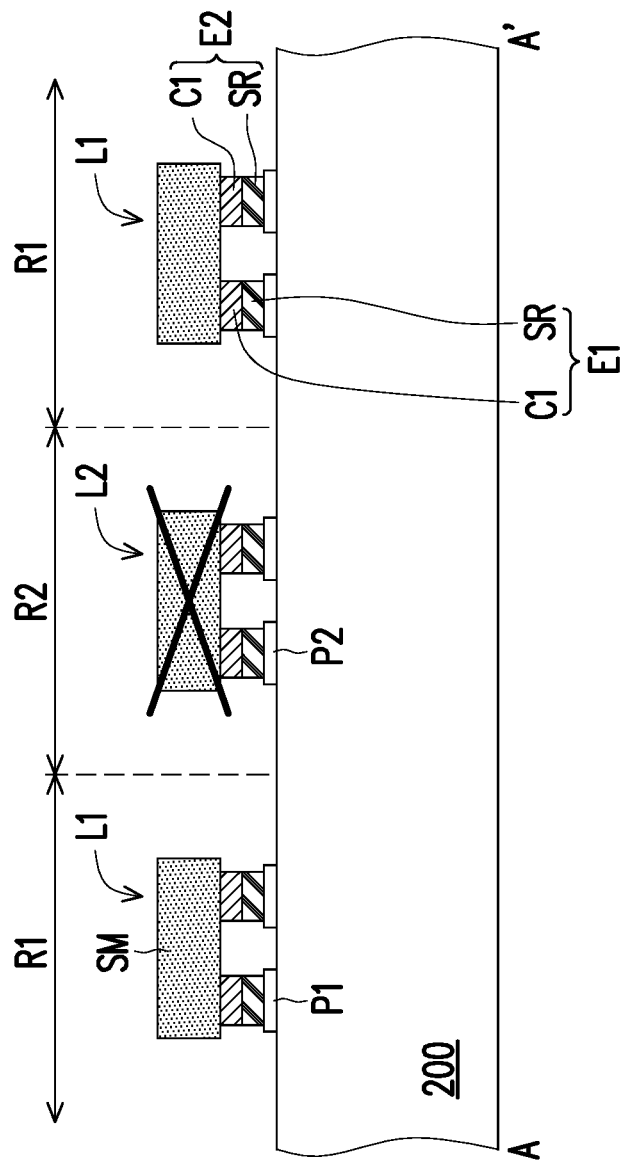

FIG. 7B is a schematic cross-sectional view taken along the line AA' of FIG. 7A. Referring to FIG. 7A and FIG. 7B, a LED display device D1 is provided. The LED display device D1 includes a circuit substrate 200, a plurality of first LEDs L1, and one or more second LEDs L2. The LED display device D1 is detected, wherein the second LED L2 cannot emit light normally.

In this embodiment, the method of transferring the first LEDs L1 and the second LEDs L2 to the circuit substrate 200 can refer to any of the foregoing embodiments, and will not be repeated here. In this embodiment, each of the first LEDs L1 and the second LEDs L2 includes a semiconductor stacked layer SM and two electrodes E1 and E2 electrically connected to the semiconductor stacked layer SM. In this embodiment, both of the first LEDs L1 and the second LEDs L2 are LEDs of the same color (for example, blue LEDs, red LEDs, or green LEDs). The first LEDs L1 and the second LEDs L2 can be formed, for example, on the same growth substrate, and then the first LEDs L1 and the second LEDs L2 are transferred to the circuit substrate 200, but the invention is not limited thereto.

In this embodiment, the first LEDs L1 are corresponding to the first placement regions R1 of the circuit substrate 200 respectively. In some embodiments, the first LEDs L1 are electrically connected to the first pads P1 in the first placement regions R1. The second LEDs L2 are disposed corresponding to the second placement regions R2 of the circuit substrate 200. In some embodiments, the second LED L2 has an inherent fault, so even if the second LEDs L2 are connected to the second pads P2 in the second placement regions R2, the second LEDs L2 cannot emit light normally. In some embodiments, problems, such as the second LED L2 is shift or failure during the transferring process, or the LED is defective, cause the second LED L2 is not accurately connected to the second pads P2 or the second LED L2 can't emit light normally.

In this embodiment, a plurality of the LEDs in the LED display device D1 are faulty. In other words, the LED display device D1 includes a plurality of the second LEDs L2, and the second LEDs L2 are disposed respectively corresponding to the second placement regions R2 of the circuit substrate 200. In other embodiments, one LED in the LED display device D1 is faulty. In other words, the LED display device D1 includes one second LED L2, and the one second LED L2 is disposed corresponding to one second placement region R2 of the circuit substrate 200.

Figure 7C:
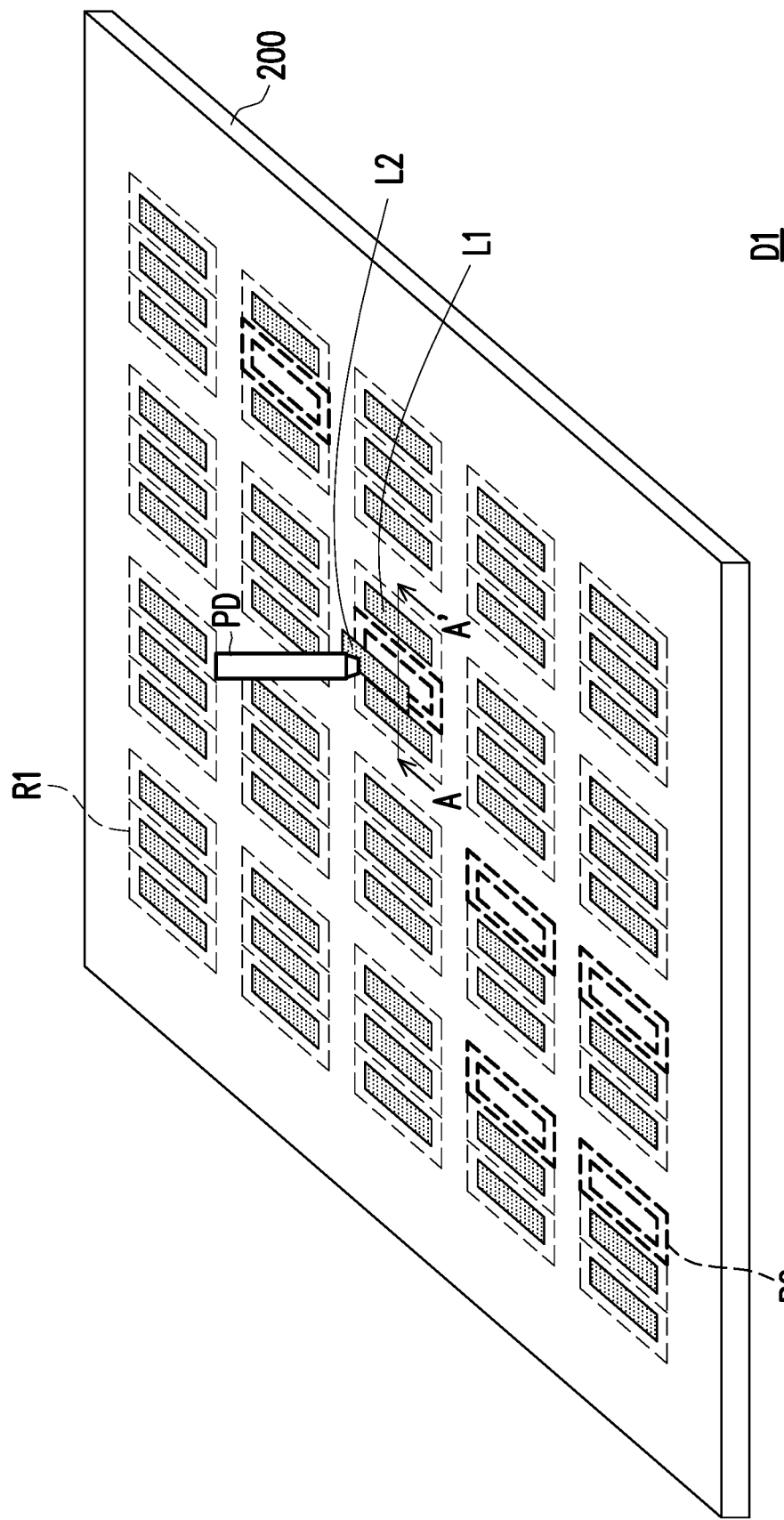
Figure 7D:
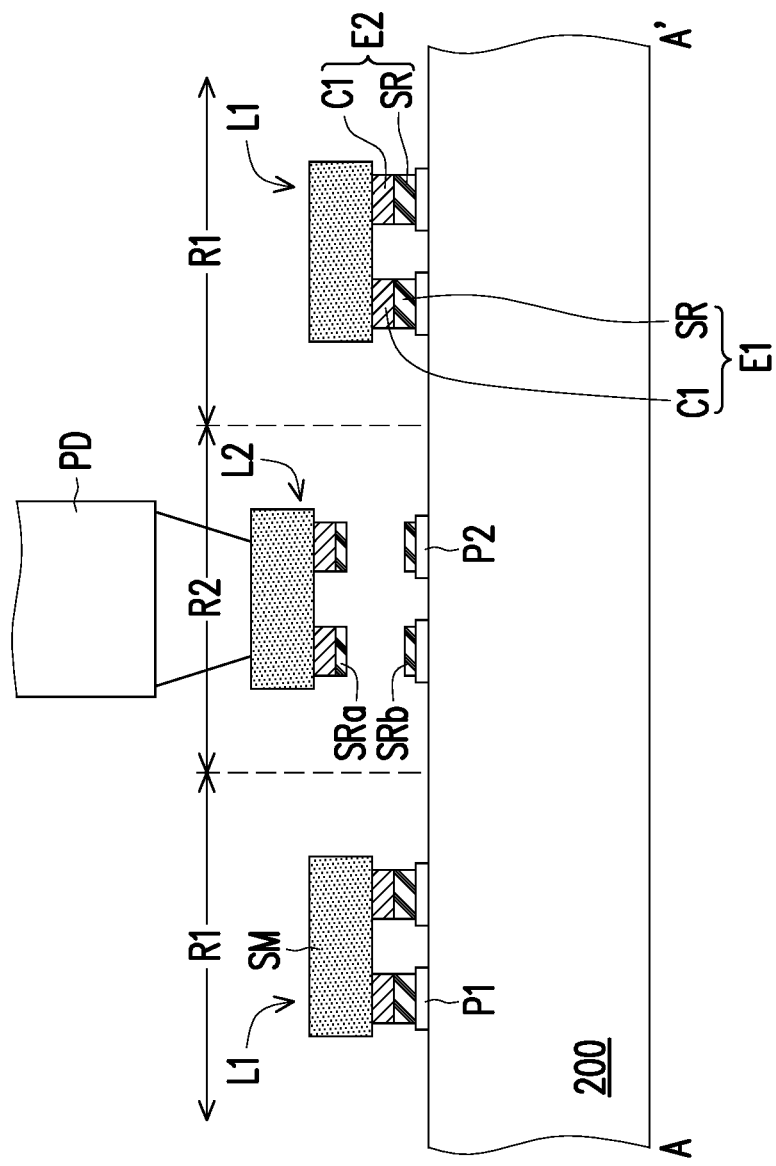

FIG. 7D is a schematic cross-sectional view taken along the line AA' of FIG. 7C. Referring to FIG. 7C and FIG. 7D, the second LEDs L2 are removed from the circuit substrate 200. For example, the second LEDs L2 are removed from the circuit substrate 200 by the LED removal module PD. The removal module PD is a stickiness tip, a vacuum nozzle, a laser module, or any kind of removal machine.

In some embodiments, after the second LEDs L2 are removed from the circuit substrate 200, the metal layers SR of the second LEDs L2 remain on the second pads P2 of the circuit substrate 200. For example, the metal layers SR in the electrodes E1 and E2 of the LEDs L2 are melt by heating the LEDs L2 by the removal module PD or laser and etc. Part of the molten metal layers SRb remain on the second pads P2, and the other part of the metal layers SRa are picked up with the second LEDs L2 being removed.

Figure 7E:
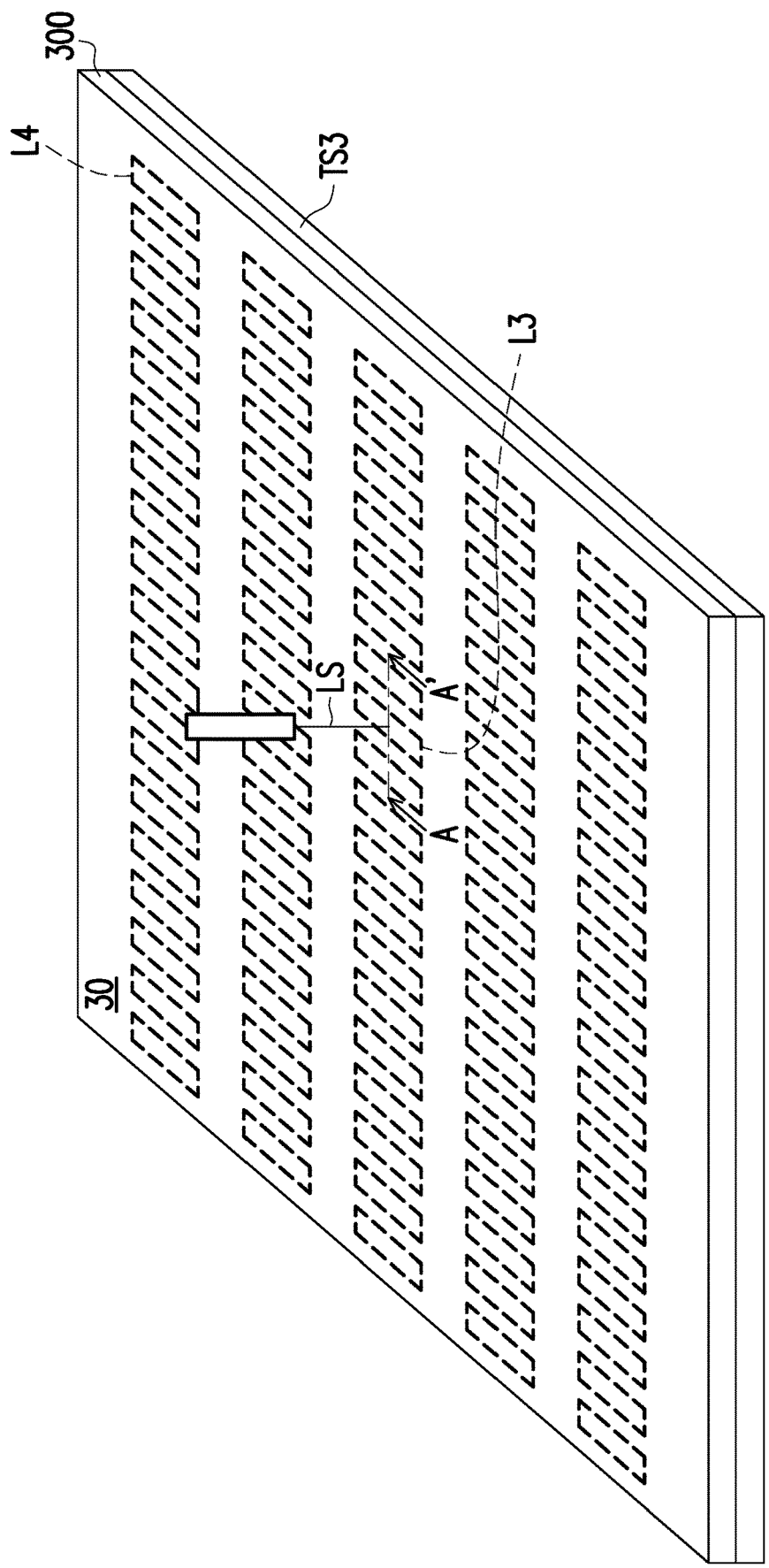
Figure 7F:
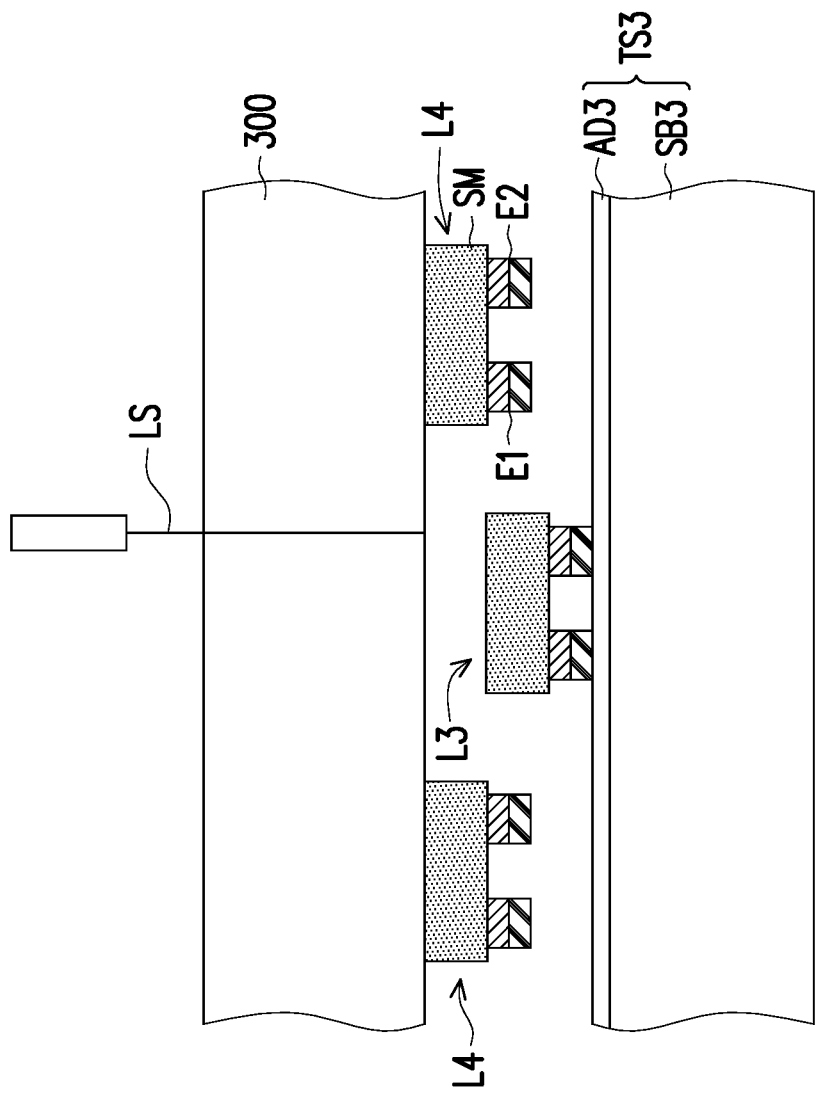

FIG. 7F is a schematic cross-sectional view taken along the line AA' of FIG. 7E. Referring to FIG. 7E and FIG. 7F, an LED substrate 30 is provided. The structure of the LED substrate 30 is similar to the LED substrate 10 of FIG. 1 or the LED substrate 20 of FIG. 2. In this embodiment, the LED substrate 30 includes a growth substrate 300 and a plurality of third LEDs L3 and a plurality of fourth LEDs L4 on the growth substrate. The third LED L3 of the LED substrate 30 includes a semiconductor stacked layer SM and two electrodes E1 and E2 electrically connected to the semiconductor stacked layer SM. In this embodiment, the first LED L1, the second LED L2, the third LED L3, and the fourth LED L4 have a similar structure, and the structure is similar to the LED L of FIG. 1 or the LED La of FIG. 2. In this embodiment, all of the first LED L1, second LED L2, third LED L3, and fourth LED L4 are LEDs of the same color.

A first transferring substrate TS3 is provided. The first transferring substrate TS3 includes a substrate SB3 and an adhesion layer AD3 located on the substrate SB3.

Based on the positions of the second placement regions R2, one or more third LEDs L3 of the LED substrate 30 are transferred on the adhesion layer AD3 of the first transferring substrate TS3. For example, after a plurality of third LEDs L3 are transferred to the first transferring substrate TS3, an arrangement of the plurality of third LEDs L3 on the first transferring substrate TS3 is the same as an arrangement of the plurality of second placement regions R2 on the circuit substrate 200. Therefore, the third LEDs L3 can be transferred to the second placement regions R2 of the circuit substrate 200 in the subsequent manufacturing process without adjusting the spacings between adjacent third LEDs L3.

In some embodiments, the method of transferring one or more third LEDs L3 of the LED substrate 30 to the first transferring substrate TS3 includes laser lift off or the like. In some embodiments, after transferring the third LED L3 to the first transferring substrate TS3, the fourth LEDs L4 remain on the growth substrate 300. In other words, a laser is used to transfer required third LEDs L3 to the first transferring substrate TS3.

Figure 7G:
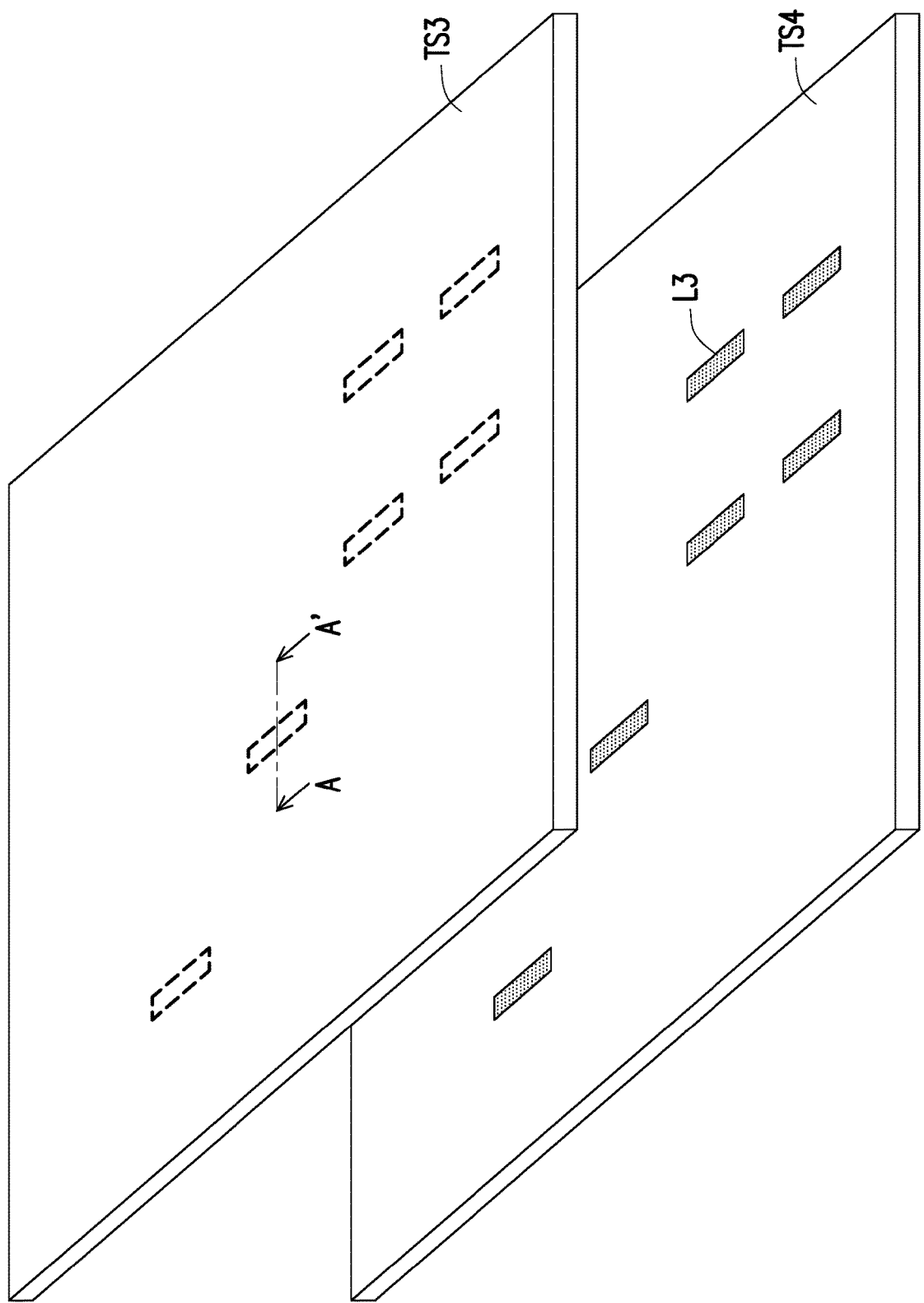
Figure 7H:
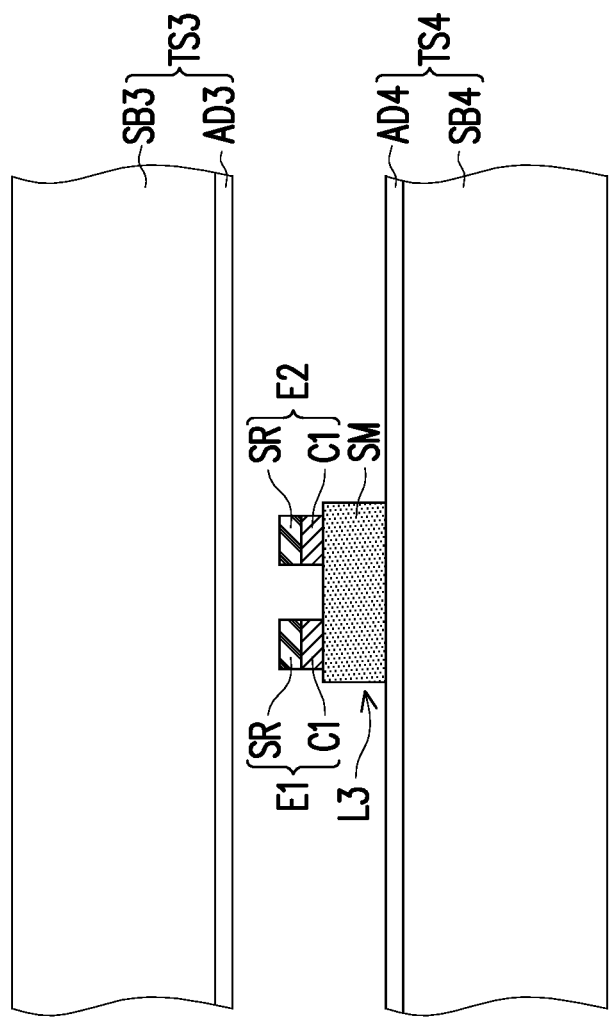

FIG. 7H is a schematic cross-sectional view taken along line AA' of FIG. 7G. Please refer to FIG. 7G and FIG. 7H, a second transferring substrate TS4 is provided. The second transferring substrate TS4 includes a substrate SB4 and an adhesion layer AD4 on substrate SB4.

The third LEDs L3 on the first transferring substrate TS3 are transferred to the second transferring substrate TS4. In this embodiment, the arrangement of the plurality of third LEDs L3 on the first transferring substrate TS3 is symmetrical to an arrangement of the plurality of third LEDs L3 on the second transferring substrate TS4. For example, after reversing the first transferring substrate TS3 and transferring the third LEDs L3 to the second transferring substrate TS4, the arrangement of the third LEDs L3 is mirror-symmetrical to the arrangement of the third LEDs L3 before the third LEDs L3 was not transferred to the second transferring substrate TS4.

In this embodiment, the first transferring substrate TS3 includes an adhesive tape, and the substrate SB3 includes a flexible material. The stickiness of adhesion layer AD4 is greater than that of adhesion layer AD3. After attaching the second transferring substrate TS4 to the third LEDs L3 on the first transferring substrate TS3 (for example, the second transferring substrate TS4 is moved to contact the second transferring substrate TS4 with the third LEDs L3 and/or the first transferring substrate TS3 is moved to contact the second transferring substrate TS4 with the third LEDs L3), the first transferring substrate TS3 is removed. Since the stickiness of the adhesion layer AD4 is greater than the stickiness of the adhesion layer AD3, after removing the first transferring substrate TS3, the third LEDs L3 remain on the second transferring substrate TS4.

In other embodiments, the substrate SB3 of the first transferring substrate TS3 is a transparent substrate. The first transferring substrate TS3 or the second transferring substrate TS4 is moved so as to overlap the first transferring substrate TS3 with the second transferring substrate TS4, and then a laser irradiating to the third LEDs L3 from the side of the substrate SB3, and the LEDs L3 are transferred from the first transferring substrate TS3 to the adhesion layer AD4 of the second transferring substrate TS4 in a manner of laser transfer.

Figure 7I:
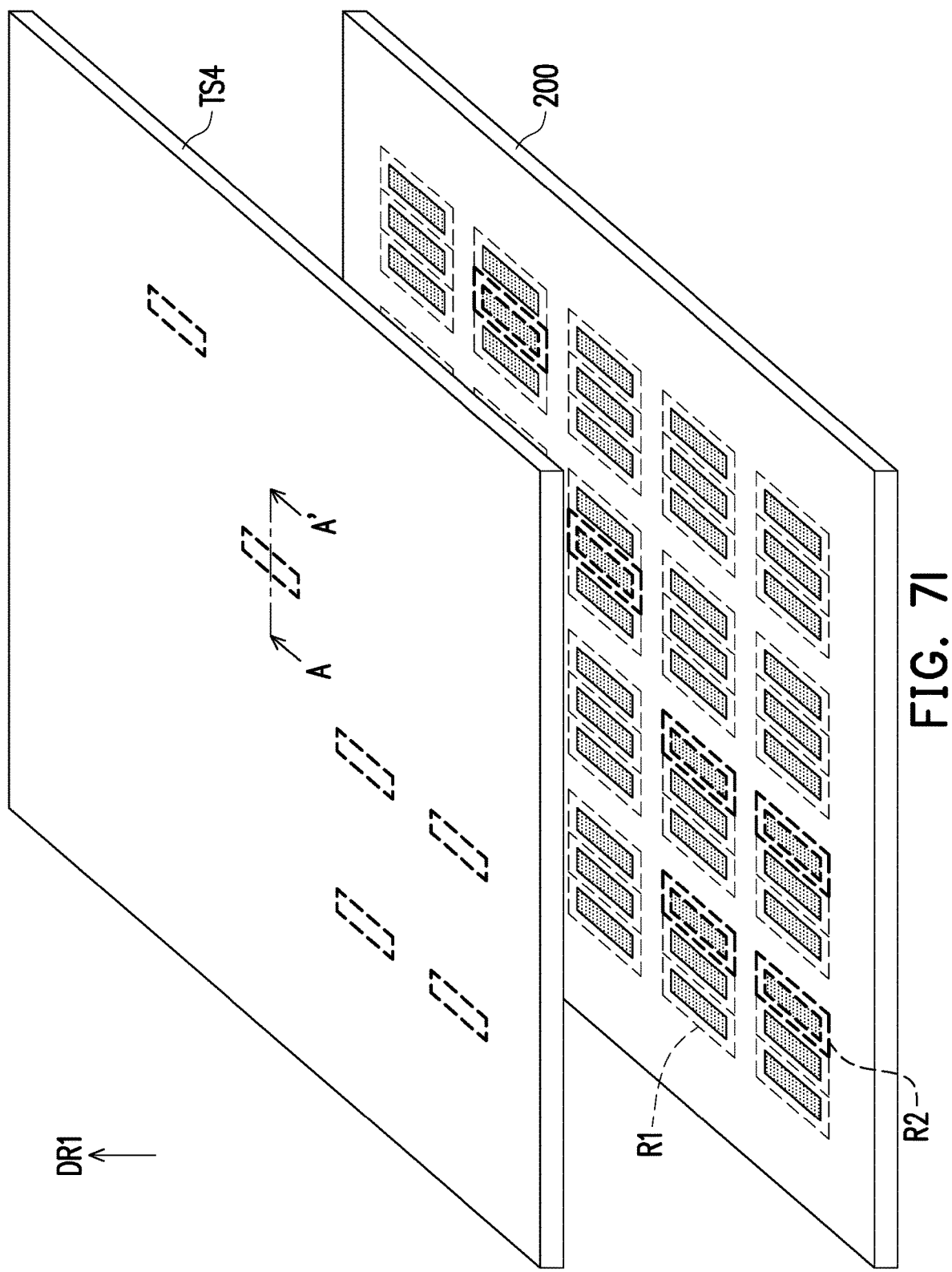
Figure 7J:
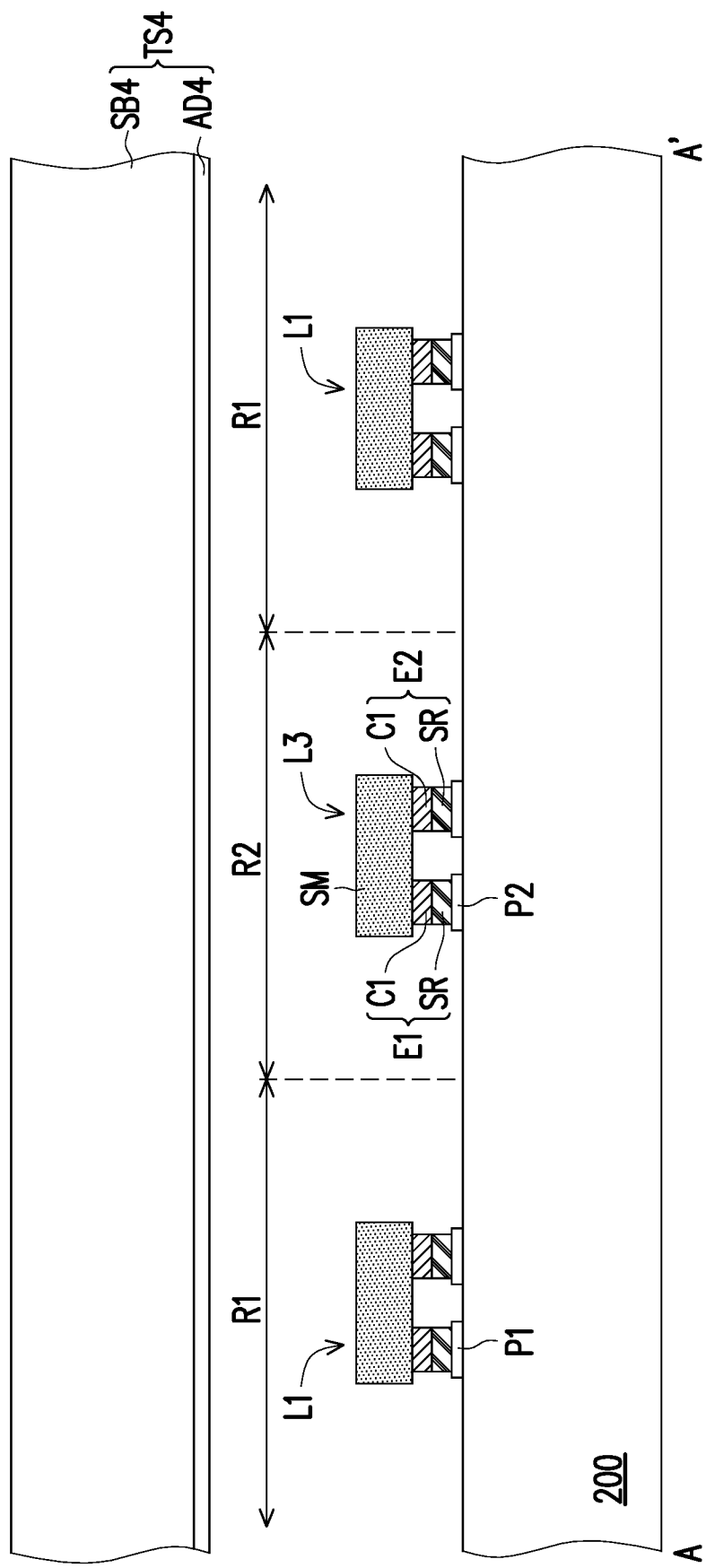

FIG. 7J is a schematic cross-sectional view taken along line AA' of FIG. 7I. Referring to FIG. 7I and FIG. 7J, the second transferring substrate TS4 is overlapped with the circuit substrate 200. The third LEDs L3 is located on the side of the second transferring substrate TS4 facing the circuit substrate 200. The positions of the third LEDs L3 overlap the second placement regions R2.

In some embodiments, when overlapping the second transferring substrate TS4 with the circuit substrate 200, the third LEDs L3 contact the second pads P2 of the circuit substrate 200, and the first LEDs L1 contacts the second transferring substrate TS4.

In some embodiments, when overlapping the second transferring substrate TS4 with the circuit substrate 200, the third LEDs L3 are not overlapped with the first LEDs L1 in a direction DR1 perpendicular to the second transferring substrate TS4.

The third LEDs L3 on the second transferring substrate TS4 are electrically connected to the circuit substrate 200. For example, the third LEDs L3 are heated so that the metal layers SR of the third LEDs L3 are electrically connected to the second pads P2 originally corresponding to the second LEDs L2. In some embodiments, the metal layers SR of the third LEDs L3 and the metal layers SRb of the second LEDs L2 remaining on the second pads P2 (shown in FIG. 7D) are fused with each other. In some embodiments, the second transferring substrate TS4 is heated so as to transfer heat to the third LEDs L3 or the third LEDs L3 are heated by a laser on one side of the second transferring substrate TS4. In some embodiments, the third LEDs L3 are heated to make the metal layers SR eutectic bonded with a plurality of second pads P2 of the circuit substrate 200.

In this embodiment, the third LEDs L3 are placed on the second pads P2 originally corresponding to the second LEDs L2, but the invention is not limited thereto. In other embodiments, each of the first placement regions R1 and the second placement regions R2 has a redundancy pad (not shown) for repair disposed therein, and the third LEDs L3 are placed on the redundancy pads of the second placement regions R2, and the third LEDs L3 are electrically connected to other components in the circuit substrate 200 through the redundancy pads.

In this embodiment, since the electrodes E1 and E2 of the third LED L3 include metal layer SR, the third LED L3 can be bonded to the circuit substrate 200 without formation of additional solder balls or conductive paste on the circuit substrate 200. In addition, repair failure causing by shift of the additional solder balls or conductive paste will not occur. In other words, the metal layers SR of the third LEDs L3 improves the yield and accuracy of the repair process.

After electrically connecting the third LEDs L3 to the circuit substrate 200, the second transferring substrate TS4 is removed.

In this embodiment, the first LEDs L1 and the third LEDs L3 include LEDs of the same color, and other color conversion elements (such as quantum dot materials or phosphor materials, etc.) are used to convert the color of light emitted by the first LEDs L1 and the third LEDs L3 into other colors.

Based on the above, in some embodiments, the method of transferring the third LEDs L3 to the circuit substrate 200 is at least partly the same as transferring the first LEDs L1 and the second LEDs L2 to the circuit substrate 200 (for example, the LEDs are both transferred from the growth substrate to the circuit substrate through the laser lift). Therefore, the equipment required to transfer the third LEDs L3 to the circuit substrate 200 is at least partly the same as the equipment required to transfer the first LEDs L1 and second LEDs L2 to the circuit substrate 200, thereby saving equipment costs. In some embodiments, a plurality of third LEDs L3 can be transferred to the circuit substrate 200 at the same time. Therefore, the time required for the repair process can be reduced.

FIG. 8A to FIG. 8D are schematic cross-sectional views of a method for repairing an LED display device according to an embodiment of the present invention.

Figure 8A:
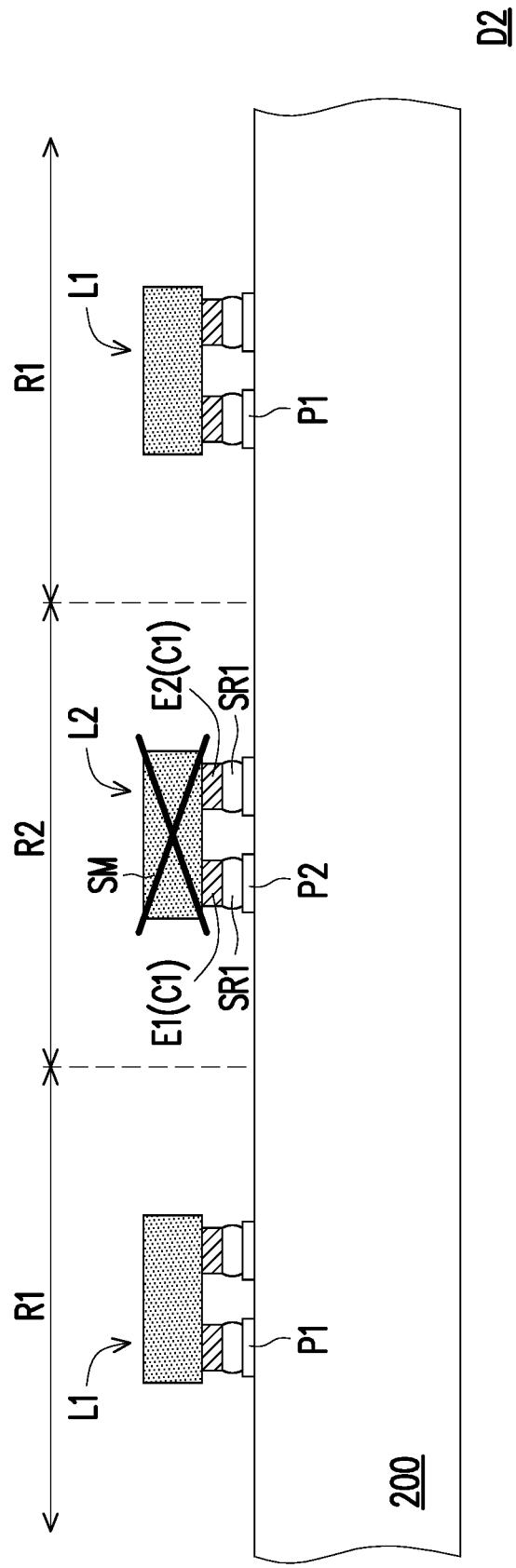
FIG. 8A to FIG. 8D are schematic cross-sectional views of a method for repairing an LED display device according to an embodiment of the present invention.

Referring to FIG. 8A, an LED display device D2 is provided. The LED display device D2 includes a circuit substrate 200, a plurality of first LEDs L1, and one or more second LEDs L2. In this embodiment, the low melting point metal (for example, the metal layer SR) is not formed on the electrodes E1 and E2 of the first LEDs L1 and the second LEDs L2, respectively. In this embodiment, the solders SR1 are formed on the first pads P1 and the second pads P2 of the circuit substrate 200, and then the first LEDs L1 and the second LEDs L2 are placed to the circuit substrate 200.

In this embodiment, the method of transferring the first LEDs L1 and the second LEDs L2 to the circuit substrate 200 can refer to any of the foregoing embodiments, and will not be repeated here. In this embodiment, the first LEDs L1 and the second LEDs L2 are LEDs of the same color (for example, blue LEDs, red LEDs, or green LEDs). The first LEDs L1 and the second LEDs L2, for example, can be formed on the same growth substrate, and then the first LEDs L1 and second LEDs L2 are transferred to the circuit substrate 200.

In this embodiment, the LED display device D2 is detected, and the second LEDs L2 cannot emit light normally. In some embodiments, one or more LEDs L2 in the LED display device are faulty.

Figure 8B:
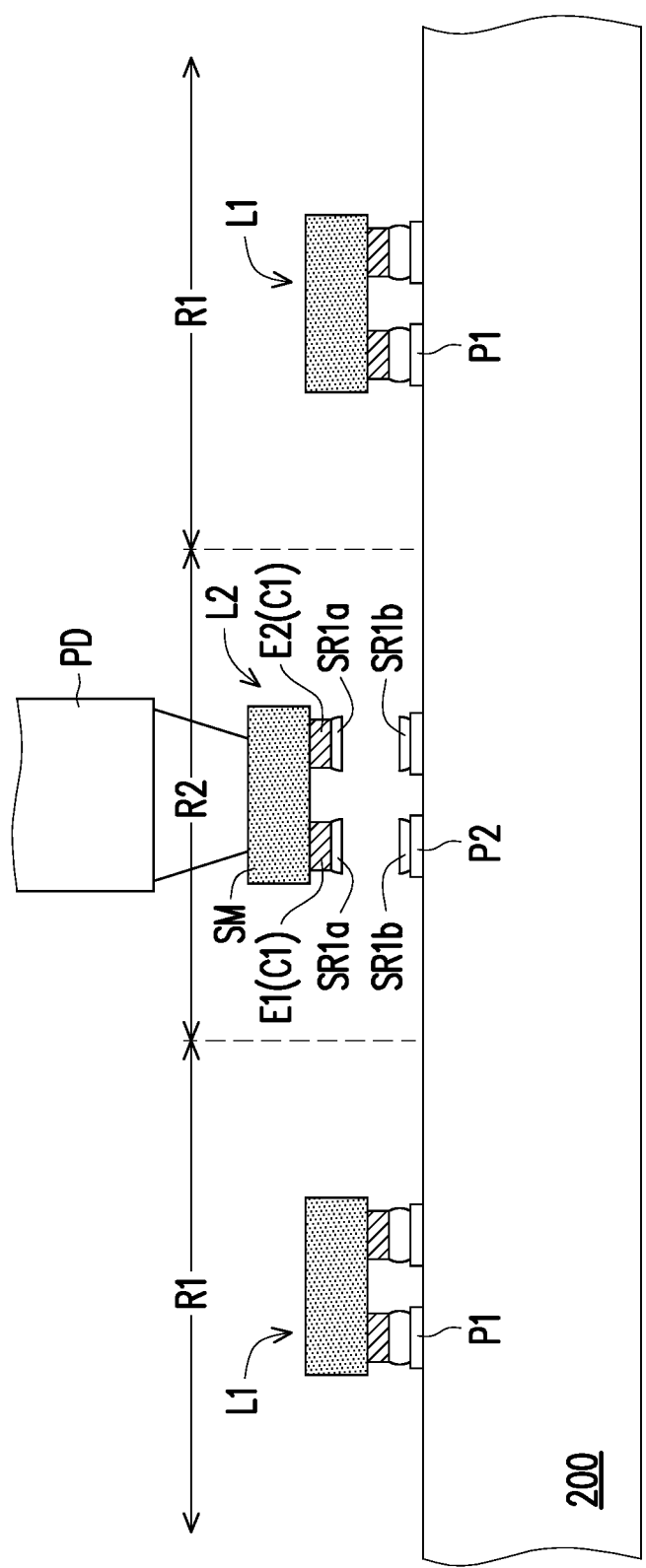

Referring to FIG. 8B, the second LEDs L2 are removed from the circuit substrate 200. For example, the second LED L2 is removed from the circuit substrate 200 by the removal module PD. The removal module PD is a stickiness tip, a vacuum nozzle, a laser module or any kind of removal machine.

In this embodiment, part of the molten solders SR1$b$ remain on the second pads P2, and the other part of the solders SR1$a$ are picked up with the second LED L2.

Figure 8C:
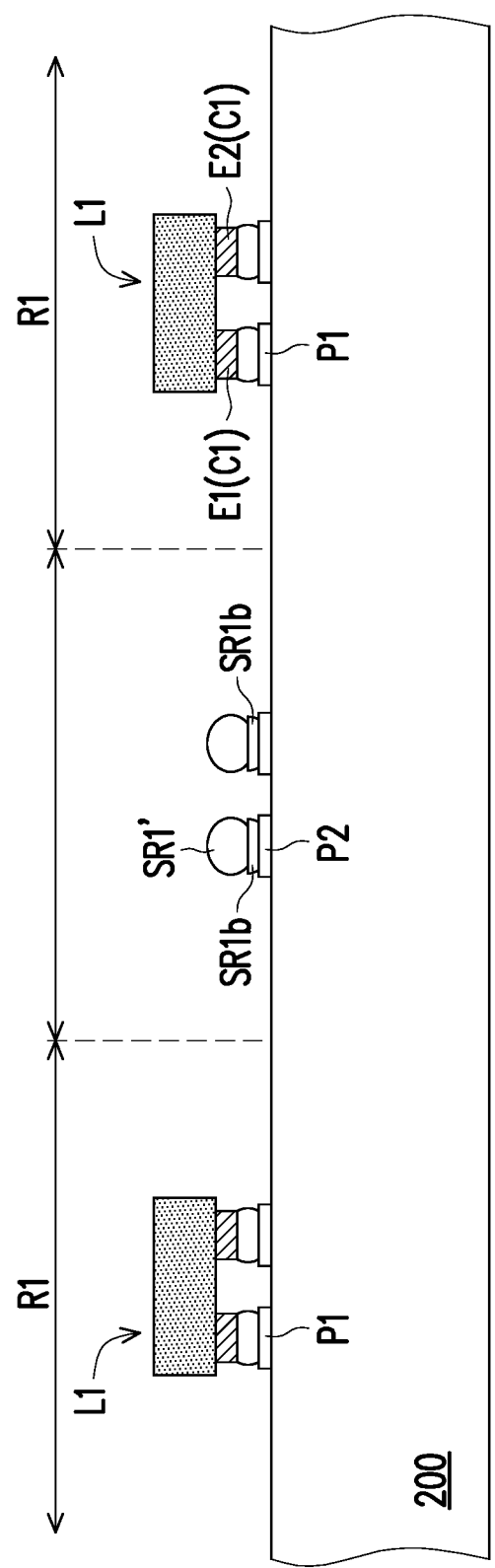

Referring to FIG. 8C, solders SR1' or conductive paste (not shown) are formed on the second pads P2 of the circuit substrate 200. In some embodiments, the method of forming the solders SR1' includes printing, evaporation, electroplating, or other suitable methods.

In this embodiment, the solders SR1' or conductive paste is formed on the solders SR1$b$, but the present invention is not limited thereto. In other embodiments, a redundancy pad (redundancy pad, not shown) for repair is disposed in each of the first placement regions R1 and the second placement regions R2, and the solders SR1' are formed on the redundancy pads.

Figure 8D:
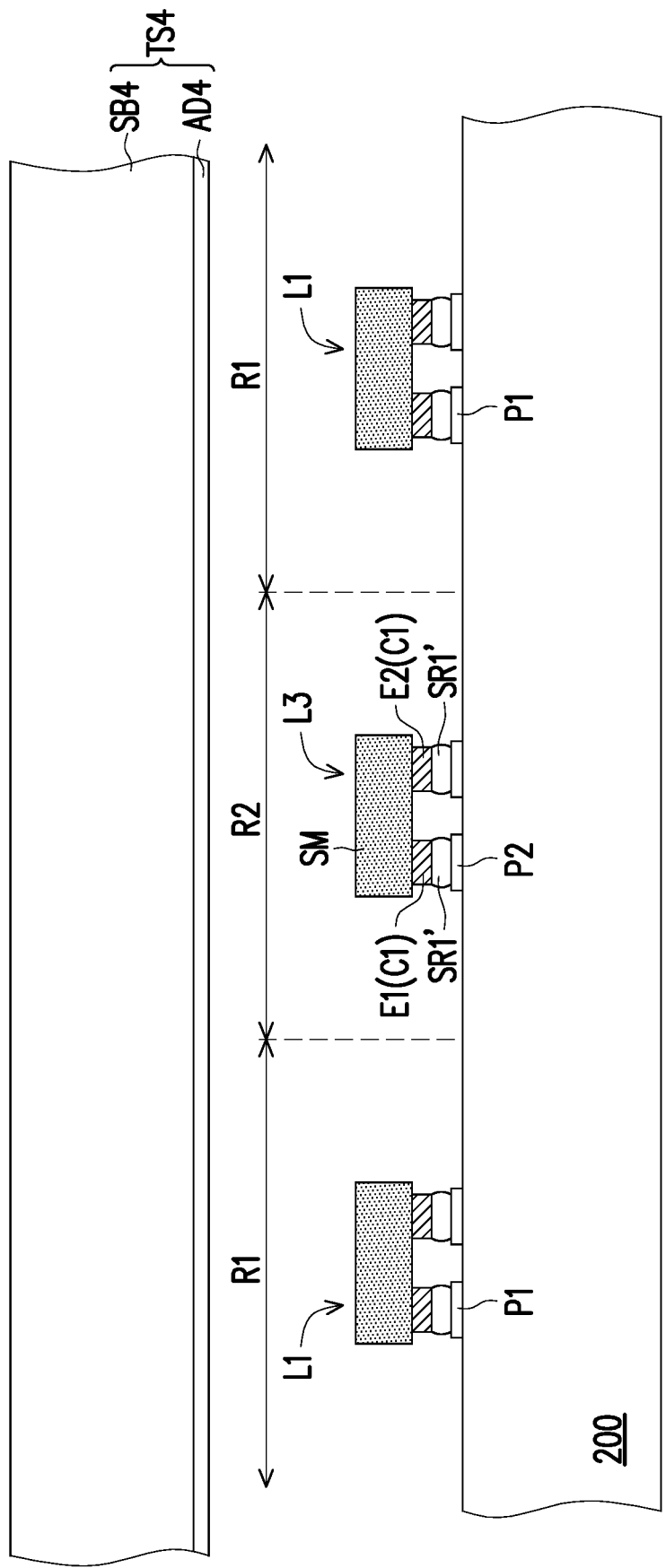

Referring to FIG. 8D, the third LEDs L3 are transferred to the circuit substrate 200. In this embodiment, the method of transferring the third LEDs L3 to the circuit substrate 200 is similar to that described in FIG. 7C to FIG. 7E, but the difference therebetween is that the third LEDs L3 in this embodiment does not include the metal layers SR.

The third LEDs L3 on the second transferring substrate TS4 are electrically connected to the circuit substrate 200. For example, the third LEDs L3 are heated so that the solders SR1' electrically connect the third LEDs L3 to the second pads P2 originally corresponding to the second LEDs L2. In some embodiments, the solders SR1' and the metal layers SR1$b$ remaining on the second pad P2 of the second LED L2 are fused with each other. In some embodiments, the second transferring substrate TS4 is heated so as to transfer heat to the third LEDs L3 or the third LEDs L3 are heated by a laser on one side of the second transferring substrate TS4. In some embodiments, the third LEDs L3 are heated to make the solders SR1' eutectic bonded with the electrodes E1 and E2 of the third LEDs L3.

In this embodiment, the third LEDs L3 are placed on the second pads P2 originally corresponding to the second LED L2, but the invention is not limited thereto. In other embodiments, the third LEDs L3 are placed on the redundancy pads in the second placement regions R2, and the third LEDs L3 are electrically connected to other components in the circuit substrate 200 through the redundancy pads.

In this embodiment, the solders SR1' or conductive paste are formed on the circuit substrate 200, but the invention is not limited thereto.

After electrically connecting the third LEDs L3 to the circuit substrate 200, the second transferring substrate TS4 is removed.

Figure 9A:
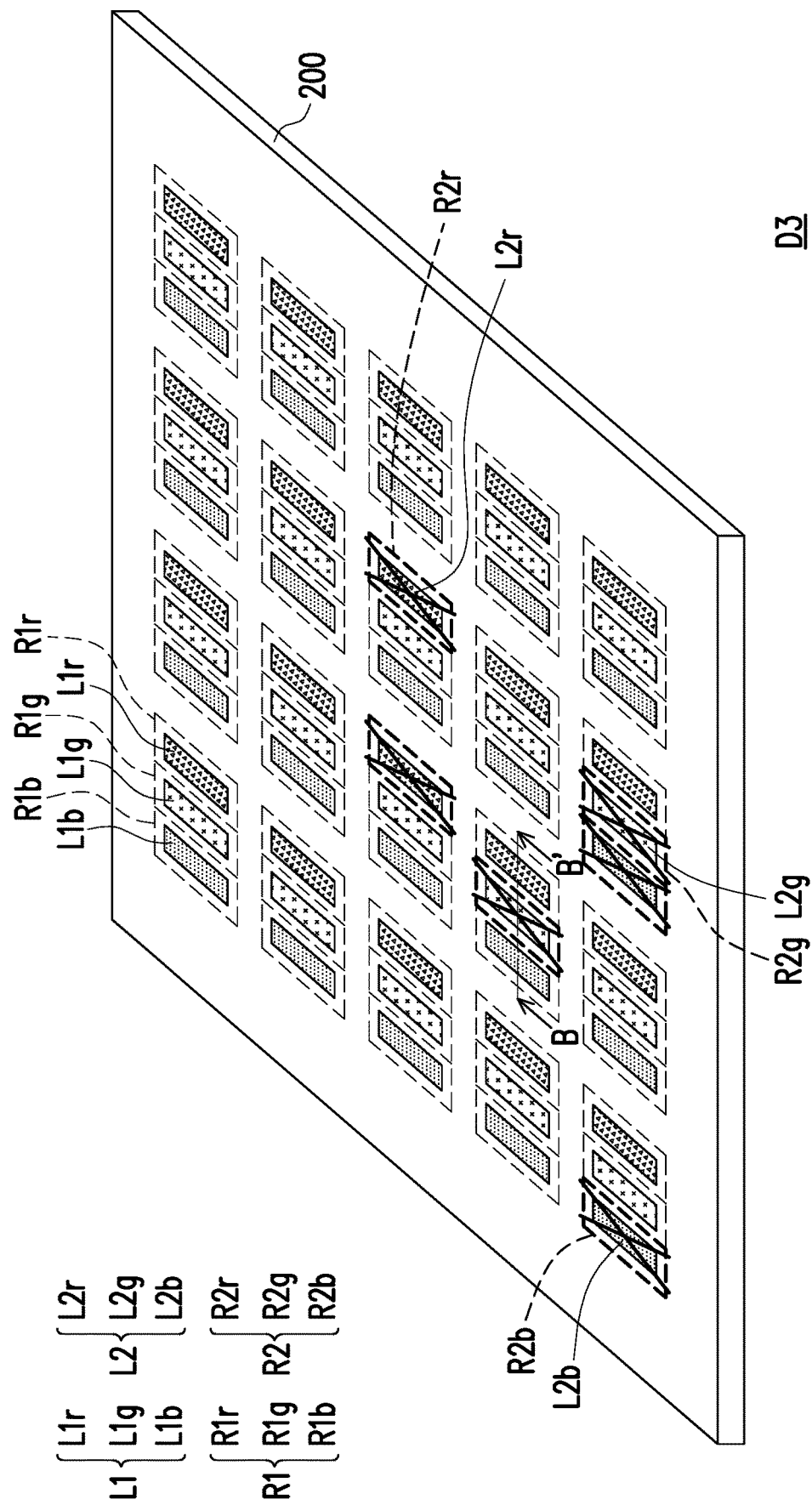
FIG. 9A to FIG. 9Q are schematic cross-sectional views of a method for repairing an LED display device according to an embodiment of the present invention.
Figure 9B:
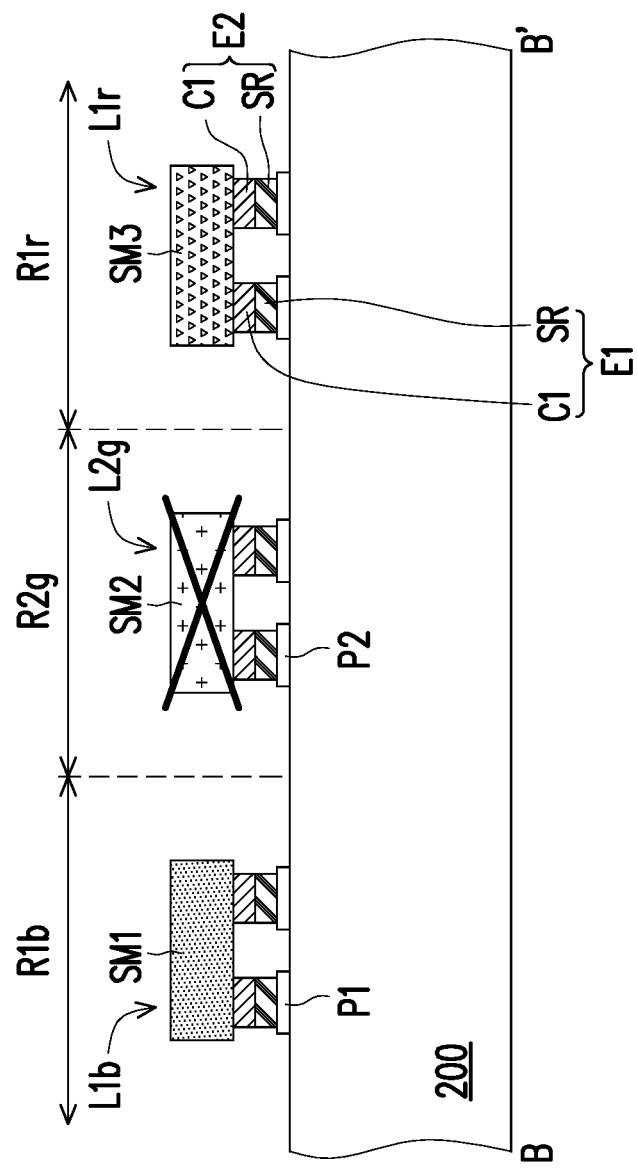
Figure 9C:
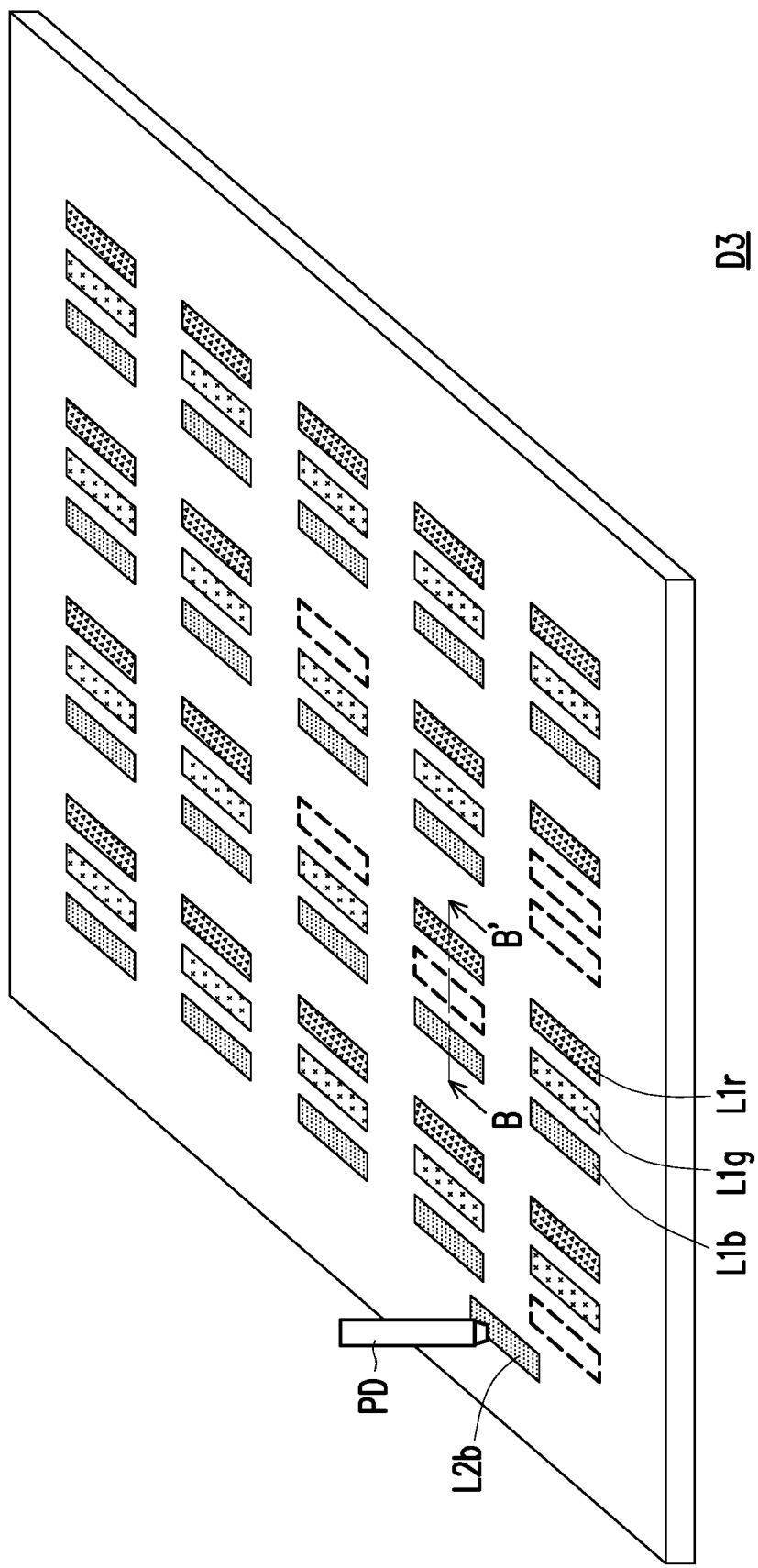
Figure 9D:
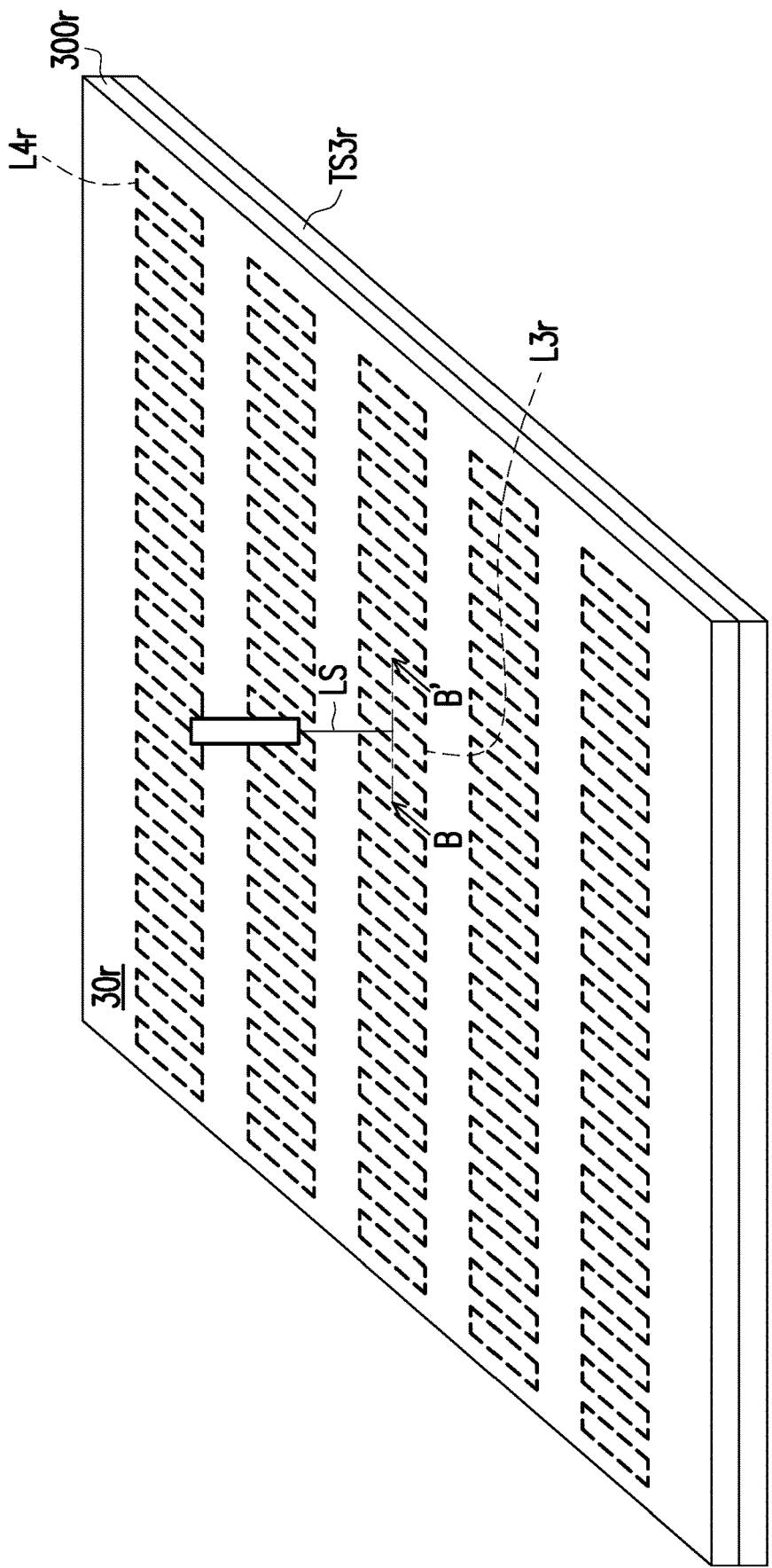
Figure 9F:
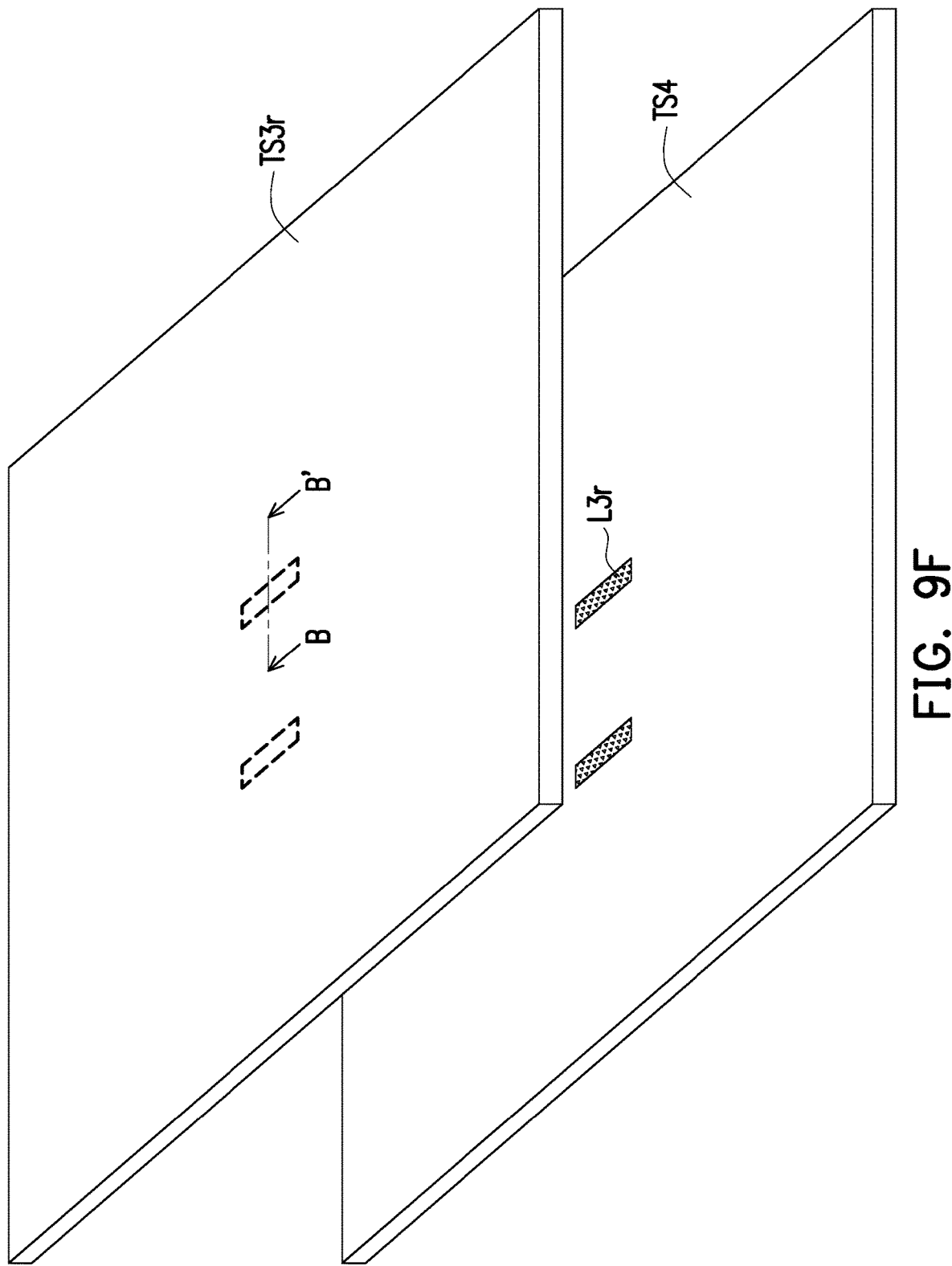
Figure 9G:
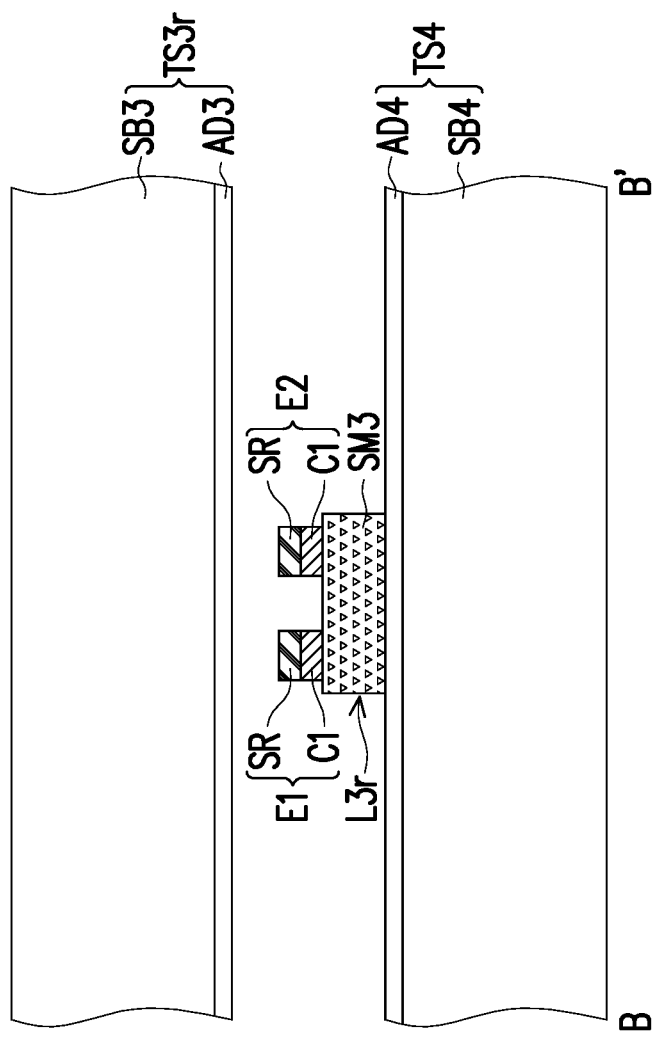
Figure 9H:
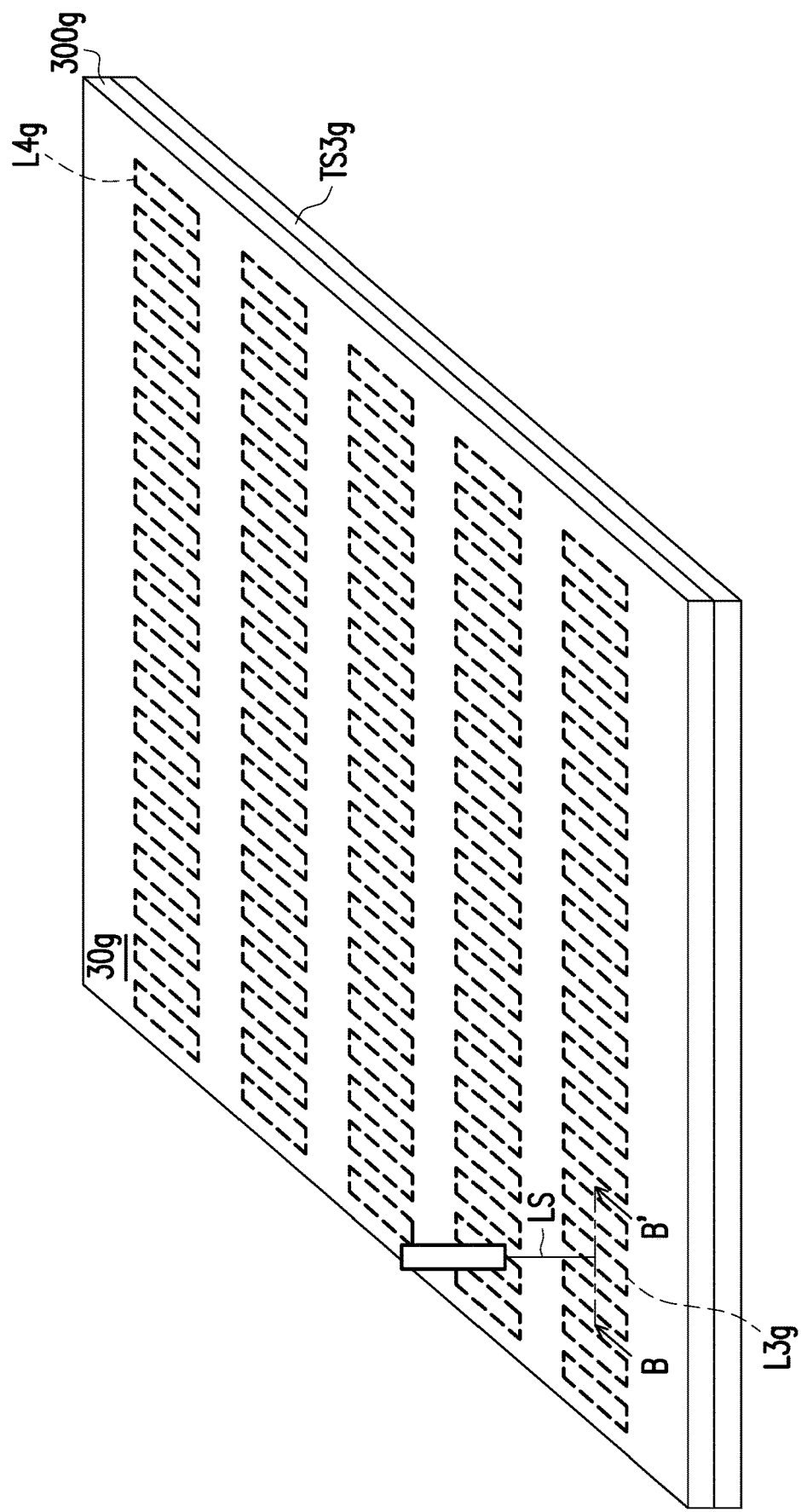
Figure 9I:
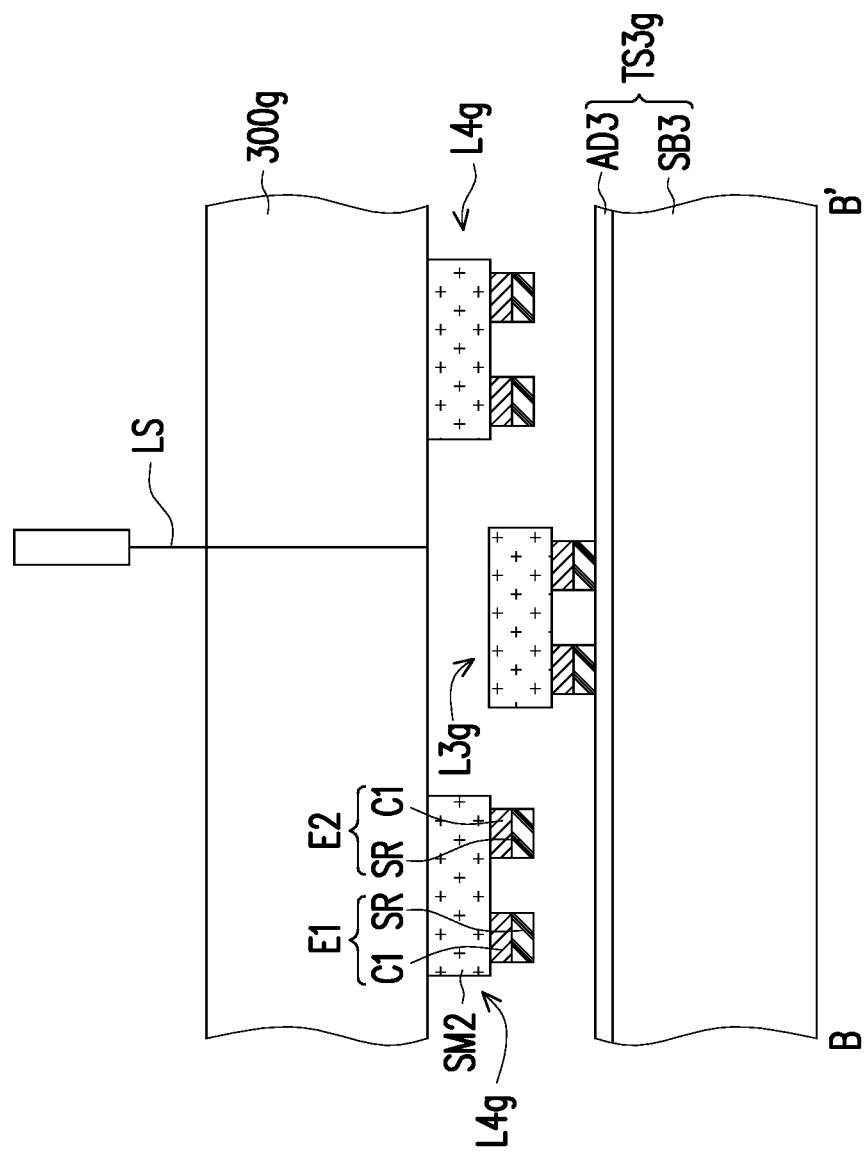
Figure 9J:
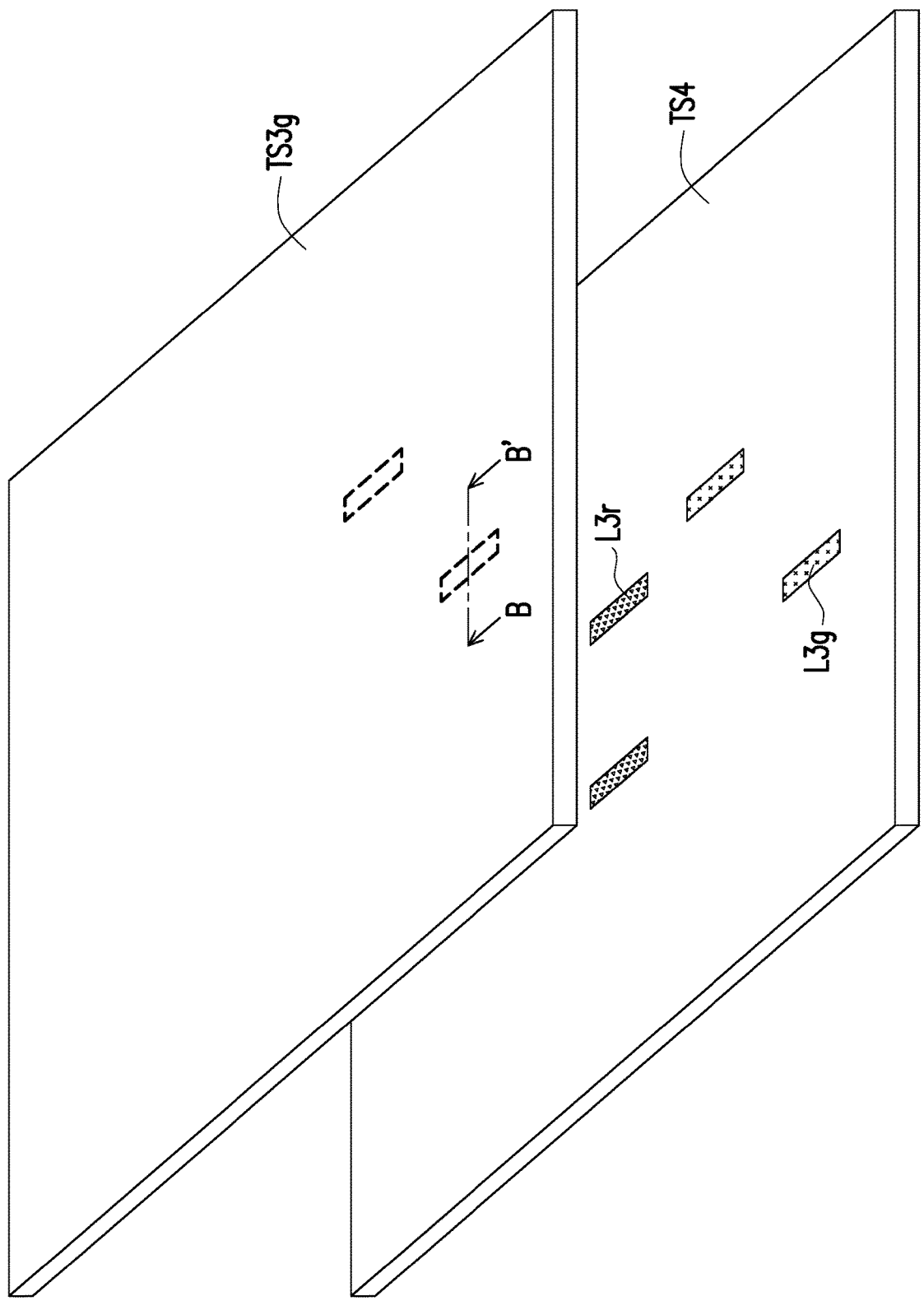
Figure 9L:
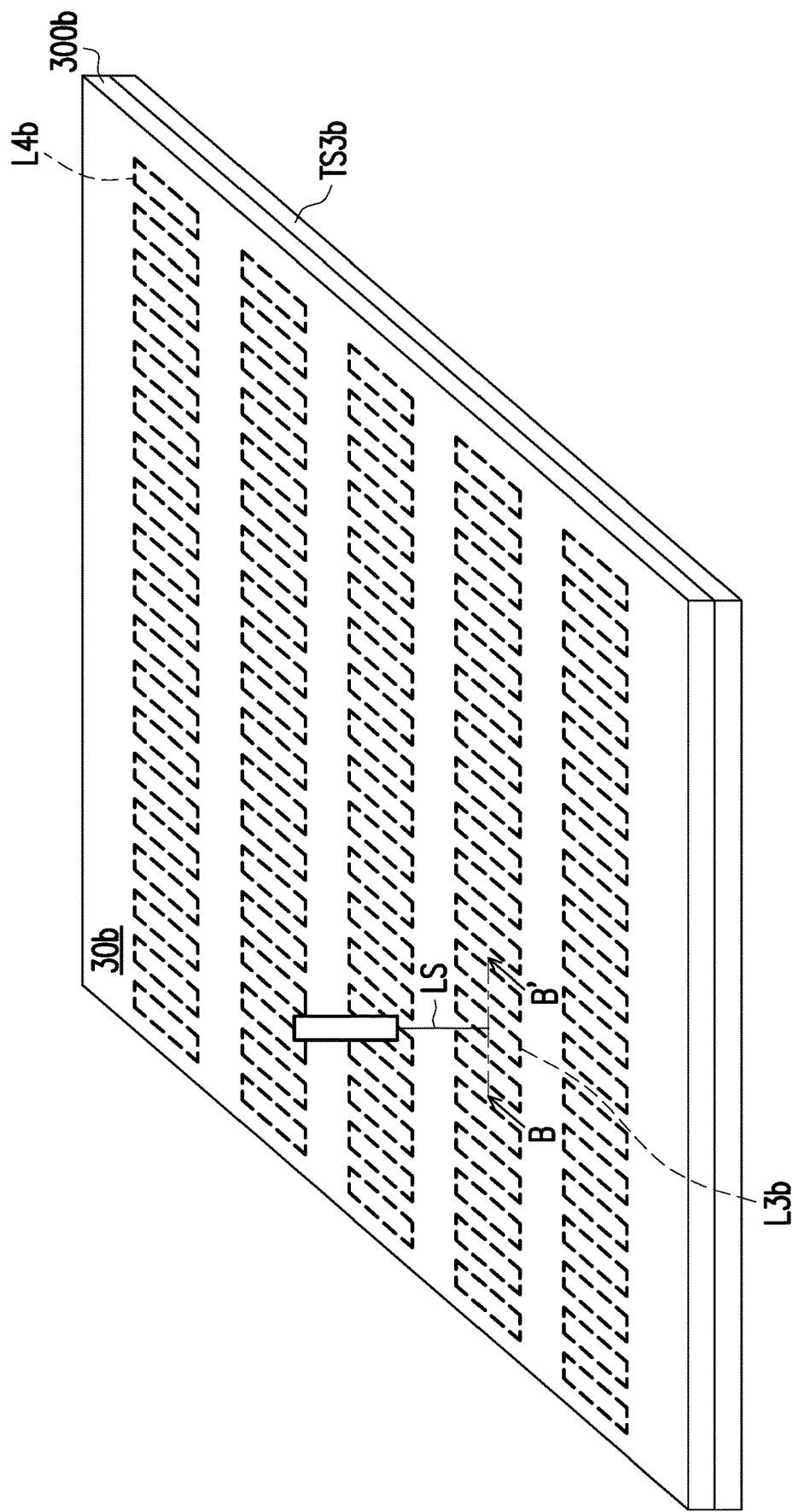
Figure 9M:
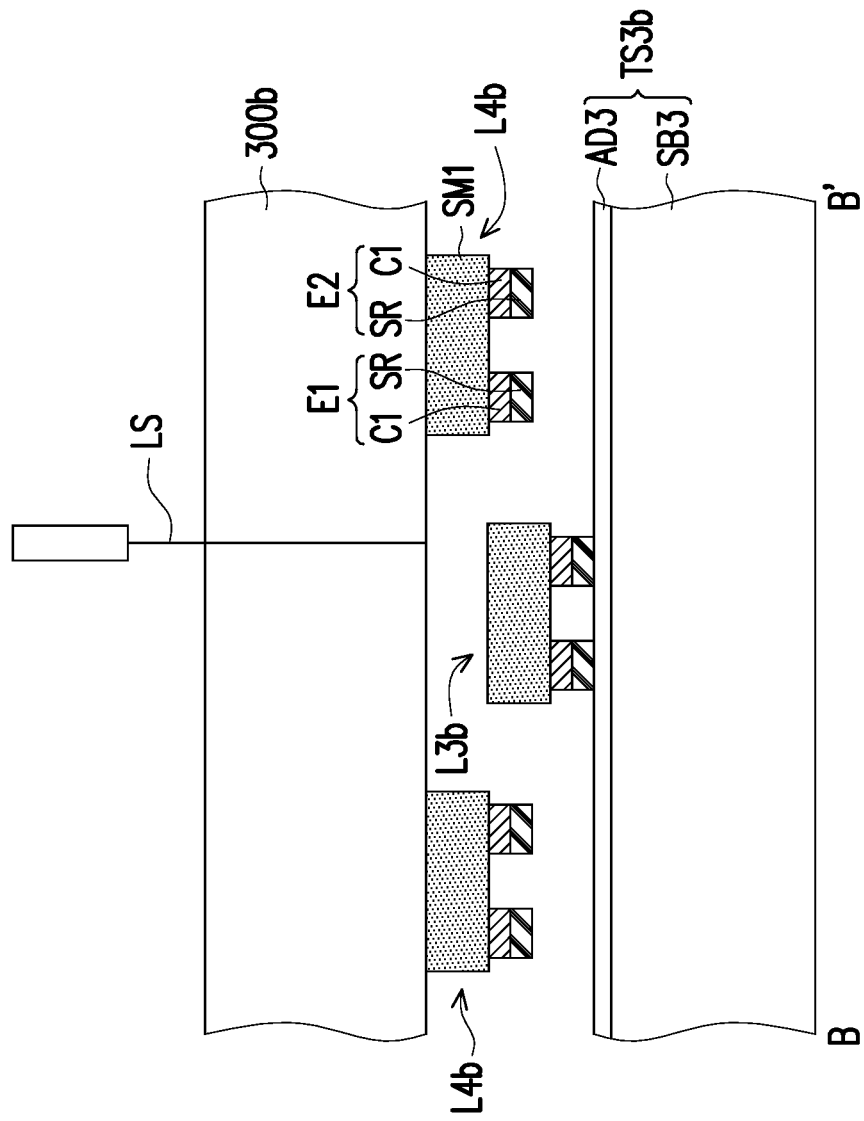
Figure 9N:
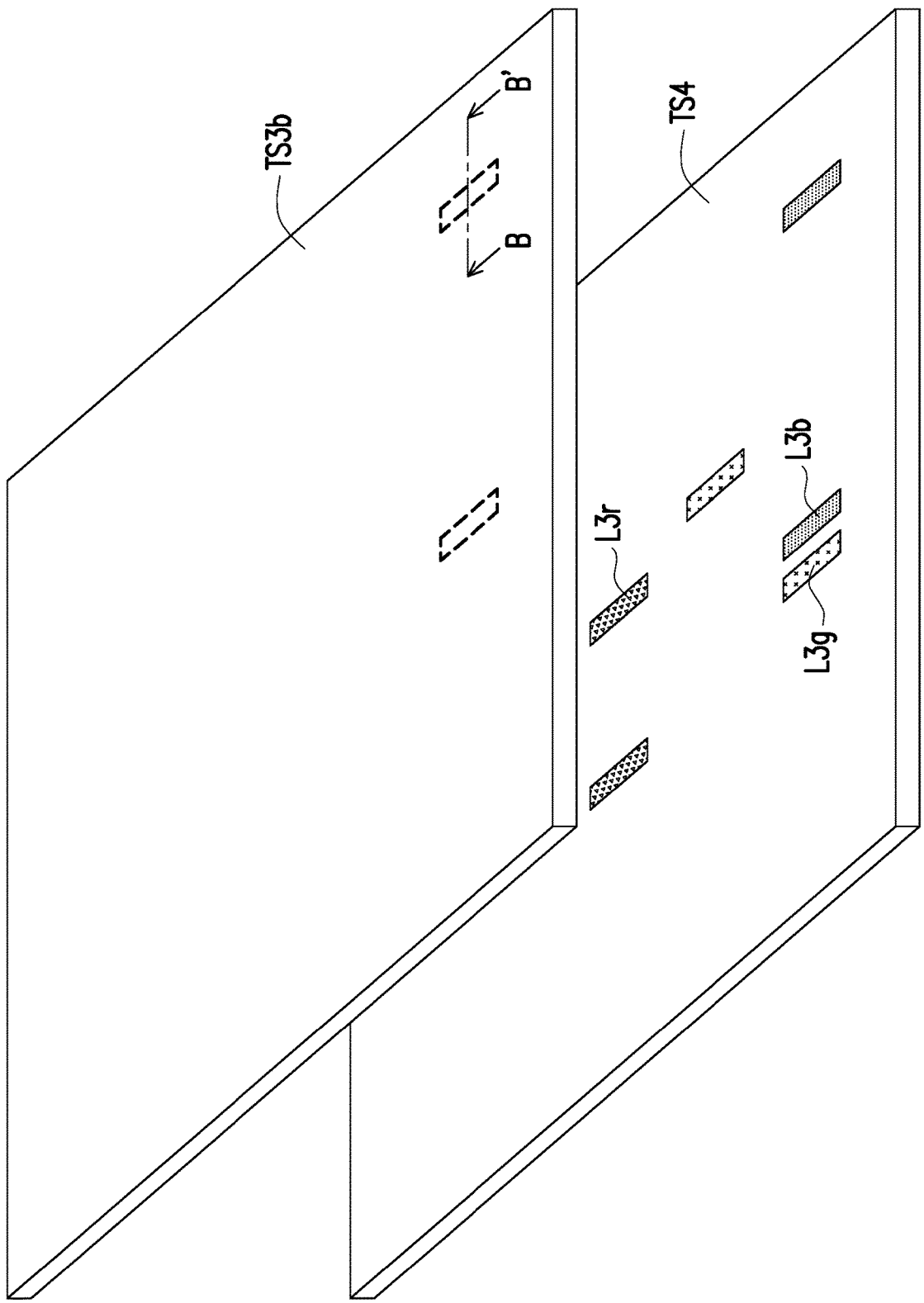
Figure 90:
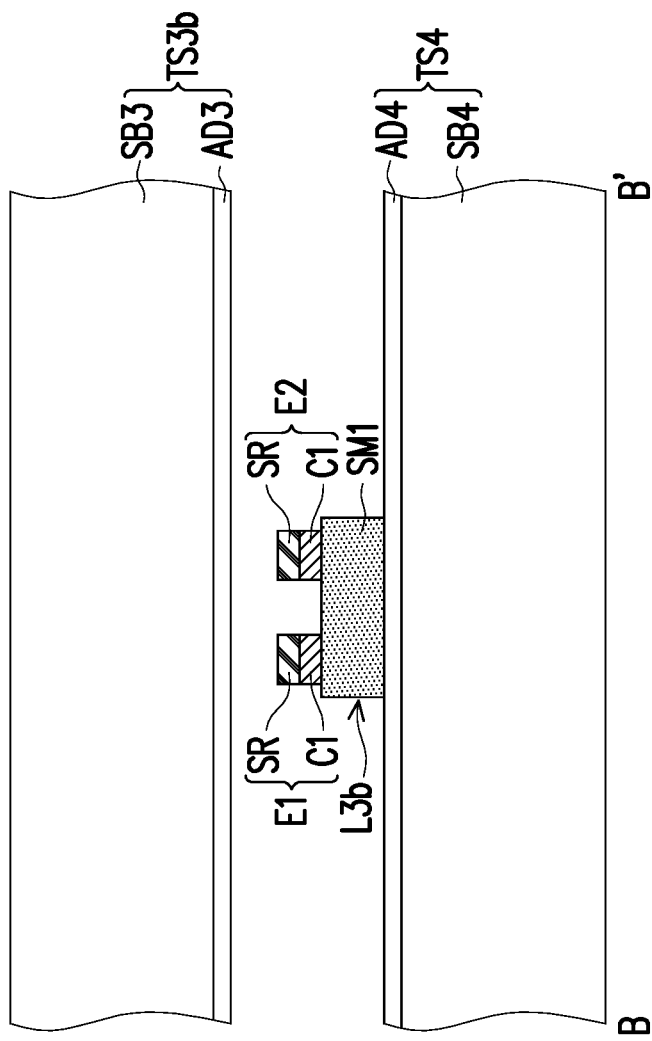
Figure 9P:
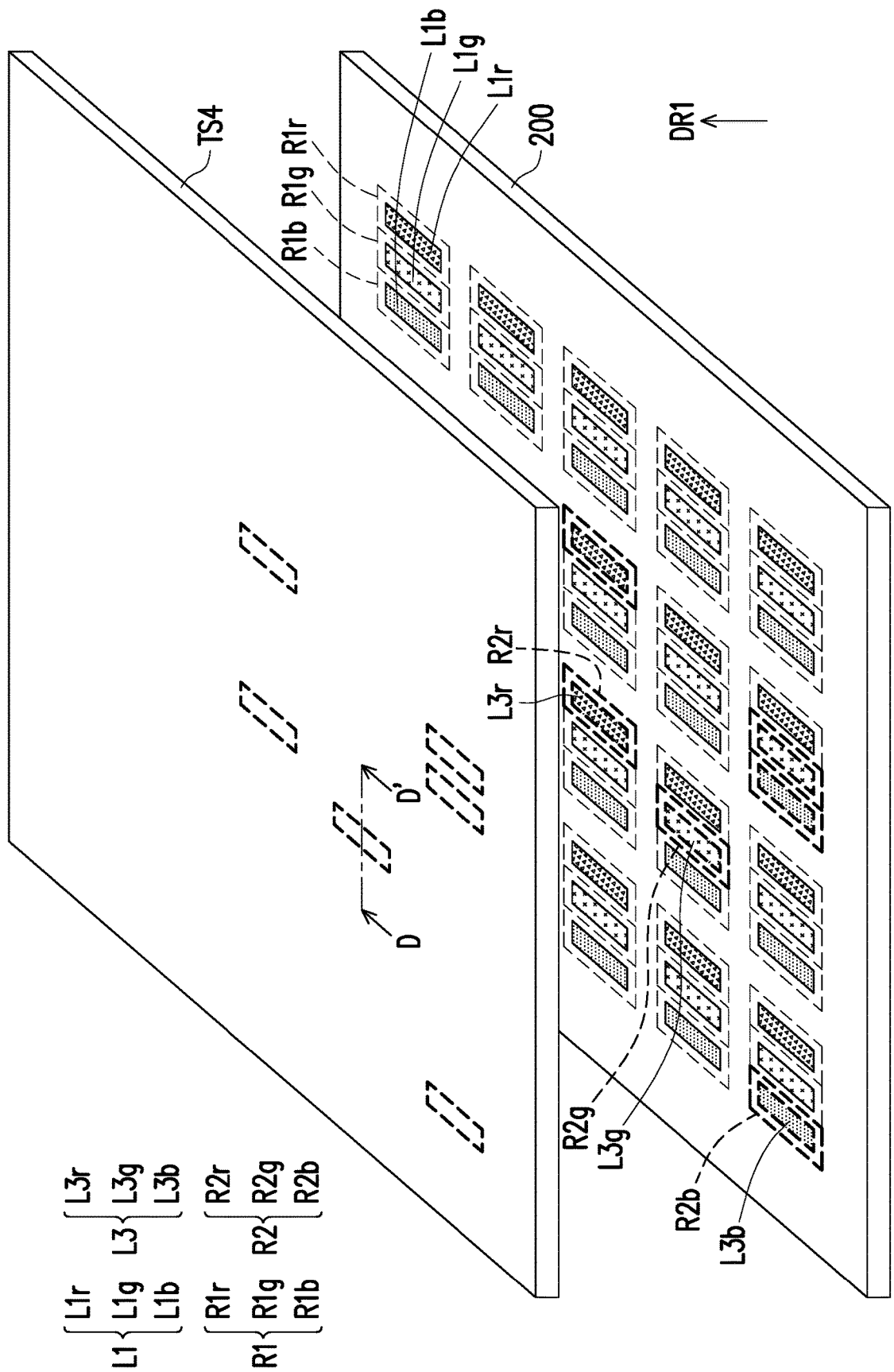
Figure 9Q:
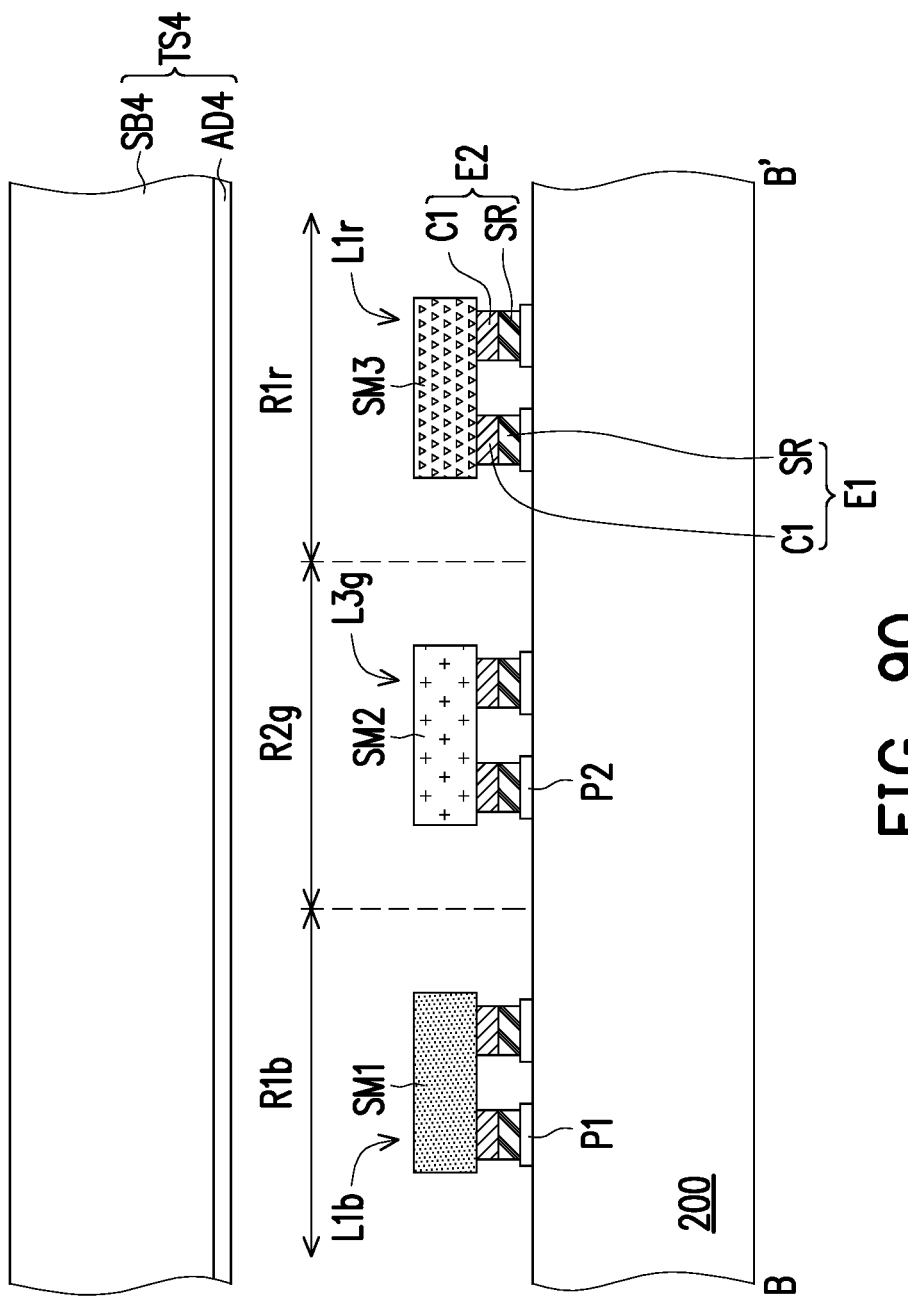

FIG. 9A to FIG. 9Q are schematic cross-sectional views of a method for repairing an LED display device according to an embodiment of the present invention.

FIG. 9B is a schematic cross-sectional view taken along line BB' of FIG. 9A. Referring to FIG. 9A and FIG. 9B, an LED display device D3 is provided. The LED display device D3 includes a circuit substrate 200, a plurality of first LEDs L1, and one or more second LEDs L2. The LED display device D3 is detected, wherein the second LED L2 cannot emit light normally.

In this embodiment, the first LEDs L1 include first red LEDs L1$r$, first green LEDs L1$g$, and first blue LEDs L1$b$. The first placement regions R1 include first red placement regions R1$r$, first green placement regions R1$g$, and first blue placement regions R1$b$. The first red LEDs L1$r$, the first green LEDs L1$g$, and the first blue LEDs L1$b$ are disposed corresponding to the first red placement regions R1r, the first green placement regions R1g, and the first blue placement regions R1b, respectively. In some embodiments, the first red LEDs L1r, the first green LEDs L1g, and the first blue LEDs L1b are electrically connected to the first pads P1 in the first red placement regions R1r, the first green placement regions Rig, and the first blue placement regions Rib, respectively.

In this embodiment, the second LEDs L2 include second red LEDs L2r, second green LEDs L2g, and second blue LEDs L2b. The second placement regions R2 include second red placement regions R2r, second green placement regions R2g, and second blue placement regions R2b. The second red LEDs L2r, the second green LEDs L2g, and the second blue LEDs L2b are disposed corresponding to the second red placement regions R2r, the second green placement regions R2g, and the second blue placement regions R2b, respectively.

In this embodiment, the method of transferring the first LEDs L1 and the second LEDs L2 to the circuit substrate 200 can refer to any of the foregoing embodiments, and will not be repeated here. In this embodiment, LEDs of different colors are formed on different growth substrates, and then transferred to the circuit substrate 200 respectively.

Referring to FIG. 9C, the second red LEDs L2r, the second green LEDs L2g, and the second blue LEDs L2b are removed from the circuit substrate 200. For example, the second red LEDs L2r, the second green LEDs L2g, and the second blue LEDs L2b are removed from the circuit substrate 200 by the removal the module PD. The removal module PD is a stickiness tip, a vacuum nozzle, a laser module or any kind of removal machine.

In some embodiments, after the second LEDs L2 are removed from the circuit substrate 200, the metal layer of the second LEDs L2 remain on the second pads P2 of the circuit substrate 200.

Referring to FIG. 9D to FIG. 9O, a plurality of LED substrates are provided, and each of the LED substrates includes at least one third LED. In this embodiment, the multiple LED substrates include a red LED substrate 30r, a green LED substrate 30g, and a blue LED substrate 30b. The red LED substrate 30r includes the third red LEDs L3r. The green LED substrate 30g includes the third green LEDs L3g. The blue LED substrate 30b includes the third blue LEDs L3b.

A plurality of first transferring substrates are provided. Based on the position of the second placement regions R2, the third LEDs of each of the LED substrates are respectively transferred to a corresponding one of the first transferring substrates. The third LEDs on each of the first transferring substrates are transferred to the second transferring substrate TS4. In this embodiment, the first transferring substrates include a red transferring substrate TS3r, a green transferring substrate TS3g, and a blue transferring substrate TS3b.

FIG. 9E is a schematic cross-sectional view taken along the line BB' of FIG. 9D. Referring to FIG. 9E and FIG. 9D, the red LED substrate 30r includes a growth substrate 300r and third red LEDs L3r located on the growth substrate 300r. Based on the positions of the second red placement regions R2r, the third red LEDs L3r of the red LED substrate 30r is transferred to the red transferring substrate TS3r. In some embodiments, the red transferring substrate TS3r includes a substrate SB3 and an adhesion layer AD3 on the substrate SB3.

In some embodiments, the method of transferring the third red LED L3r of the red LED substrate 30r to the red transferring substrate TS3r includes laser lift off. In some embodiments, the red LED substrate 30r further includes a plurality of fourth red LEDs L4r located on the growth substrate 300r. After the third red LEDs L3r are transferred to the red transferring substrate TS3r, the fourth red LEDs L4r remain on the growth substrate 300r. In other words, the required third red LEDs L3r are transferred to the red transferring substrate TS3r by a laser. In this embodiment, both of the third red LEDs L3r and the fourth red LEDs L4r include a semiconductor stacked layer SM3 and electrodes E1 and E2 located on the semiconductor stacked layer SM3.

FIG. 9G is a schematic cross-sectional view taken along line BB' of FIG. 9F. Referring to FIG. 9F and FIG. 9G, the third red LEDs L3r are transferred on the red transferring substrate TS3r to the second transferring substrate TS4.

FIG. 9I is a schematic cross-sectional view taken along the line BB' of FIG. 9H. Referring to FIG. 9H and FIG. 9I, the green LED substrate 30g includes a growth substrate 300g and third green LEDs L3g located on the growth substrate 300g. Based on the positions of the second green placement regions R2g, the third green LEDs L3g of the green LED substrate 30g is transferred to the green transferring substrate TS3g.

In some embodiments, the method of transferring the third green LEDs L3g of the green LED substrate 30g to the green transferring substrate TS3g includes laser lift off. In some embodiments, the green LED substrate 30g further includes a plurality of fourth green LEDs L4g located on the growth substrate 300g. After the third green LEDs L3g are transferred to the red transferring substrate TS3g, the fourth green LEDs L4g remain on the growth substrate 300g. In other words, the required third green LEDs L3g are transferred to the green transferring substrate TS3g by a lase. In this embodiment, both of the third green LEDs L3g and the fourth green LEDs L4g include the semiconductor stacked layer SM2 and the electrodes E1 and E2 located on the semiconductor stacked layer SM2.

FIG. 9K is a schematic cross-sectional view taken along line BB' of FIG. 9J. Referring to FIG. 9J and FIG. 9K, the third green LEDs L3g on the green transferring substrate TS3g are transferred to the second transferring substrate TS4.

FIG. 9M is a schematic cross-sectional view taken along the line BB' of FIG. 9L. Referring to FIG. 9L and FIG. 9M, the blue LED substrate 30b includes a growth substrate 300b and third blue LEDs L3b located on the growth substrate 300b. Based on the positions of the second blue placement regions R2b, the third blue LEDs L3b of the blue LED substrate 30b are transferred to the blue transferring substrate TS3b.

In some embodiments, the method of transferring the third blue LEDs L3b of the blue LED substrate 30b to the blue transferring substrate TS3b includes laser lift off. In some embodiments, the blue LED substrate 30b further includes a plurality of fourth blue LEDs L4b located on the growth substrate 300b. After transferring the third blue LEDs L3b to the blue transferring substrate TS3b, the fourth blue LEDs L4b remain on the growth substrate 300b. In other words, the required third blue LEDs L3b are transferred to the blue transferring substrate TS3b by laser. In this embodiment, both of the third blue LEDs L3b and the fourth blue LEDs L4b include the semiconductor stacked layer SM1 and the electrodes E1 and E2 located on the semiconductor stacked layer SM1.

FIG. 9O is a schematic cross-sectional view taken along line BB' of FIG. 9N. Referring to FIG. 9N and FIG. 9O, the third blue LEDs L3*b* on the blue transferring substrate TS3*b* are transferred to the second transferring substrate TS4.

FIG. 9Q is a schematic cross-sectional view taken along line BB' of FIG. 9P. Referring to FIG. 9P and FIG. 9Q, the second transferring substrate TS4 is overlapped with the circuit substrate 200. The third red LEDs L3*r*, the third green LEDs L3*g*, and the third blue LEDs L3*b* are located on the side of the second transferring substrate TS4 facing the circuit substrate 200. The positions of the third red LEDs L3*r*, the third green LEDs L3*g*, and the third blue LEDs L3*b* overlap the second red placement regions R2*r*, the second green placement regions R2*g*, and the second blue placement regions R2*b*, respectively.

The third red LEDs L3*r*, the third green LEDs L3*g*, and the third blue LEDs L3*b* on the second transferring substrate TS4 are electrically connected to the circuit substrate 200. For example, the third red LEDs L3*r*, the third green LEDs L3*g*, and the third blue LED L3*b* are heated so that the metal layers SR of the third red LEDs L3*r*, the third green LEDs L3*g*, and the third blue LEDs L3*b* are electrically connected to the second pads P2 originally corresponding to the second LEDs L2.

In other embodiments, the third red LEDs L3*r*, the third green LEDs L3*g*, and the third blue LEDs L3*b* do not include the metal layer SR. Therefore, before electrically connecting the third red LEDs L3*r*, the third green LEDs L3*g*, and the third blue LEDs L3*b* to the circuit substrate 200, solders or conductive paste are formed on the third red LEDs L3*r*, the third green LEDs L3*g*, and the third blue LEDs L3*b* or on the circuit substrate 200, and then the third red LEDs L3*r*, the third green LEDs L3*g*, and the third blue LEDs L3*b* are electrically connected to the circuit substrate 200.

In this embodiment, the third red LEDs L3*r*, the third green LEDs L3*g*, and the third blue LEDs L3*b* are placed on the second pads P2 originally corresponding to the second red LEDs L2*r*, second green LEDs L2*g*, and second blue LEDs L2*b*, respectively, but the invention is not limited thereto. In other embodiments, a redundancy pad (not shown) for repair is disposed in each of the first placement regions R1 and each of the second placement regions R2, and the third red LEDs L3*r*, the third green LEDs L3*g* and the third blue LEDs L3*b* are placed on the redundancy pads, and the third red LEDs L3*r*, the third green LEDs L3*g*, and the third blue LEDs L3*b* are electrically connected to other components in the circuit substrate 200 through the redundancy pads.

After electrically connecting the third red LEDs L3*r*, the third green LEDs L3*g*, and the third blue LEDs L3*b* to the circuit substrate 200, the second transferring substrate TS4 is removed.

In this embodiment, the second transferring substrate TS4 is used to transfer LEDs of different colors to the circuit substrate 200 at the same time, thereby, the LEDs of different colors can be repaired at the same time to reduce the time and cost required for the repair process.

FIG. 10A to FIG. 10G are schematic top views of a method of transferring LEDs according to an embodiment of the present invention. FIG. 11A to FIG. 11G are schematic cross-sectional top views taken along the line a-a' in FIG. 10A to FIG. 10G, respectively. For example, FIG. 10A to FIG. 10G and FIG. 11A to FIG. 11G can be applied to the method of transferring the LEDs from the growth substrate to the first transferring substrate in any of the foregoing embodiments.

Figure 10A:
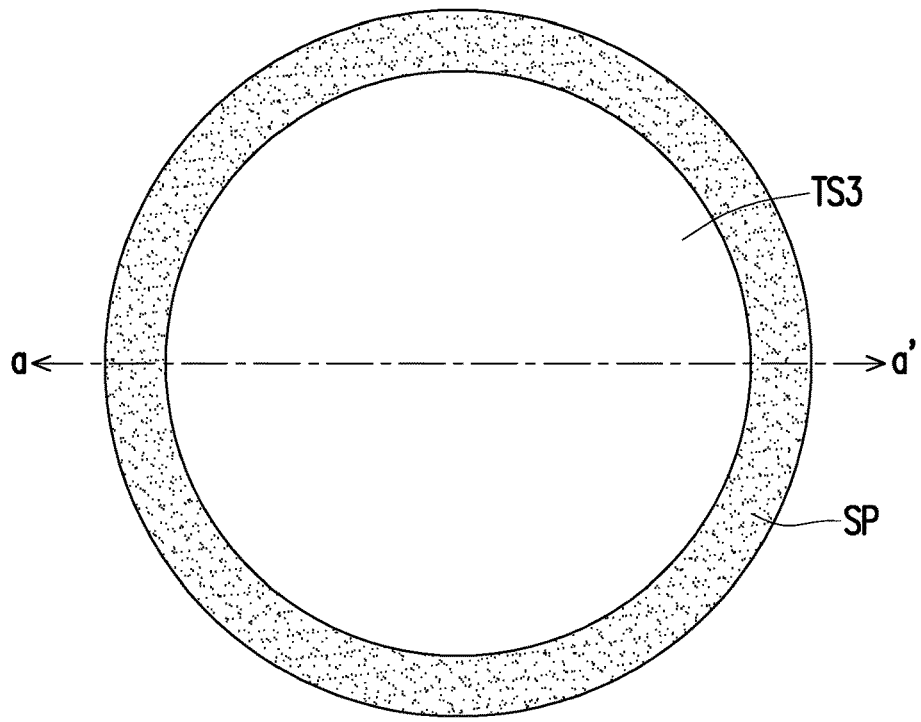
FIG. 10A to FIG. 10F are schematic top views of a method of transferring LEDs according to an embodiment of the present invention.
Figure 11A:
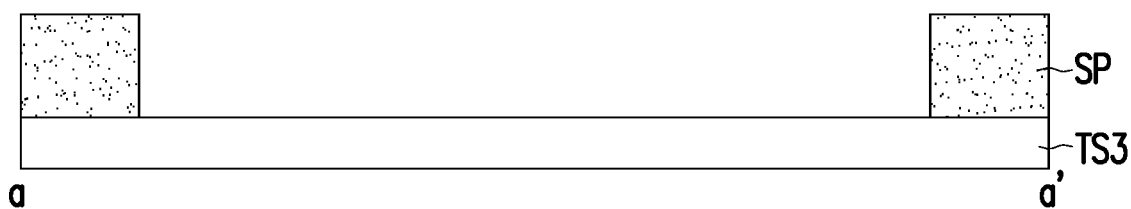
FIG. 11A to FIG. 11F are schematic cross-sectional top views taken along the line a-a' in FIG. 10A to FIG. 10F, respectively.

Referring to FIG. 10A and FIG. 11A, a first transferring substrate TS3 and a support structure SP are provided. The support structure SP is used to fix the first transferring substrate TS3. In this embodiment, the first transferring substrate TS3 includes a single layer or multiple layers of flexible materials. In this embodiment, at least the surface facing upwardly of the first transferring substrate TS3 has stickiness. In some embodiments, the first transferring substrate TS3 is adhered to the support structure SP. In some embodiments, the support structure SP is an outer frame capable of fixing the first transferring substrate TS3.

Figure 10B:
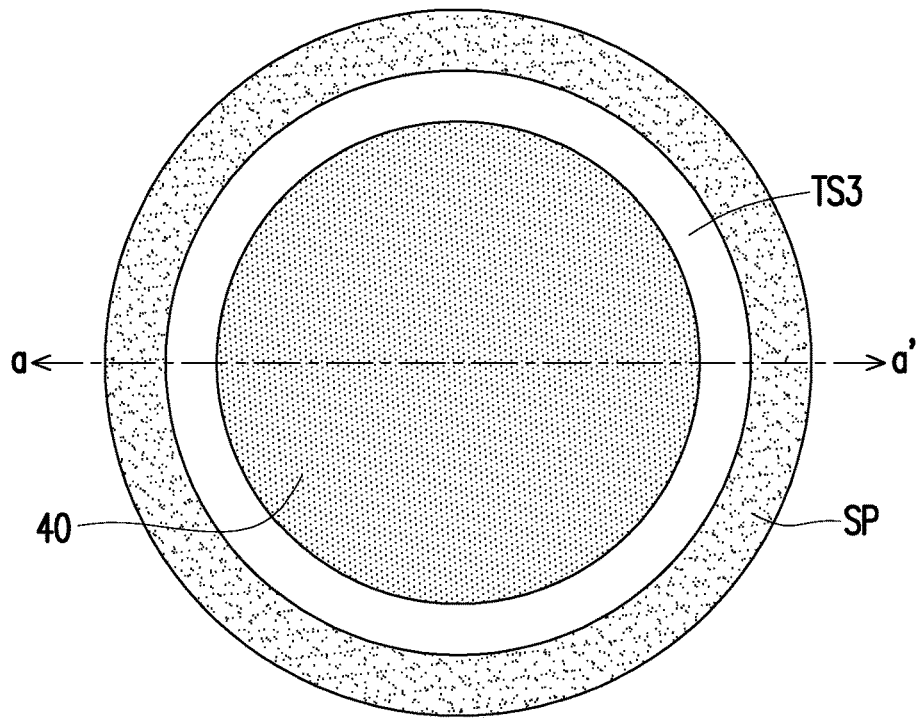
Figure 11B:
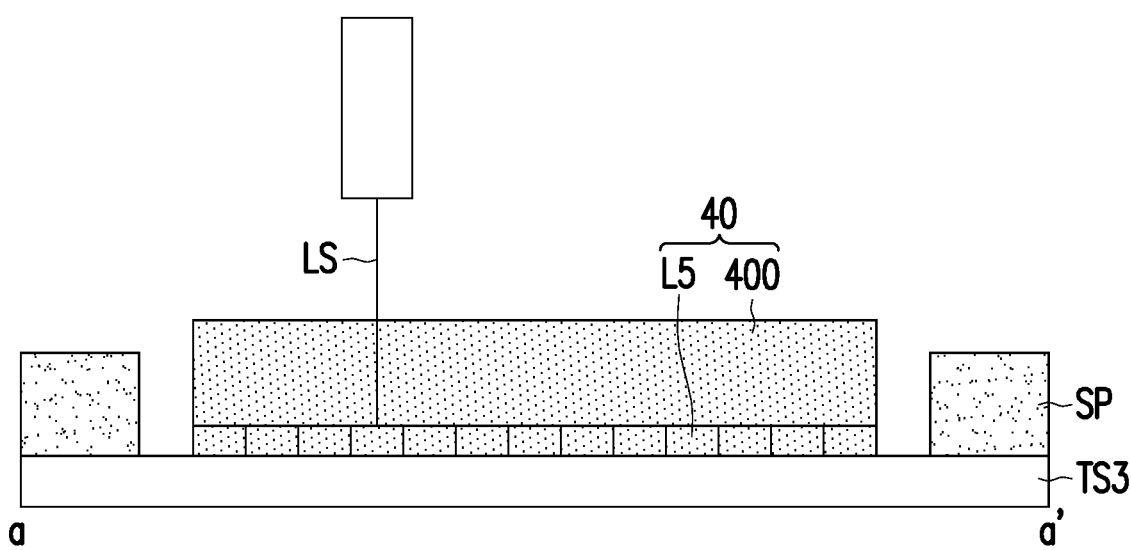

Referring to FIG. 10B and FIG. 11B, the LEDs L5 of the LED substrate 40 are transferred to the first transferring substrate TS3. The support structure SP is located around the LED substrate 40.

In this embodiment, the LED substrate 40 includes a growth substrate 400 and an LEDs L5 formed on the growth substrate 400. The LED substrate 40 is overlapped with the first transferring substrate TS3, wherein the LEDs L5 are located between the growth substrate 400 and the first transferring substrate TS3. Then, the selected LEDs L5 are removed from the growth substrate 400 by laser LS, and the selected LEDs L5 are fixed on the first transferring substrate TS3. In this embodiment, the LEDs L5 includes a semiconductor stacked layer and electrodes formed on the semiconductor stacked layer. The electrodes are located on the side of the semiconductor stacked layer facing the first transferring substrate TS3.

In this embodiment, the LEDs L5 are removed from the growth substrate 400 by laser LS based on the predetermined pitch of the LEDs L5 after being transferred to the circuit substrate. In other words, the pitch of the LEDs L5 is adjusted on the first transferring substrate TS3, so there is no need to change the pitch of the LEDs L5 in the subsequent transferring process.

In this embodiment, the flexible first transferring substrate TS3 is bonded to the hard LED substrate 40, which can prevent the LED substrate 40 from being too warped and affecting the yield of the laser lift off process.

Figure 10C:
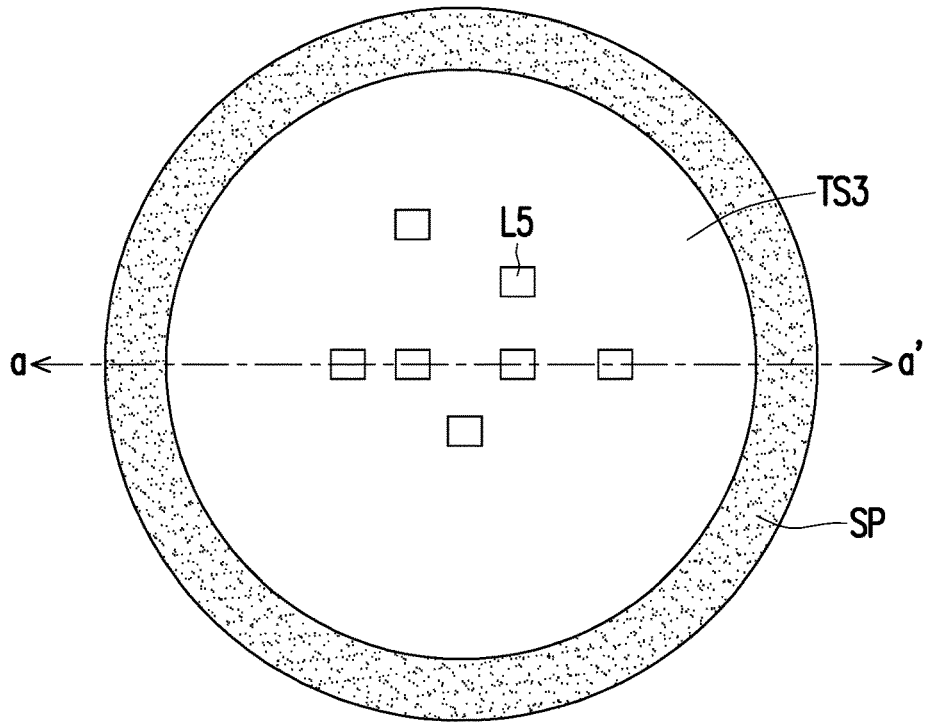
Figure 11C:
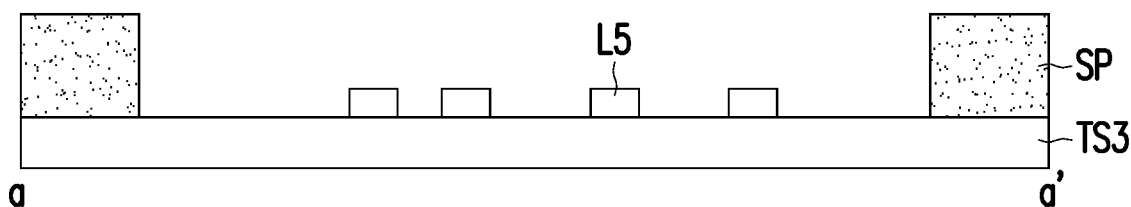

Referring to FIG. 10C and FIG. 11C, the growth substrate 400 and the LEDs L5 that has not been picked up from the growth substrate 400 are removed.

Figure 10D:
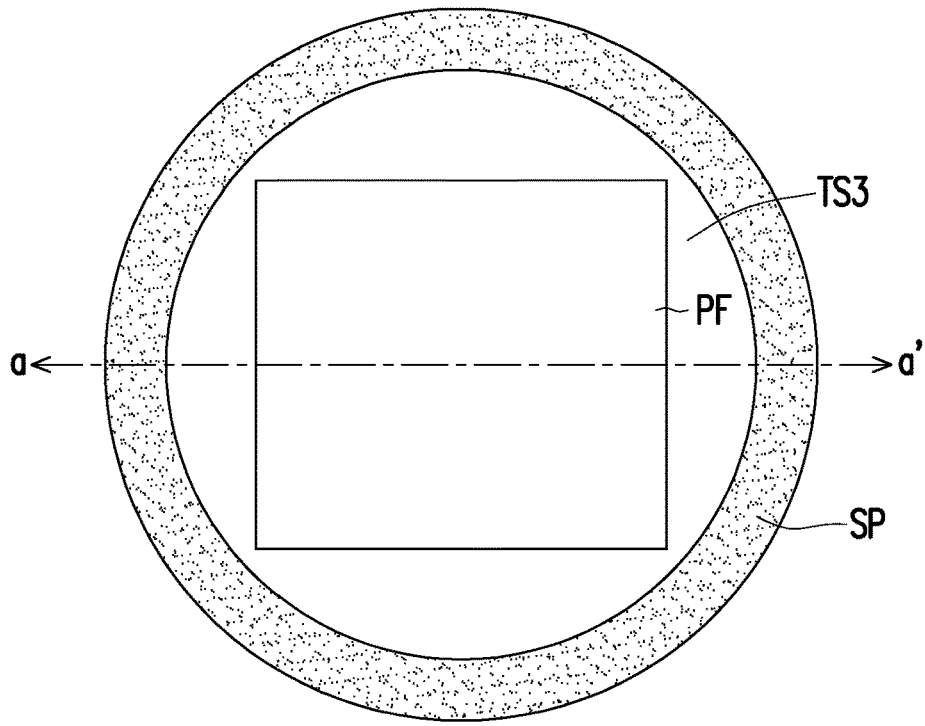
Figure 11D:
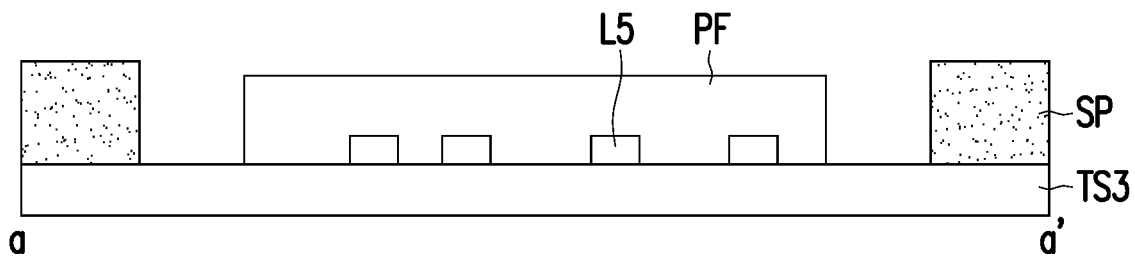

Referring to FIG. 10D and FIG. 11D, the overcoat PF is selectively covering the LEDs L5 on the first transferring substrate TS3. The support structure SP is removed from the first transferring substrate TS3.

Figure 10E:
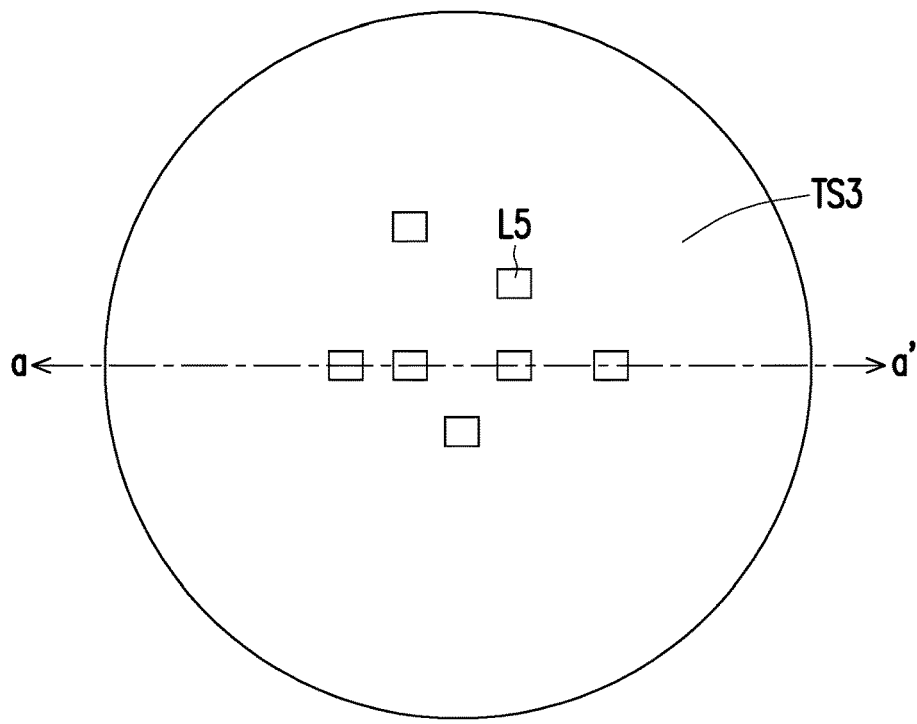
Figure 11E:
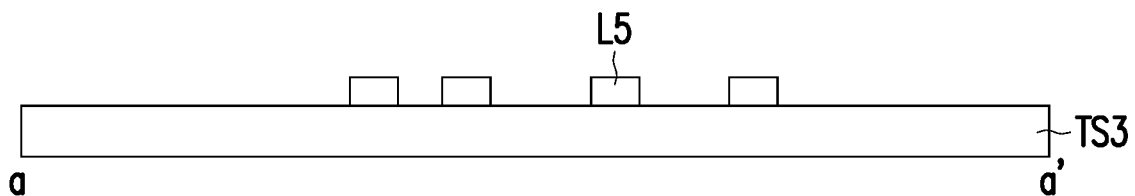

Referring to FIG. 10E and FIG. 11E, ultraviolet light is irradiating to the transferring substrate TS3 to reduce the stickiness of the transferring substrate TS3, and then the support structure SP is removed. In some embodiments, the overcoat PF is suitable for fixing the LEDs L5 during the process of removing the support structure SP, so that the LEDs L5 will not be damaged or difficult to transfer during the process of removing the support structure SP. After removing the support structure SP, the overcoat PF is removed from the LEDs L5. In some embodiments, the overcoat PF includes a material having a stickiness less than the transferring substrate TS3 or the overcoat PF includes a material without stickiness.

Figure 10F:
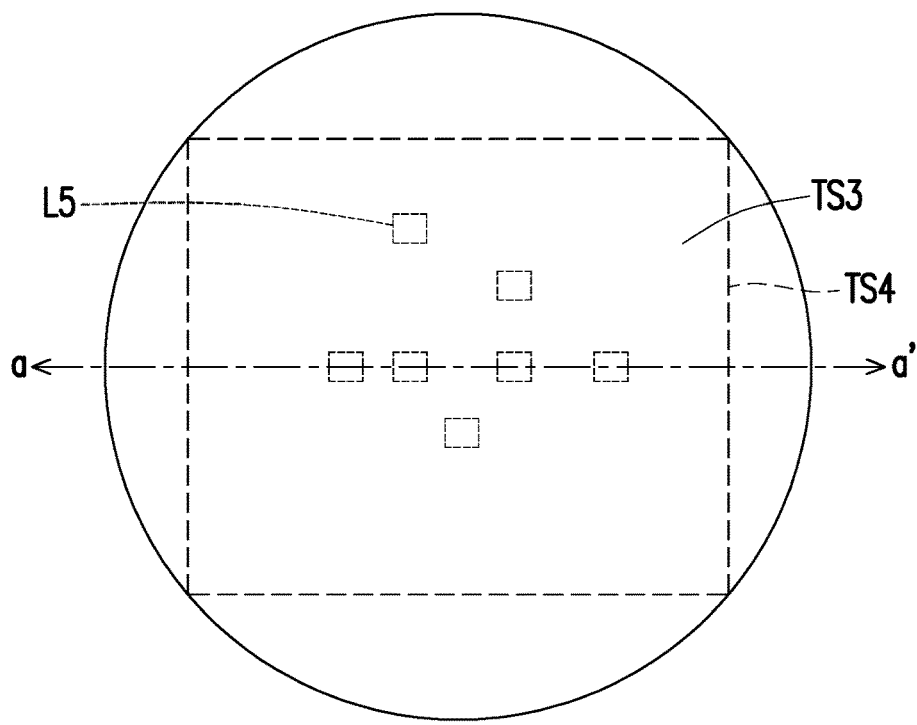
Figure 11F:
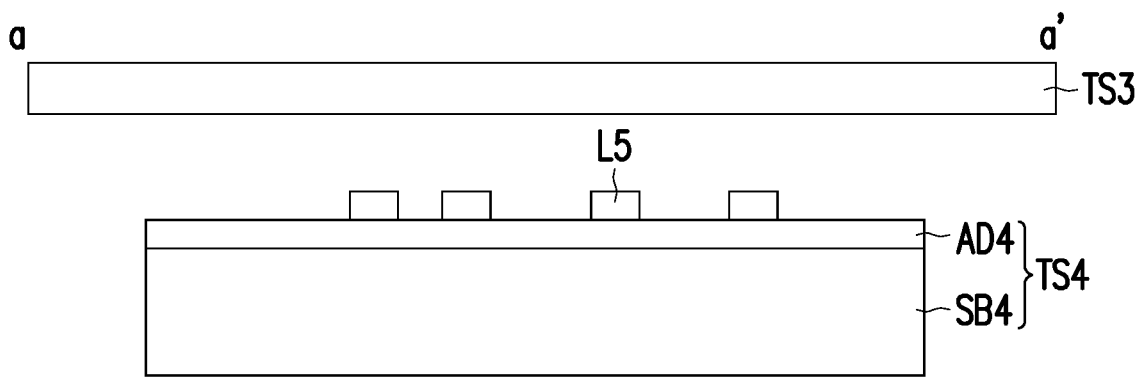

In some embodiments, the support structure SP is directly removed without additional overcoat PF. Referring to FIG. 10F and FIG. 11F, the LEDs L5 on the first transferring substrate TS3 are transferred to the second transferring substrate TS4. In this embodiment, the second transferring substrate TS4 includes a substrate SB4 and an adhesion layer AD4 on the substrate SB4. The stickiness of the adhesion layer AD2 is greater than the stickiness of the first transferring substrate TS3 (the stickiness of the first transferring substrate TS3 after being irradiated with ultraviolet light).

After transferring the LEDs L5 to the second transferring substrate TS4, the first transferring substrate TS3 is removed.

In some embodiments, the overcoat PF is not disposed on the first transferring substrate TS3, and before the support structure SP is removed, the second transferring substrate TS4 is attached to the first transferring substrate TS3 to fix the LEDs L5 on the first transferring substrate TS3, then the support structure SP is removed.

In summary, in the process of repairing the LED display device, the LEDs are placed on the circuit substrate by the transferring substrate, thereby saving the time and cost required for repairing the LED display device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A fabrication method of a display device, comprising:
   providing a light emitting diode (LED) display device, wherein the LED display device comprising:
     a circuit substrate; and
     a plurality of first LEDs, respectively disposed corresponding to a plurality of first placement regions of the circuit substrate, and the plurality of first LEDs are electrically connected to the circuit substrate;
     a plurality of second LEDs respectively disposed corresponding to a plurality of second placement regions of the circuit substrate;
   detecting the LED display device, wherein the plurality of second LEDs are faulty;
   removing the plurality of second LEDs from the circuit substrate;
   providing a plurality of LED substrates, each of the plurality of LED substrates comprises at least one of third LEDs;
   providing a plurality of first transferring substrates, and providing a support structure for fixing one of the plurality of first transferring substrates;
   respectively transferring the at least one of third LEDs of each of the plurality of LED substrates to a corresponding one of the plurality of first transferring substrates based on positions of the plurality of second placement regions, wherein when transferring the at least one of third LEDs of one of the plurality of LED substrates to the one of the plurality of first transferring substrates, the support structure is laterally surrounding and separated from the one of the plurality of LED substrates, and wherein the support structure and the one of the plurality of LED substrates are located on a same side of the one of the plurality of first transferring substrates;
   transferring the at least one of third LEDs on each of the plurality of first transferring substrates to a same second transferring substrate;
   overlapping the second transferring substrate with the circuit substrate, wherein a plurality of third LEDs are located on a side of the second transferring substrate facing the circuit substrate, wherein positions of the plurality of third LEDs overlap the plurality of second placement regions; and
   electrically connecting the plurality of third LEDs on the second transferring substrate to the circuit substrate.

2. The fabrication method of the display device according to claim 1, wherein
   the plurality of first LEDs comprise a first red LED, a first green LED, and a first blue LED, and
   the plurality of first placement regions comprise a first red placement region, a first green placement region, and a first blue placement region, wherein the first red LED, the first green LED, and the first blue LED are respectively disposed corresponding to the first red placement region, the first green placement region and the first blue placement region.

3. The fabrication method of the display device according to claim 2, wherein:
   the plurality of second LEDs comprise a second red LED, a second green LED, and a second blue LED, and
   the plurality of second placement regions comprise a second red placement region, a second green placement region, and a second blue placement region, wherein the second red LED, the second green LED, and the second blue LED are respectively disposed corresponding to the second red placement region, the second green placement region, and the second blue placement region;
   the plurality of LED substrates comprise a red LED substrate, a green LED substrate, and a blue LED substrate, wherein the at least one of third LEDs of the red LED substrate comprises a third red LED, the at least one of third LEDs of the green LED substrate comprises a third green LED, and the at least one of third LEDs of the blue LED substrate comprises a third blue LED;
   the plurality of first transferring substrates comprise a red transferring substrate, a green transferring substrate, and a blue transferring substrate; and
   transferring the third red LED of the red LED substrate to the red transferring substrate based on a position of the second red placement region;
   transferring the third red LED on the red transferring substrate to the second transferring substrate;
   transferring the third green LED of the green LED substrate to the green transferring substrate based on a position of the second green placement region;
   transferring the third green LED on the green transferring substrate to the second transferring substrate;
   transferring the third blue LED of the blue LED substrate to the blue transferring substrate based on a position of the second blue placement region;
   transferring the third blue LED on the blue transferring substrate to the second transferring substrate; and
   overlapping the second transferring substrate with the circuit substrate, wherein positions of the third red LED, the third green LED and the third blue LED overlap the second red placement region, the second green placement region and the second blue placement region respectively; and
   electrically connecting the third red LED, the third green LED, and the third blue LED on the second transferring substrate to the circuit substrate.

4. The fabrication method of the display device according to claim 1, wherein each of the plurality of first transferring substrates comprises a substrate and an adhesion layer located on the substrate, wherein a material of the substrate comprises glass or sapphire.

5. The fabrication method of the display device according to claim 1, wherein each of the plurality of first transferring substrates comprises an adhesive tape.

6. The fabrication method of the display device according to claim 5, wherein the second transferring substrate comprises a substrate and an adhesion layer located on the substrate, wherein when transferring the at least one of third LEDs on the one of the plurality of first transferring substrates to the second transferring substrate, a stickiness of the adhesion layer of the second transferring substrate is greater than a stickiness of the adhesive tape of the one of the plurality of first transferring substrates.

7. The fabrication method of the display device according to claim 1, wherein after transferring the at least one of third LEDs of the one of the plurality of LED substrates to the one of the plurality of first transferring substrates, further comprises:
   irradiating the one of the plurality of first transferring substrates with ultraviolet light to reduce a stickiness of the one of the plurality of first transferring substrates;
   attaching the second transferring substrate to the one of the plurality of first transferring substrates;
   removing the support structure from the one of the plurality of first transferring substrates; and
   removing the one of the plurality of first transferring substrates.

8. The fabrication method of the display device according to claim 7, further comprises:
   covering a top surface and a side surface of the at least one of third LEDs on the one of the plurality of first transferring substrates with an overcoat, and then removing the support structure from the one of the plurality of first transferring substrates; and
   before attaching the second transferring substrate to the one of the plurality of first transferring substrates, removing the overcoat from the at least one of third LEDs on the one of the plurality of first transferring substrates.

9. The fabrication method of the display device according to claim 1, wherein a method of transferring the at least one of third LEDs on each of the plurality of first transferring substrates to the same second transferring substrate comprises laser lift off.

10. The fabrication method of the display device according to claim 1, wherein the method of respectively transferring the at least one of third LEDs of each of the plurality of LED substrates to the corresponding one of the plurality of first transferring substrate comprises laser lift off.

11. The fabrication method of the display device according to claim 1, wherein each of the plurality of LED substrates comprises a growth substrate and the at least one of third LEDs and a plurality of fourth LEDs on the growth substrate, wherein after respectively transferring the at least one of third LEDs of each of the plurality of LED substrates to the corresponding one of the plurality of first transferring substrate, the plurality of fourth LEDs remain on the growth substrate.

12. The fabrication method of the display device according to claim 1, further comprises:
   forming a solder or a conductive glue on the circuit substrate.

13. The fabrication method of the display device according to claim 1, wherein each of the at least one of third LEDs comprises a semiconductor stacked layer and two electrodes electrically connected to the semiconductor stacked layer, and each of the two electrodes comprises a conductive layer and a metal layer formed on the conductive layer, wherein the melting point of the metal layer is lower than 260 degrees Celsius.

14. The fabrication method of the display device according to claim 13, wherein a method of electrically connecting the plurality of third LEDs on the second transferring substrate to the circuit substrate comprises:
   heating the plurality of third LEDs to eutectic bond the metal layers of the plurality of third LEDs with a plurality of pads of the circuit substrate.

15. The fabrication method of the display device according to claim 1, wherein when overlapping the second transferring substrate with the circuit substrate, the plurality of third LEDs contact a plurality of pads of the circuit substrate, and the plurality of first LEDs contact the second transferring substrate.

16. The fabrication method of the display device according to claim 1, wherein when overlapping the second transferring substrate with the circuit substrate, the plurality of third LEDs do not overlap the plurality of first LEDs in a direction perpendicular to the second transferring substrate.

* * * * *